(12) United States Patent
Okada et al.

(10) Patent No.: US 6,725,532 B1
(45) Date of Patent: Apr. 27, 2004

(54) METHOD AND APPARATUS FOR MOUNTING COMPONENT

(75) Inventors: Takeshi Okada, Tokyo (JP); Seiichi Mogi, Utsunomiya (JP); Hiroshi Ota, Kadoma (JP); Hirokazu Honkawa, Takatsuki (JP); Makito Seno, Hirakata (JP); Kunio Sakurai, Toyonaka (JP); Ken Takano, Takaishi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/787,884
(22) PCT Filed: Sep. 21, 1999
(86) PCT No.: PCT/JP99/05121
§ 371 (c)(1),
(2), (4) Date: Mar. 23, 2001
(87) PCT Pub. No.: WO00/19799
PCT Pub. Date: Apr. 6, 2000

(30) Foreign Application Priority Data

Sep. 25, 1998 (JP) ............................................. 10-271916

(51) Int. Cl.⁷ ................................................ B23P 19/00
(52) U.S. Cl. ............................ 29/742; 29/740; 29/741; 29/832; 29/833; 29/834; 29/836; 414/222.01; 414/744.4; 414/749.01; 414/752.01
(58) Field of Search .......................... 29/740, 741, 742, 29/759, 831, 832, 836; 414/222.01, 749.01, 752.01, 744.4; 901/1

(56) References Cited

U.S. PATENT DOCUMENTS

| 4,294,057 A | * 10/1981 | Winiasz et al. ............... 53/244 |
| 5,060,366 A | * 10/1991 | Asai et al. ..................... 29/739 |
| 5,235,739 A | 8/1993 | Pedall .......................... 29/740 |
| 5,495,661 A | 3/1996 | Gromer et al. ............... 29/740 |
| 5,588,195 A | * 12/1996 | Asai et al. .................. 29/33 M |

FOREIGN PATENT DOCUMENTS

| JP | 60-28298 | 2/1985 | |
| JP | 03135100 A | * 6/1991 | .......... H05K/13/04 |
| WO | 98/15163 | 4/1998 | |

OTHER PUBLICATIONS

"Visualization of forced air flows over a populated printed circuit board and their impact on convective heat transfer"; Lohan J; Eveloy, V.; Rodgers, P.; The Eighth Intersociety Conference on, May 30–Jun. 1, 2002; pp. 501–511.*

* cited by examiner

Primary Examiner—A. Dexter Tugbang
Assistant Examiner—Paul D Kim
(74) Attorney, Agent, or Firm—Wenderoth, Lind & Ponack, L.L.P.

(57) ABSTRACT

A plurality of self-propelled system heads (5) are made to independently travel along a closed-loop travel track (6) in a manner that the heads do not interfere with each other by controlling respective drive devices (4). Components (2) from a component supply device (8) are held by component holding members (3) of the heads, and thereafter, the components held by the component holding members are mounted on boards (1) positioned by board positioning devices (7).

27 Claims, 55 Drawing Sheets

METHOD AND APPARATUS FOR MOUNTING COMPONENT

TECHNICAL FIELD

The present invention relates to a component mounting apparatus and method for holding a plurality of components of a component supply device by means of a plurality of component holding members and thereafter mounting the components on a body to be mounted of, for example, a board or a component.

BACKGROUND ART

Conventionally, there has been known a variety of structures as an apparatus for mounting components on a board. For example, as shown in FIG. 61, there is known a rotary type high-speed mounting apparatus in which a plurality of suction nozzles 501 are supported on a rotary head 500, the suction nozzles 501 hold by suction components one by one from component supply cassettes 502 when each suction nozzle 501 is placed in a component suction position by the high-speed rotation of the rotary head 500, and the components held by suction by the suction nozzles 501 are mounted on a board 503 when each suction nozzle 501 is positioned in a component mounting position by the rotation of the rotary head 500.

However, according to the above-mentioned high-speed mounting apparatus, if the rotating speed of the rotary head 500 is increased, then rotary movements for component posture control around the nozzle axis of the suction nozzles 501 and positioning movements in the XY-directions, or the two directions that are orthogonal to each other for the positioning of the board 503 come to be unable to follow the high rotating speed. Even if the rotating speed is further increased, then a time during which the rotation is stopped for the rotating operation around the axis of rotation of the suction nozzles 501 and the board positioning operation is prolonged, consequently failing in reducing the time of mounting work. In addition, by increasing the rotating speed of the rotary head 500, noises and vibrations are increased, and the issues of a reduction in reliability of the whole equipment, an increase in running cost, and so on are becoming obvious. Furthermore, the component supply cassette 502, which has a weight ranging from 100 kg to more than 200 kg provided with a plurality of component supply cassettes 502, moves forward and backward at high speed in the direction of one axis to the component suction position of the suction nozzles 501. This causes another issue that noises and vibrations are further increased and a design required to take safety into full consideration must be performed. Furthermore, if the component supply cassette 502 is divided into two parts, there is an issue that the occupation area of the equipment becomes large to reduce the productivity per equipment area.

Accordingly, the object of the present invention is to solve the aforementioned issues and provide a component mounting apparatus and method capable of compacting the whole equipment, reducing the noises and vibrations, and increasing the reliability of the equipment.

DISCLOSURE OF INVENTION

In order to achieve the aforementioned object, the present invention is constructed as follows.

According to a first aspect of the present invention, there is provided a component mounting apparatus comprising:

a plurality of self-propelled system heads each of which has a component holding member capable of holding a component to be mounted on an object to be mounted and has a self-propelling drive device;

a closed-loop travel track along which the self-propelled heads circulate independently of one another by driving the drive devices of the plurality of self-propelled system heads;

an object positioning device that is arranged in an object positioning section of the travel track and positions the object; and a component supply device that is arranged in a component supply section of the travel track and contains therein the components, whereby the plurality of self-propelled system heads are made to independently travel by controlling each of the drive devices in a manner that the self-propelled system heads do not interfere with one another on the travel track, the component holding members of the self-propelled system heads independently hold the components from the component supply device, the self-propelled system heads having the component holding members holding the components subsequently independently travel along the travel track, and the components held by the component holding members of the self-propelled system heads are independently mounted on the object positioned by the object positioning device of the object positioning section on the travel track.

According to a second aspect of the present invention, there is provided a component mounting apparatus as mentioned in the first aspect, wherein the travel track has at least one straight portion in the closed-loop along which the plurality of self-propelled system heads travel, the object positioning device is arranged in the straight portion of the travel track, the object is positioned by the object positioning device of the object positioning section, and the components are independently mounted on the positioned object by the component holding members of each of the self-propelled system heads.

According to a third aspect of the present invention, there is provided a component mounting apparatus as mentioned in the first aspect, wherein the travel track has at least one straight portion in the closed-loop along which the plurality of self-propelled system heads travel, the component supply section is arranged in the straight portion of the travel track, and the components supplied from the component supply device of the component supply section are independently held by the component holding members of each of the self-propelled system heads.

According to a fourth aspect of the present invention, there is provided a component mounting apparatus as mentioned in the first or second aspect, wherein the travel track has another second straight portion, the component supply section is arranged in the second straight portion, and the components supplied from the component supply device of the component supply section are independently held by the component holding members of each of the self-propelled system heads.

According to the fifth aspect of the present invention, there is provided a component mounting apparatus as mentioned in any one of the first through fourth aspects, wherein a first head of the plurality of self-propelled system heads is positioned in the component supply section of the travel track, and a second head of the plurality of self-propelled system heads is positioned in the object positioning section of the travel track concurrently with the holding of the component to be mounted on the object from the component supply device by the component holding member of the first head and mounts a component that has been received from the component supply device and held by the component holding member of the second head on the object positioned by the object positioning device.

According to a sixth aspect of the present invention, there is provided a component mounting apparatus as mentioned in any one of the first through fifth aspects, further comprising: a component recognizing device that is arranged between the component supply section and the object positioning section of the travel track and recognizes a posture of the component that has been received from the component supply device and held by the component holding member of each head, whereby each head holds the component that is received from the component supply device and is to be mounted on the object by the component holding member of the head and subsequently travels along the travel track toward the object positioning device, the component recognizing device recognizes the posture of the component that has been received from the component supply device and held by the component holding member of each head in a position in which the component recognizing device is arranged along the travel track during the travel, the component that has been received from the component supply device and held by the component holding member of each head is mounted on the object positioned by the object positioning device after completing recognition, and the posture of the component is controlled on the basis of a component recognition result obtained by the component recognizing device while the head is traveling toward the object positioning device after completing recognition or immediately before the mounting on the object.

According to a seventh aspect of the present invention, there is provided a component mounting apparatus as mentioned in any one of the first through sixth aspects, wherein the travel track is constructed of a rail that has both side surfaces protruding roughly in a triangular shape, and each head traveling along the travel track has wheels having curved convex surfaces capable of sliding in point contact with approximately triangular protrusions located on both sides of the rail.

According to an eighth aspect of the present invention, there is provided a component mounting method comprising: independently circulating a plurality of self-propelled system heads each of which has a component holding member capable of holding a component to be mounted on an object to be mounted and has a self-propelling drive device on a closed-loop travel track by controlling each of the drive devices so that the self-propelled system heads do not interfere with one another; independently receiving the components from a component supply device arranged in a component supply section of the travel track and holding the components by the component holding members of the self-propelled system heads; subsequently making the self-propelled system heads that have the component holding members holding the components independently travel along the travel track; and independently mounting the components held by the component holding members of the self-propelled system heads on the object positioned by an object positioning device arranged in an object positioning section of the travel track.

According to a ninth aspect of the present invention, there is provided a component mounting method as mentioned in the eighth aspect, wherein the object is positioned by the object positioning device of the object positioning section arranged in at least one straight portion provided for the closed-loop of the travel track, and the components are independently mounted on the positioned object by the component holding members of the self-propelled system heads.

According to a tenth aspect of the present invention, there is provided a component mounting method as mentioned in the eighth aspect, wherein the component holding members of the self-propelled system heads independently hold the components supplied from the component supply device of the component supply section arranged in at least one straight portion provided for the closed-loop of the travel track.

According to an eleventh aspect of the present invention, there is provided a component mounting method as mentioned in the eighth or ninth aspect, wherein the component holding members of the self-propelled system heads independently hold the components supplied from the component supply device of the component supply section arranged in another second straight portion provided for the closed-loop of the travel track.

According to a twelfth aspect of the present invention, there is provided a component mounting method as mentioned in any one of the eighth through eleventh aspects, wherein a first head of the plurality of self-propelled system heads is positioned in the component supply section of the travel track, and a second head of the plurality of self-propelled system heads is positioned in the object positioning section of the travel track concurrently with the holding of the component to be mounted on the object from the component supply device by the component holding member of the first head and mounts a component that has been received from the component supply device and held by the component holding member of the second head on the object positioned by the object positioning device.

According to a thirteenth aspect of the present invention, there is provided a component mounting method as mentioned in any one of the eighth through twelfth aspects, wherein each head holds the component that is received from the component supply device and is to be mounted on the object by the component holding member of the head and subsequently travels along the travel track toward the object positioning device, the component recognizing device recognizes the posture of the component that has been received from the component supply device and held by the component holding member of each head in a position in which a component recognizing device is arranged between the component supply section and the object positioning section of the travel track during the travel, the head travels along the travel track toward the object positioning device after completing recognition to mount the component that has been received from the component supply device and held by the component holding member of each head on the object positioned by the object positioning device, and the posture of the component is controlled on the basis of a component recognition result obtained by the component recognizing device while the head is traveling toward the object positioning device after completing recognition or immediately before the mounting on the object.

According to a fourteenth aspect of the present invention, there is provided a component mounting apparatus as mentioned in the sixth aspect, wherein each of the heads is switched over from high-speed travel to low-speed travel before a position in which the component recognizing device of the travel track is arranged, and the component recognizing device recognizes the posture of the component that has been received from the component supply device and held by the component holding member of each head while each head is traveling at low speed.

According to a fifteenth aspect of the present invention, there is provided a component mounting apparatus as mentioned in the sixth aspect, wherein the component recognizing device recognizes the posture of the component that has been received from the component supply device and held by the component holding member of each head without speed change within an interval between a point located before a position in which the component recognizing device of the travel track is arranged and a point beyond the position in which the component recognizing device is arranged.

According to a sixteenth aspect of the present invention, there is provided a component mounting apparatus as mentioned in the sixth aspect, wherein each of the heads temporarily stops in a position in which the component recognizing device of the travel track is arranged, and the component recognizing device recognizes the posture of the component that has been received from the component supply device and held by the component holding member of each head.

According to a seventeenth aspect of the present invention, there is provided a component mounting apparatus as mentioned in the first aspect, wherein the travel track has an arbitrary closed-loop shape, and the component supply section and the object positioning section are arranged in arbitrary positions of the travel track.

According to an eighteenth aspect of the present invention, there is provided a component mounting method as mentioned in the thirteenth aspect, wherein each of the heads is switched over from high-speed travel to low-speed travel before a position in which the component recognizing device of the travel track is arranged, and the component recognizing device recognizes the posture of the component that has been received from the component supply device and held by each component holding member of each head while each head is traveling at low speed.

According to a nineteenth aspect of the present invention, there is provided a component mounting method as mentioned in the thirteenth aspect, wherein the component recognizing device recognizes the posture of the component that has been received from the component supply device and held by the component holding member of each head without speed change within an interval between a point located before a position in which the component recognizing device of the travel track is arranged and a point beyond the position in which the component recognizing device is arranged.

According to a twentieth aspect of the present invention, there is provided a component mounting method as mentioned in the thirteenth aspect, wherein each of the heads temporarily stops in a position in which the component recognizing device of the travel track is arranged, and the component recognizing device recognizes the posture of the component that has been received from the component supply device and held by each component holding member of each head.

According to a twenty-first aspect of the present invention, there is provided a component mounting apparatus as mentioned in any one of the first through seventh aspects and fourteenth through seventeenth aspects, wherein a plurality of object positioning devices are arranged along the travel track, the plurality of heads are provided with a plurality of component holding members, components received from the component supply device are held by a first component holding member and a second component holding member out of the plurality of component holding members, the component held by the first component holding member is mounted on a board positioned by a first object positioning device out of the plurality of object positioning devices, and the component held by the second component holding member is mounted on a board positioned by a second object positioning device out of the plurality of object positioning devices.

According to a twenty-second aspect of the present invention, there is provided a component mounting method as mentioned in any one of the eighth through thirteenth aspects, eighteenth aspect and nineteenth aspect, wherein the components received from the component supply device are held by a first component holding member and a second component holding member out of the plurality of component holding members provided for the plurality of heads, the component held by the first component holding member is mounted on a board positioned by a first object positioning device out of the plurality of object positioning devices provided along the travel track, and the component held by the second component holding member is mounted on a board positioned by a second object positioning device out of the plurality of object positioning devices.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
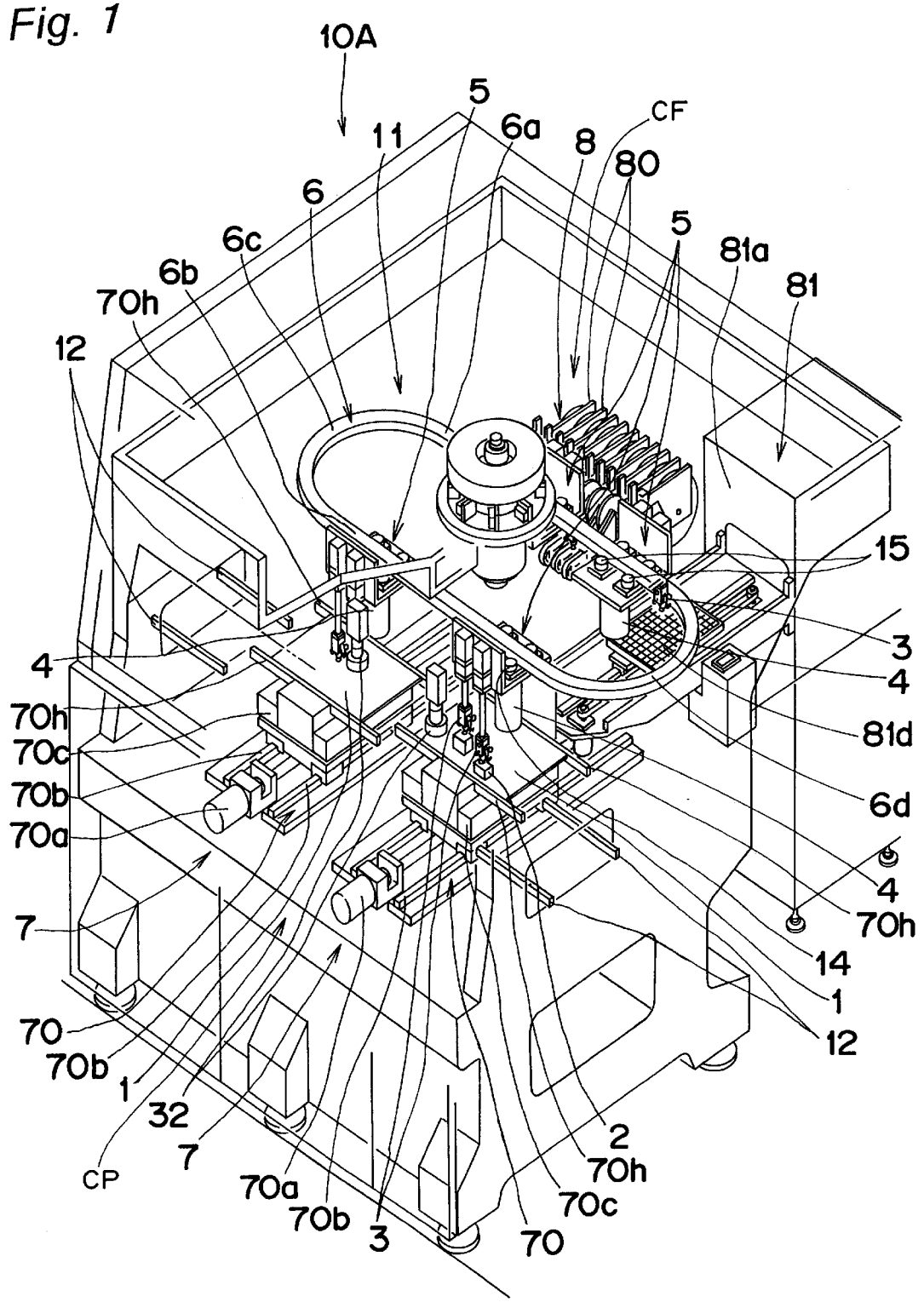
FIG. 1 is a see-through perspective view of a more concrete component mounting apparatus according to the component mounting apparatus of one embodiment of the present invention.

It is to be noted that same components are denoted by same reference numerals in the accompanying drawings before continuing the description of the present invention.

The first embodiment of the present invention will be described in detail below with reference to the drawings.

The embodiment of the present invention will be described in detail below with reference to the drawings.

Figure 2:
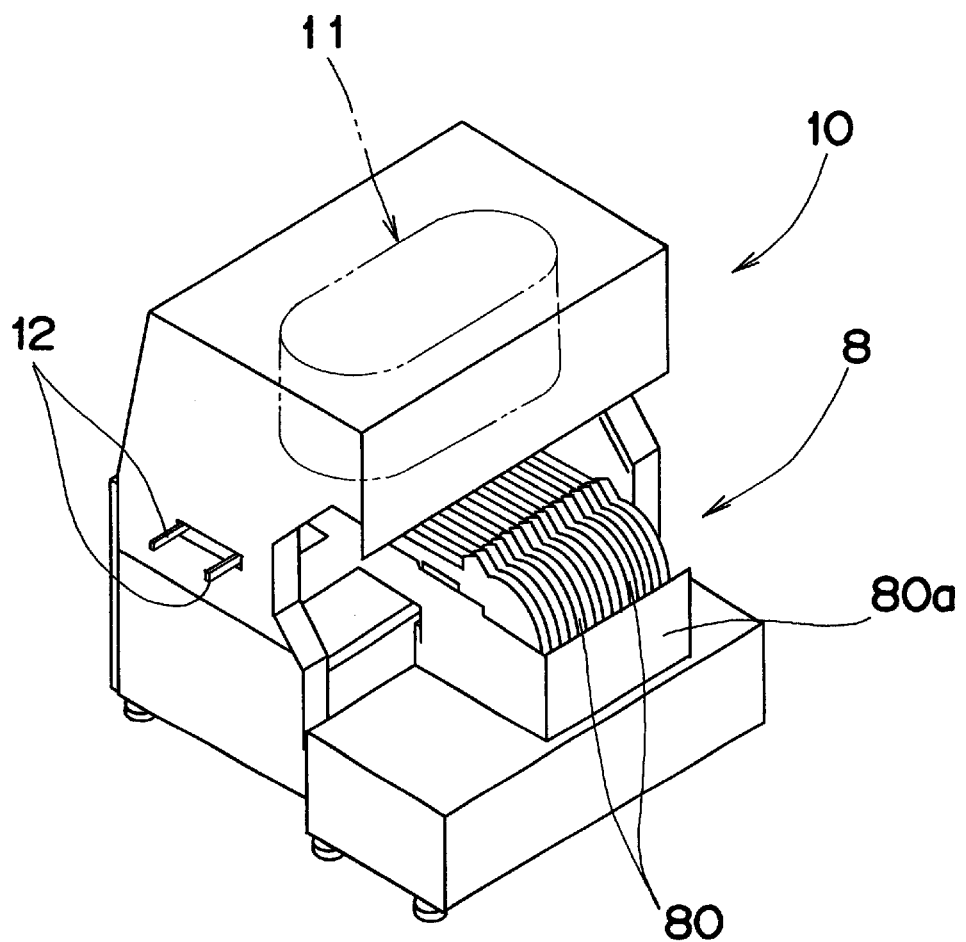
FIG. 2 is a schematic perspective view of the overall external appearance of the above component mounting apparatus.

As shown in FIG. 1 and FIG. 2, a component mounting apparatus for effecting a component mounting method according to one embodiment of the present invention includes: a plurality of self-propelled system heads 5 each of which has component suction nozzles 3 each that serve as an example of a component holding member for holding a component 2 to be mounted on a board 1 that serves as an example of an object to be mounted and a self-propelling motor 4 that serves as an example of a self-propelling drive device; a travel track 6 which has a closed-loop shape and along which the self-propelled system heads 5 are made to circularly travel by the driving of the self-propelling motors 4; a board positioning device 7 for positioning the board 1 in a board positioning section CP of the travel track 6; a component supply device 8 that is arranged in a component supply section CF of the travel track 6 and contains the components 2; and a control unit 9 that makes the plurality of self-propelled system heads 5 independently travel while controlling the self-propelling motors 4 in a manner that the self-propelled system heads 5 do not interfere with each other on the travel track 6 and makes the self-propelled system heads 5 independently receive and hold the components 2 from the component supply device 8 in the component supply section CF by the component suction nozzles 3, subsequently independently travel along the travel track 6 and independently mount the components 2 held by the component suction nozzles 3 on the board 1 positioned by the board positioning device 7 in the board positioning section CP of the travel track 6.

The travel track 6 is constructed of two straight portions 6a and 6b and two curved portions 6c and 6d. The first straight portions 6a on one side is made to serve as the component supply section CF where the component supply device 8 is arranged, and the second straight portion 6b on the other side is made to serve as the board positioning section CP where the board 1 is arranged via the board positioning device 7.

FIG. 1 is a schematic perspective view of the overall external appearance of the aforementioned component mounting apparatus 10, showing an example of the component supply device 8 in a state in which a number of component supply cassettes 80 each containing therein a number of components 2 are arranged parallel to one another inside a component supply cassette container 80a having a box-like shape. Examples of the component supply cassettes 80 include a tape component use component supply cassette that contains a number of taped components and a bulk type component supply cassette that contains a number of components in a scattered state. The board 1 to be mounted with the components 2 is conveyed by a pair of known board carrying conveyers 12 and 12 so as to be loaded onto the board positioning device 7 located inside the component mounting apparatus 10 and positioned in a specified position. The reference numeral 11 denotes a head traveling region in which a number of heads 5 travel in a self-propelled manner along the travel track 6. FIG. 1 shows a Y-direction board positioning device 70 that serves as an example of the board positioning device 7 and is able to position the board 1 in a specified position supported on a board support table 70c by moving the board support table 70c along a pair of guides 70b by a motor 70a only in the direction perpendicular to the board carrying conveyers 12.

The component supply cassettes 80 include the type that automatically moves the components 2 toward the component outlet port and the type that is provided with a component supply lever 80h and is able to move the contained components 2 toward the component outlet port by pushing the lever 80*h*. One component pushing-up mechanism 84 (see FIG. 18 and FIG. 19) having a pushing-down member for pushing down this lever 80*h* is provided for a plurality of cassettes 80 and moves in a direction parallel to the axial direction of the first straight portions 6*a*, pushing down the lever 80*h* of the required cassette 80 by the pushing-down member.

FIG. 1 is a more detailed see-through perspective view of a component mounting apparatus 10 shown in FIG. 2. The component mounting apparatus 10A of FIG. 1 is provided with four self-propelled system heads 5 that travel along the travel track 6, and each self-propelled system head 5 is provided with two component suction nozzles 3 arranged parallel. The component suction nozzles 3 hold by suction the components 2 one by one from either one or both of a number of component supply cassettes 80 and a component supply tray device 81 arranged in the first straight portion 6*a* of the travel track 6 shown in FIG. 3 and thereafter travel in, for example, the clockwise direction along the travel track 6 to mount the components 2 held by suction on either one or both of two boards 1 arranged in the second straight portion 6*b* of the travel track 6. Each component supply cassette 80 is a well-known one, which contains, for example, components 2 of an identical type individually in a number of component containing recess portions of a component retaining tape, successively moves the component containing recess portions of the component retaining tape to a component outlet port automatically or by driving a tape feed mechanism and makes a nozzle body 130 (see FIG. 30) of each component suction nozzle 3 hold by suction the component 2 from each component containing recess portion. The component supply tray device 81 takes out a tray 81*b* one by one from a tray container 81*a*, moves the components 2 inside a number of partitioned component containing spaces inside the tray 81*b* to a component pickup position together with the tray 81*b*, and makes the nozzle body 130 of each component suction nozzle 3 hold by suction each component 2 in the component pickup position.

The Y-direction board positioning device 70 is an example of the board positioning device 7 and is able to move the board 1 only in the Y-direction perpendicular to the board carrying conveyers 12. Specifically, by rotating a threaded shaft extended in the Y-direction by the rotation of the motor 70*a* and reciprocating a board support table 70*c* engaged with the threaded shaft in the Y-direction along the pair of guides 70*b*, the board 1 supported on the board support table 70*c* can be positioned in a specified position along the guides. On the board support table 70*c*, board carrying conveyers 70*h* and 70*h* that receive the board 1 conveyed from the pair of board carrying conveyers 12 and 12 for board-loading-use and send the board 1 to the pair of board carrying conveyers 12 and 12 for board-unloading-use after completing the mounting are provided along the direction of conveyance of the board carrying conveyers 12 and 12 for board loading and unloading use. The board carrying conveyers 12 and 12 are known devices for conveying boards 1 one by one in the direction of conveyance by means of chains.

In FIG. 3 and FIG. 45 through FIG. 49, the reference numeral 30 denotes two nozzle body switchover devices arranged, for example, in the vicinity of the midpoint of one curved portion 6*c* of the travel track 6, and a plurality of nozzle bodies 130 described later are alternatively selected and then used at the lower end of each component suction nozzle 3. The head 5 provided with one or two component suction nozzles 3 having one or two nozzle bodies 130 that require the switchover between nozzle bodies among the heads 5 that pass through one curved portion 6*c* temporarily stops before the two nozzle body switchover devices 30 and 30 and is driven so that a switchover device drive lever 201 is lowered under the control of the control unit 9. Drive wheels 203 are rotated via drive rods 202 in the counterclockwise direction in FIG. 47, and a protrusion 204 of each drive wheel 203 is engaged with an engagement recess 205 of a casing 206 of each nozzle body switchover device 30. With this arrangement, a turning force of the drive wheels 203 is converted into a linear movement force in the rightward direction in FIG. 46 and FIG. 47, by which the whole body of the nozzle body switchover device 30 moves in the rightward direction in FIG. 46 and FIG. 47. As a result, an engagement release protrusion 207 located at the tip of the casing 206 comes in contact with an engagement lever 130*b* of the nozzle body 130 (see FIG. 24) of each nozzle 3 as described later, releasing the engagement of the engagement lever 130*b* with an engagement groove 130*c*. When the nozzle body switchover device 30 moves in the rightward direction, a rotary shaft 208 of a switchover drive motor 210 of the nozzle body switchover device 30 is engaged with a rotary shaft 130*g* of a disk 130*a*, allowing the disk 130*a* to be rotatively driven by the rotation of the rotary shaft 208 of the switchover drive motor 210.

Figure 24:
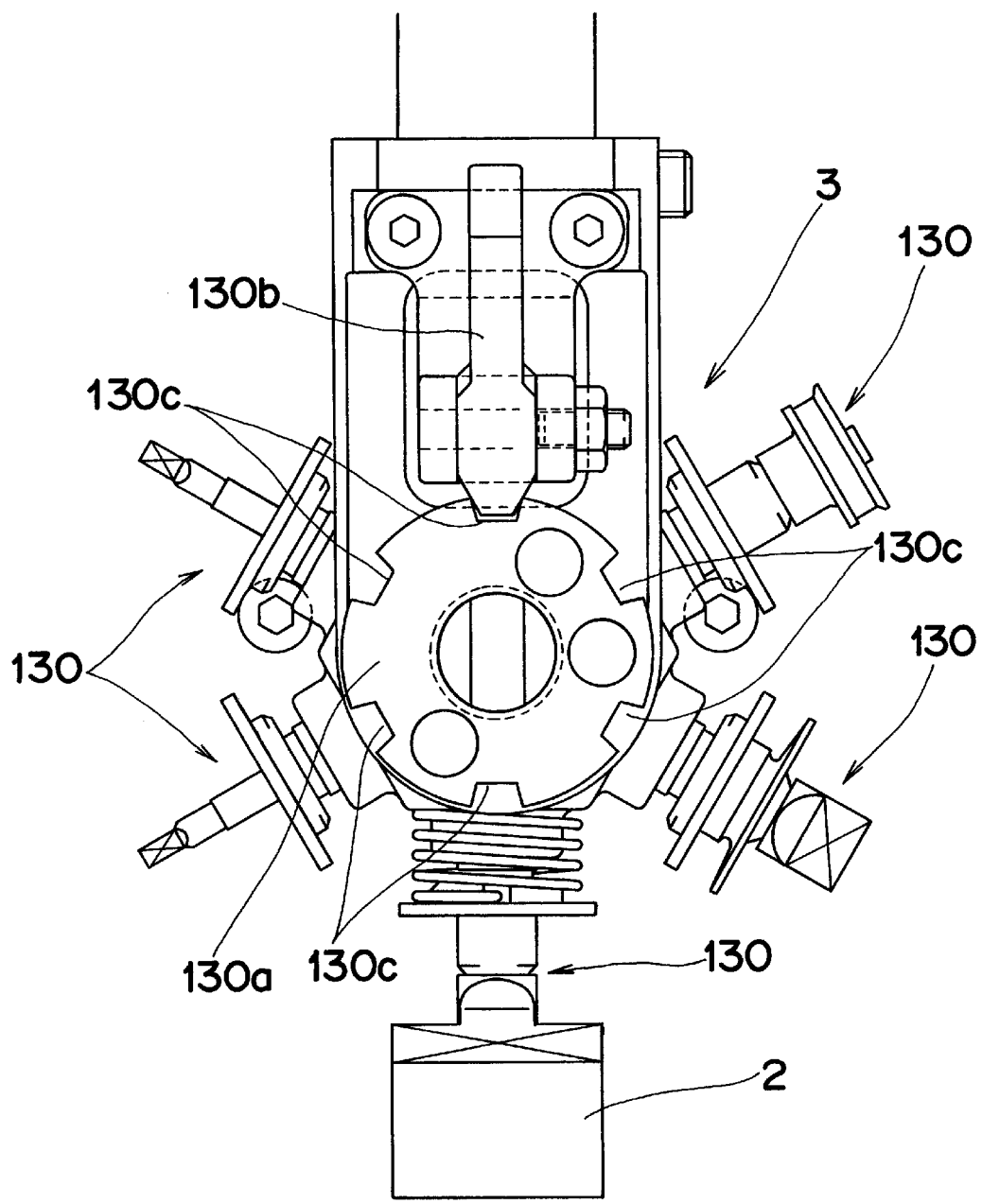
FIG. 24 is an enlarged view of a portion around the tip of one component suction nozzle of FIG. 20.

FIG. 24 shows an enlarged view of a portion in the vicinity of the tip of one component suction nozzle 3. In this embodiment, six types of nozzle bodies 130 are rotatably arranged at approximately regular intervals around the disk 130*a* at the tip of the nozzle so as to be able to hold by suction a variety of components 2, and the disk 130*a* is rotated so as to position the nozzle body 130 to be used in a nozzle lower end position in a state in which the engagement lever 130*b* engaged with the engagement groove 130*c* formed on the disk 130*a* in correspondence with each nozzle body 130 is released therefrom by the engagement release protrusion 207. The rotary shaft 208 of the switchover drive motor 210 of the nozzle body switchover device 30 is engaged with the disk 130*a*, and therefore, this disk 130*a* is rotated when the rotary shaft 208 of the switchover drive motor 210 is rotatively driven. The rotative driving of the disk 130*a* by the rotary shaft 208 of the switchover drive motor 210 is stopped when the desired nozzle body 130 is positioned at the nozzle lower end position under the control of the control unit 9, and thereafter, the switchover device drive lever 201 is driven to move up, rotating the drive wheel 203 in the clockwise direction in FIG. 47 via the drive rod 202. The protrusion 204 of the drive wheel 203 is engaged with the engagement recess 205 of the casing 206 of the nozzle body switchover device 30, and therefore, the turning force of the drive wheel 203 is converted into a linear movement force in the leftward direction in FIG. 46 and FIG. 47, moving the whole body of the nozzle body switchover device 30 in the leftward direction in FIG. 46 and FIG. 47. As a result, the engagement release protrusion 207 located at the tip of the casing 206 is released from the engagement lever 130*b* of the nozzle body 130 of each nozzle 3, enabling the positioning of the disk 130*a* by engaging the engagement lever 130*b* with the engagement groove 130*c* of the engagement lever 130*b*. As described above, both or the necessary one of the nozzle bodies 130 can be switched to another nozzle body 130 by two or one nozzle body switchover device(s) 30.

Figure 3:
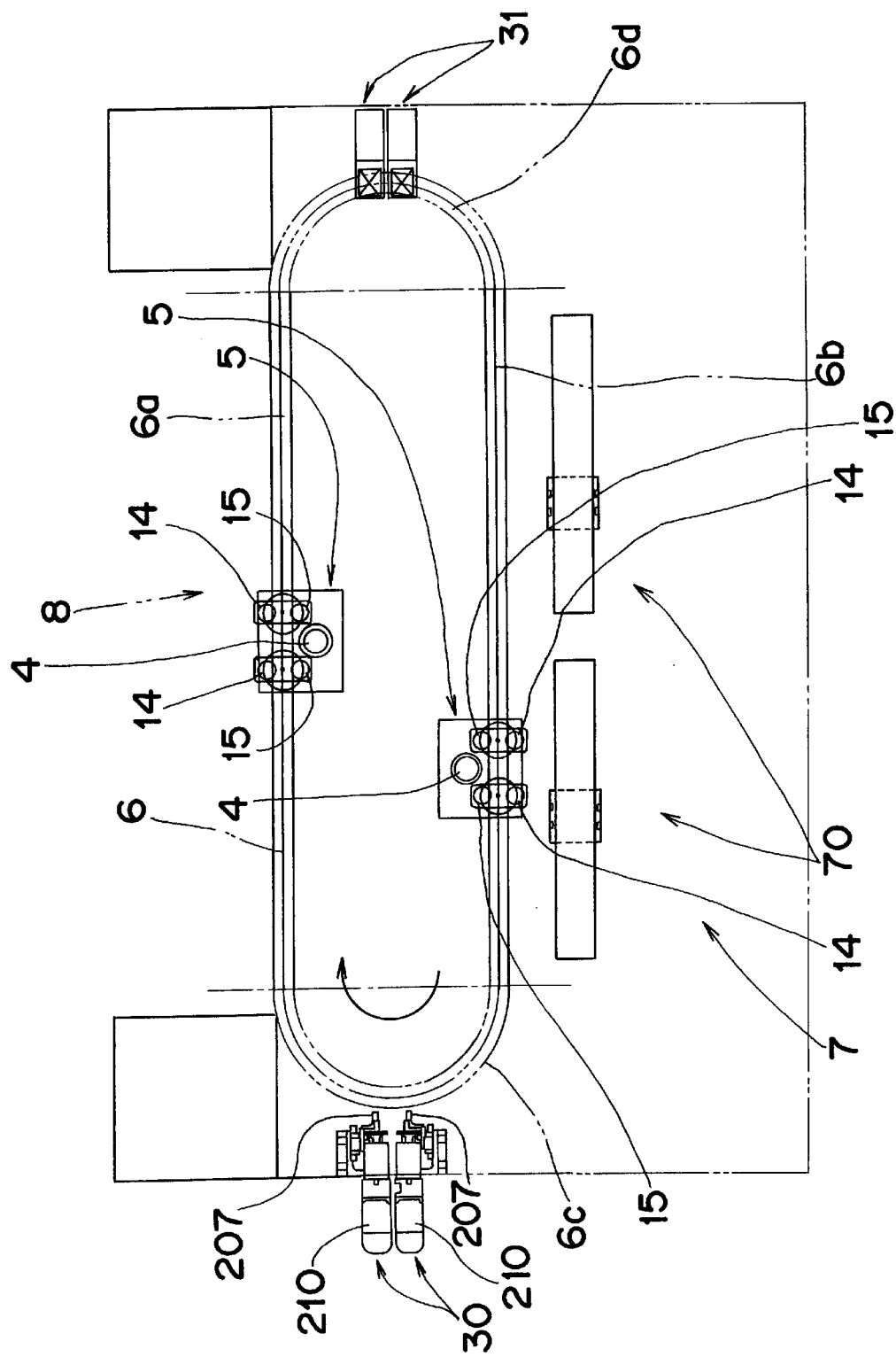
FIG. 3 is an schematic plan view of a travel track of heads each having two component suction nozzles in the component mounting apparatus of FIG. 1 in a state in which one head is placed on the component suction device side and one head is placed on the board positioning device side.

In FIG. 3, the reference numeral 31 denotes a component recognizing device of a CCD camera or the like that is arranged, for example, in the vicinity of the midpoint of the other curved portion 6*d* of the travel track 6 and used for recognizing the postures of the components 2 and 2 held by suction by the two component suction nozzles 3 of each head 5. On the basis of this recognition result, a turning angle around the nozzle axis is calculated by the control unit side with regard to each component suction nozzle 3 and the component suction nozzles 3 is turned around the nozzle axis thereof by the calculated turning angle by a θ-turn motor 33 described later under the control of the control unit 9 for the posture correction while moving from the component recognizing device 31 to the board 1 to be subjected to mounting. In this component recognizing device 31, if the component itself is determined to be defective or if the component suction posture is determined to be so defective that the posture cannot be corrected, then the defective component is discarded into a defective component discarding section arranged, for example, in a position just after the passage of the component suction nozzle 3 through the component recognizing device 31 or in a position before the nozzle body switchover device 30 in FIG. 3.

The reference numeral 32 in FIG. 1 denotes a board recognizing device of a CCD camera or the like that is mounted on the head 5 or arranged in a region outside the range of movement of each component suction nozzle 3 mounted on the head 5 above each Y-direction board positioning device 70 of the component mounting apparatus 10. The device recognizes a known reference mark of the board 1 placed on the board support table 70c of each Y-direction board positioning device 70, recognizes that the board 1 is positioned in the specified position and outputs a signal to the control unit 9.

Figure 4:
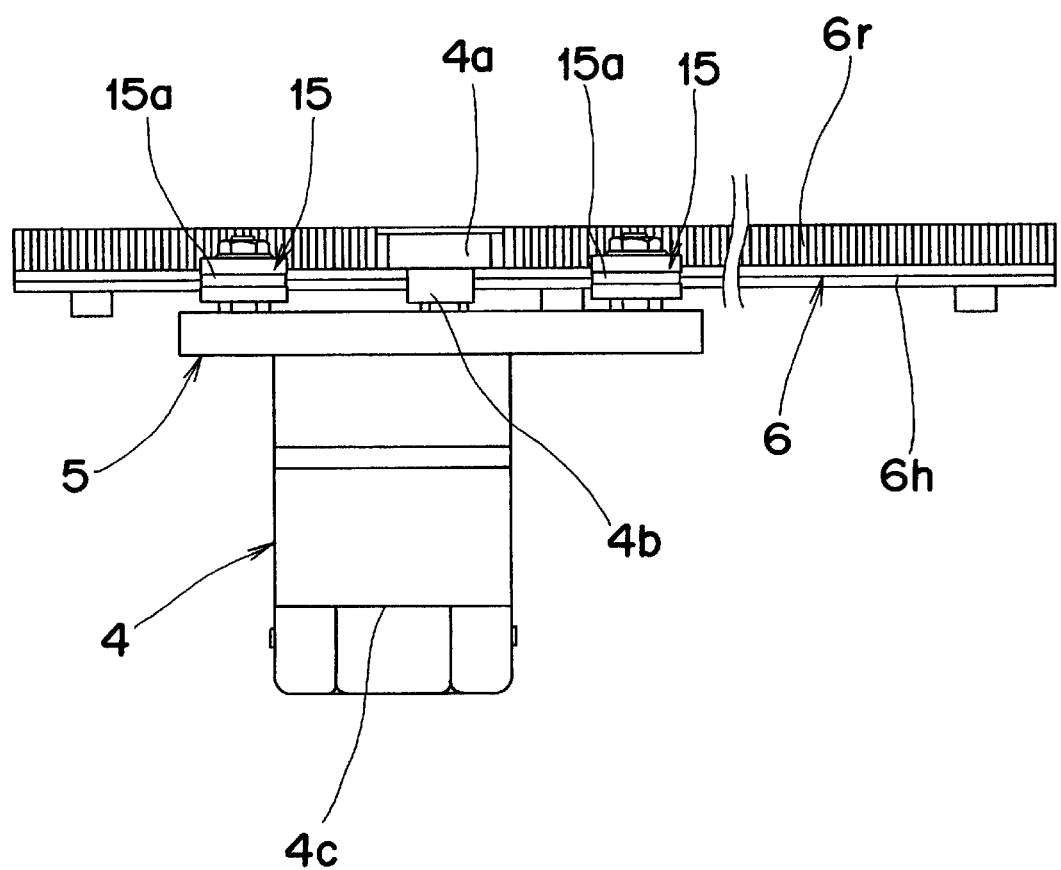
FIG. 4 is a side view of a head drive portion of the component mounting apparatus of FIG. 1.
Figure 5:
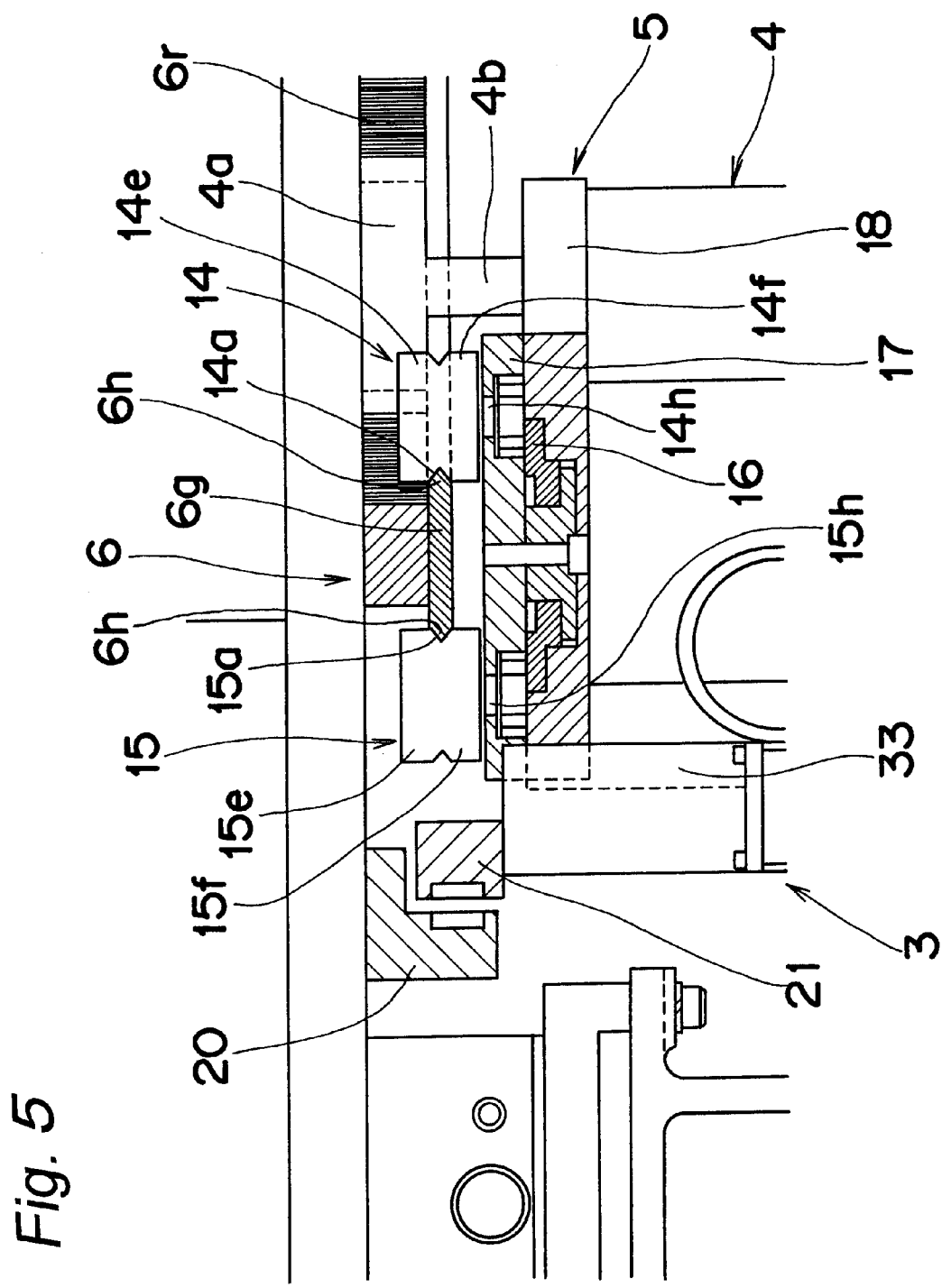
FIG. 5 is an enlarged sectional view of part of a drive portion of the head of the component mounting apparatus of FIG. 1.

Each head 5 can be self-propelled along the travel track 6 by means of the following mechanism. That is, as shown in FIG. 4 and FIG. 5, the position of each head 5 can be consistently perceived by the control unit 9 by calculating the turning angle of the motor 4 by means of the self-propelling motor 4, an encoder 4c connected to the motor 4, and so on. Each propelling motor 4 is constructed so that each pinion gear 4a fixed to each rotary shaft 4b of each motor 4 is meshed with a rack 6r arranged along the travel track 6 and each motor 4 is rotatively driven to rotate each pinion gear 4a meshed with the rack 6r. By this operation, each propelling motor 4, i.e., each head 5 is moved in one direction along the travel track 6, and the movement of the head 5 is stopped by the stop of rotation of each motor 4.

The travel track 6 is constructed roughly of two straight portions, i.e., the first straight portion 6a and the second straight portion 6b and two curved portions 6c and 6d, as described hereinabove. The component supply cassette 80 and the component supply tray device 81 serving as an example of the component supply device 8 are arranged in the first straight portion 6a on one hand, while the Y-direction board positioning device 70 serving as an example of the board positioning device 7 is arranged in the second straight portion 6b on the other hand.

Figure 6:
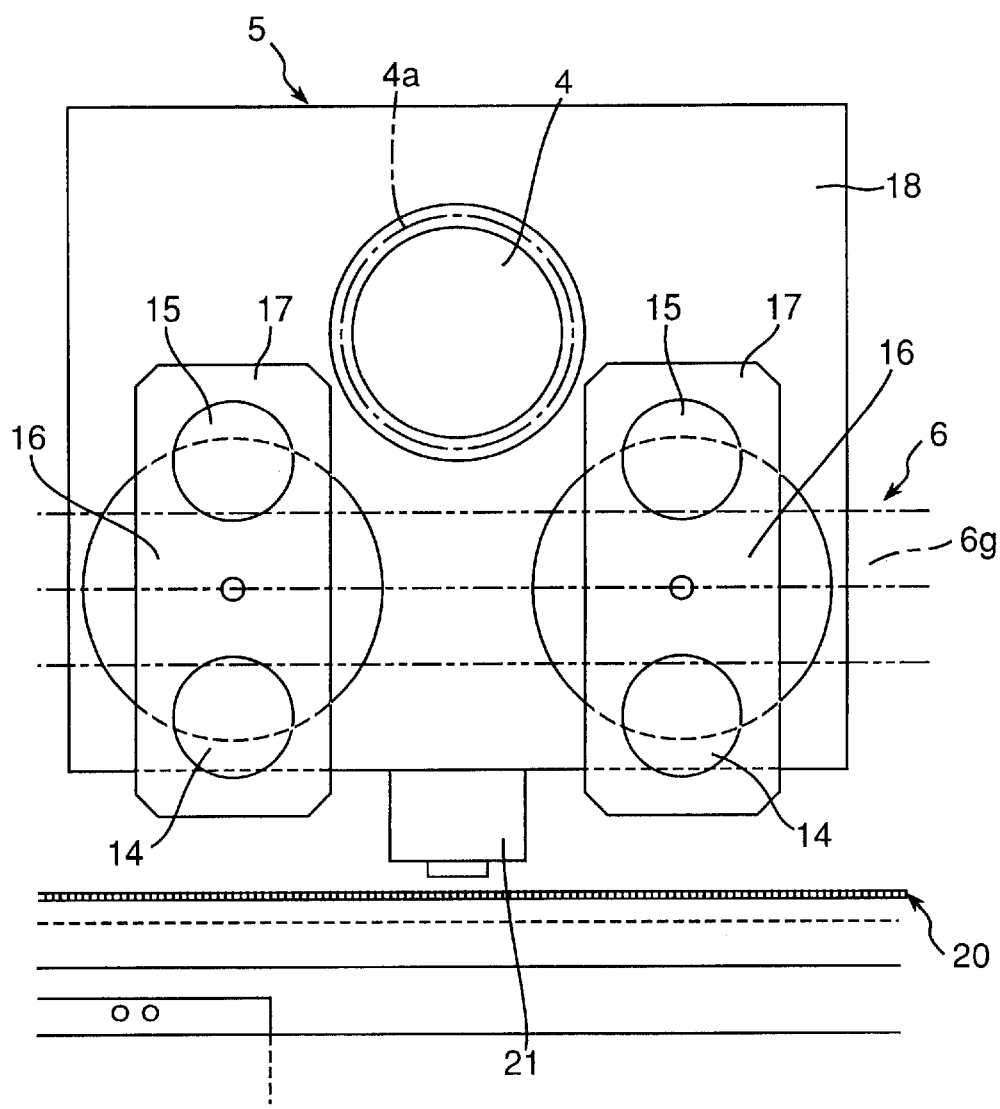
FIG. 6 is an enlarged plan view of the drive portion of the head of the component mounting apparatus of FIG. 1.
Figure 10:
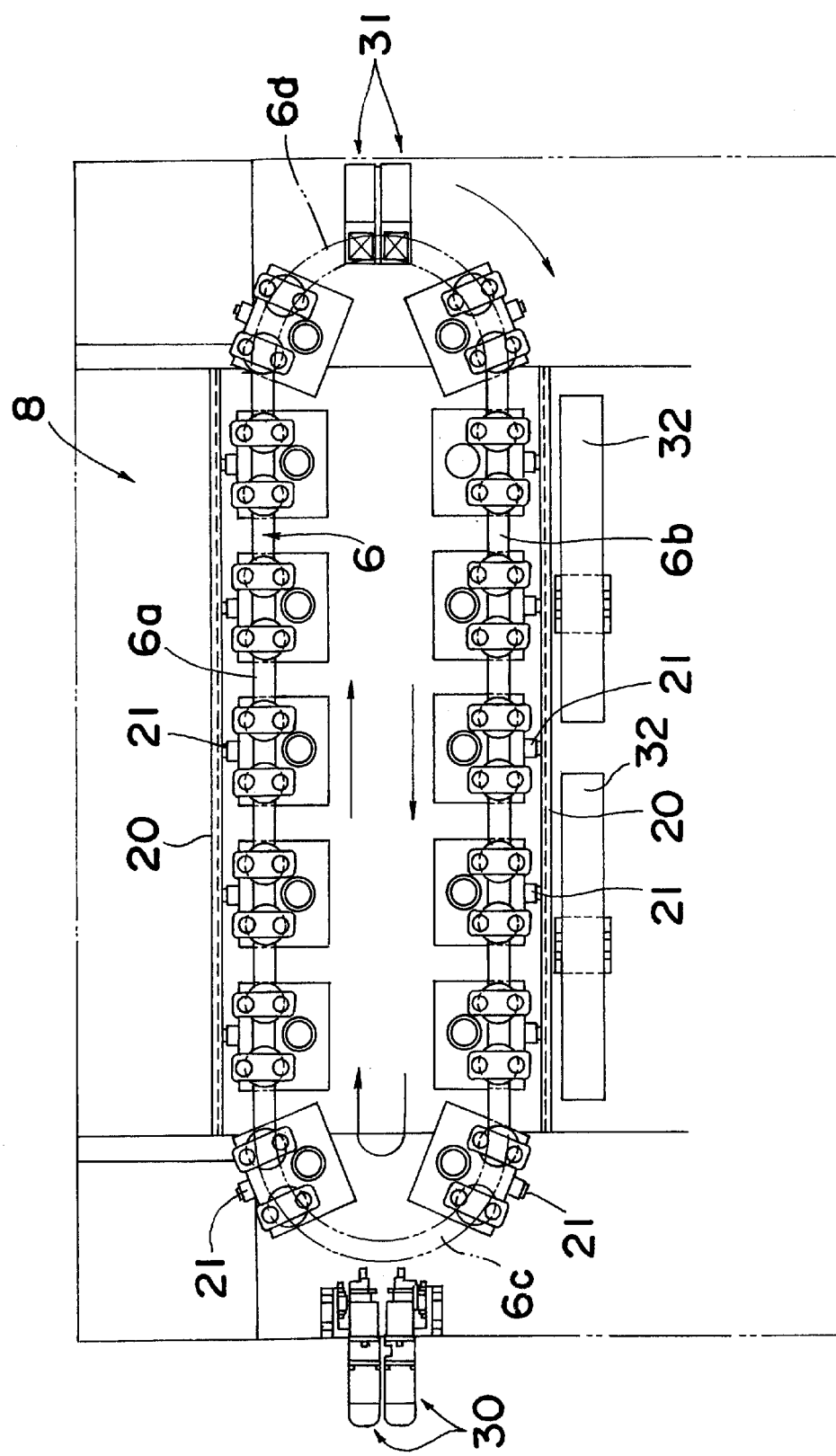
FIG. 10 is a schematic plan view for explaining a state in which a number of heads each being provided with two component suction nozzles travel along the travel track in the component mounting apparatus of FIG. 1.

As shown in FIG. 5, FIG. 6, and FIG. 10, a linear scale 20 is arranged only in each of the first straight portion 6a and the second straight portion 6b, and the positions of the heads 5 in the first straight portion 6a and the second straight portion 6b are accurately perceived by the linear scale sensor 21 provided for the heads 5 to accurately stop the heads in the desired positions, allowing the component suction or component mounting to be executed reliably and accurately.

With regard to the travel track 6, a rail body 6g for forming the travel track 6 has a hexagonal cross-section shape, and a total of four traveling wheels 14, 14, 15, and 15, two of which are located on one side and the removing ones are located on the other side, are brought in contact with the sectionally triangle-shaped portions 6h and 6h located on both sides of this rail body 6g having the hexagonal cross-section shape. The roughly triangle-shaped cross-section portions 6h and 6h located on both sides of the rail body 6g are engaged with grooves 14a and 15a formed along the circumference of center portions in the axial directions of the traveling wheels 14 and 15, by which the traveling wheels 14 and 15 can roll on the side portions of the rail body 6g while holding the rail body 6g between the inner and outer traveling wheels 15 and 14 on the leading side in the traveling direction and holding the rail body 6g between the inner and outer traveling wheels 15 and 14 on the trailing side in the traveling direction without causing any displacement in the vertical direction, enabling the prevention of the occurrence of vibrations. In detail, the traveling wheels 14 and 15 are constructed of a pair of bearings 14e, 14f, 15e, and 15f that are brought in contact with each other vertically interposing the triangular cross-section portions 6h between them, and the bearings normally rotate integrally.

Figure 50:
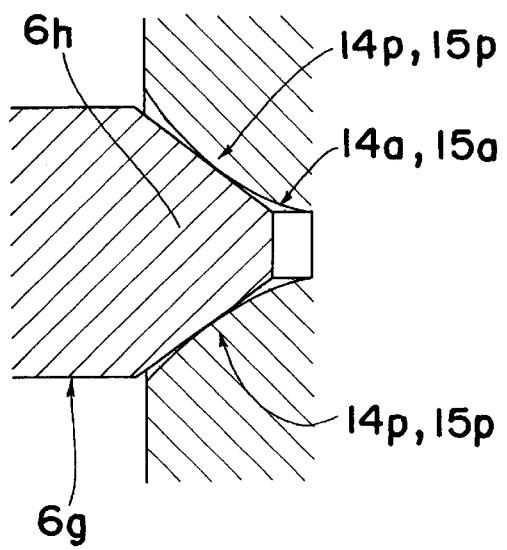
FIG. 50 is an enlarged partial sectional view showing a relation between a rail body and traveling wheels according to a modification example of the component mounting apparatus of FIG. 1.

If the grooves 14a and 15a are made to have a curved convex surface in the portions to be brought in contact with the triangular cross-section portions 6h as shown in FIG. 50, then the grooves 14a and 15a come in point contact with the triangular cross-section portions 6h at points 14p, 15p, allowing the traveling wheels 14 and 15 to more smoothly travel along the rail body 6g.

Figure 7A:
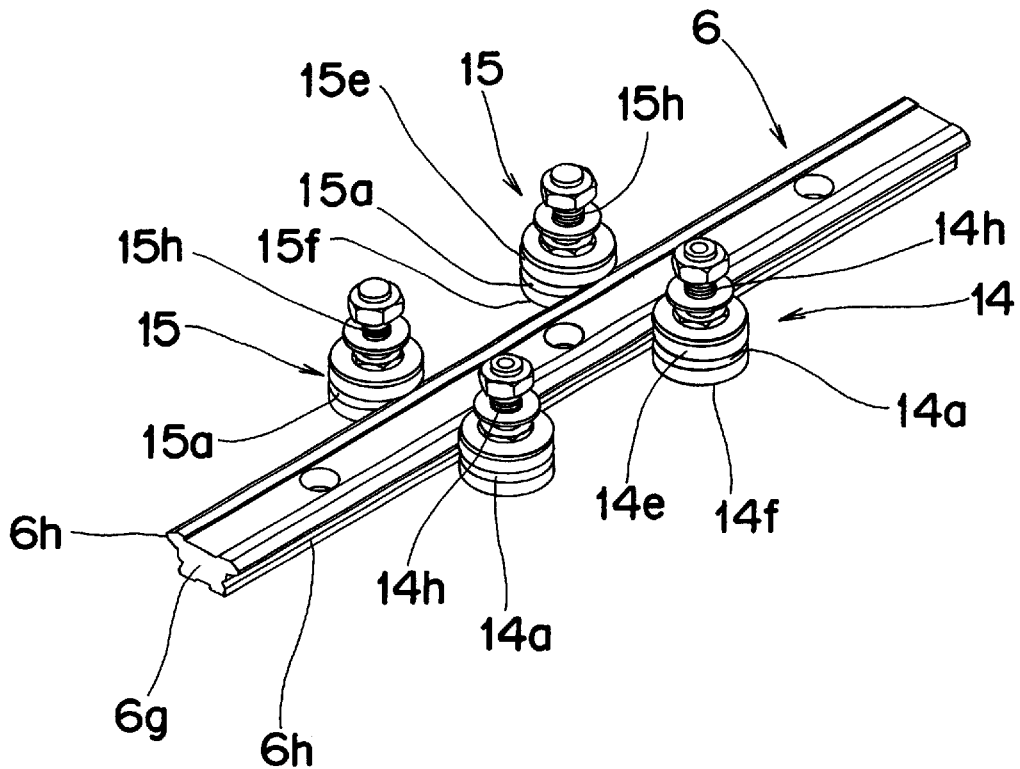
FIGS. 7A and 7B are an enlarged perspective view and an enlarged sectional front view, respectively, of the drive portion of the head of the component mounting apparatus of FIG. 1.
Figure 7B:
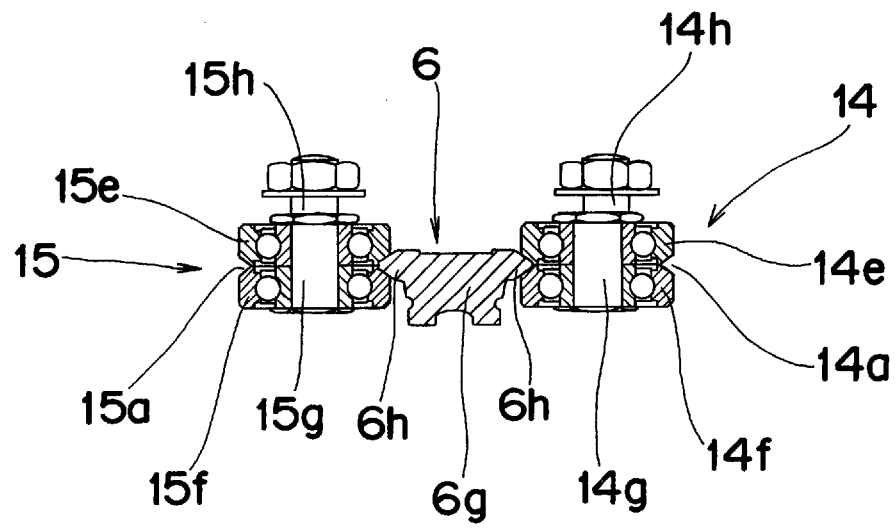
Figure 8:
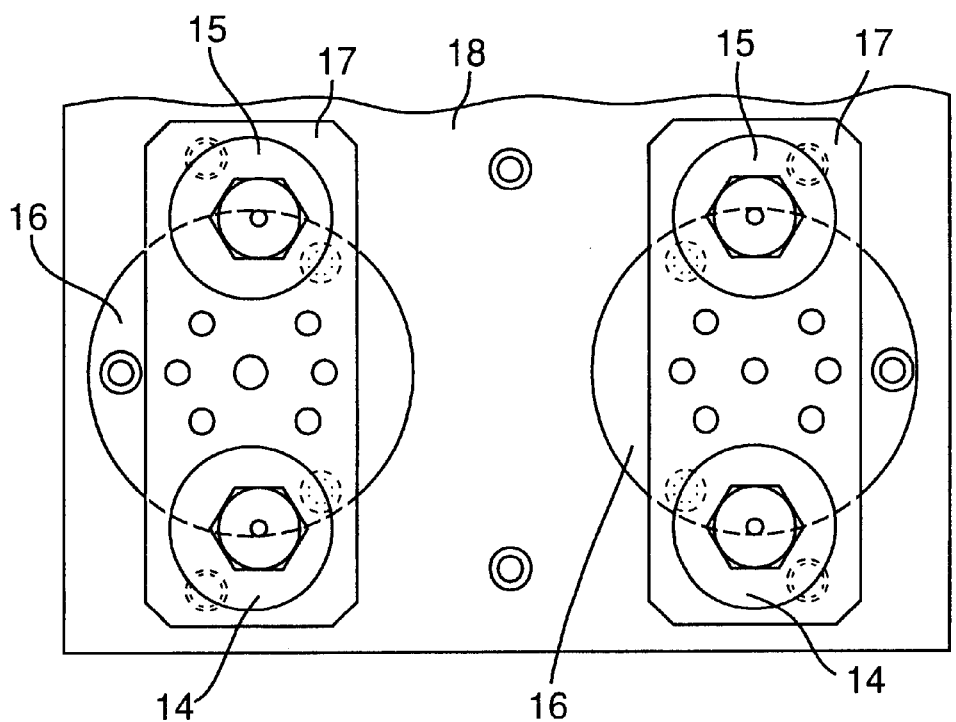
FIG. 8 is an enlarged plan view of a traveling wheel portion of the drive portion of the head of the component mounting apparatus of FIG. 1.
Figure 9:
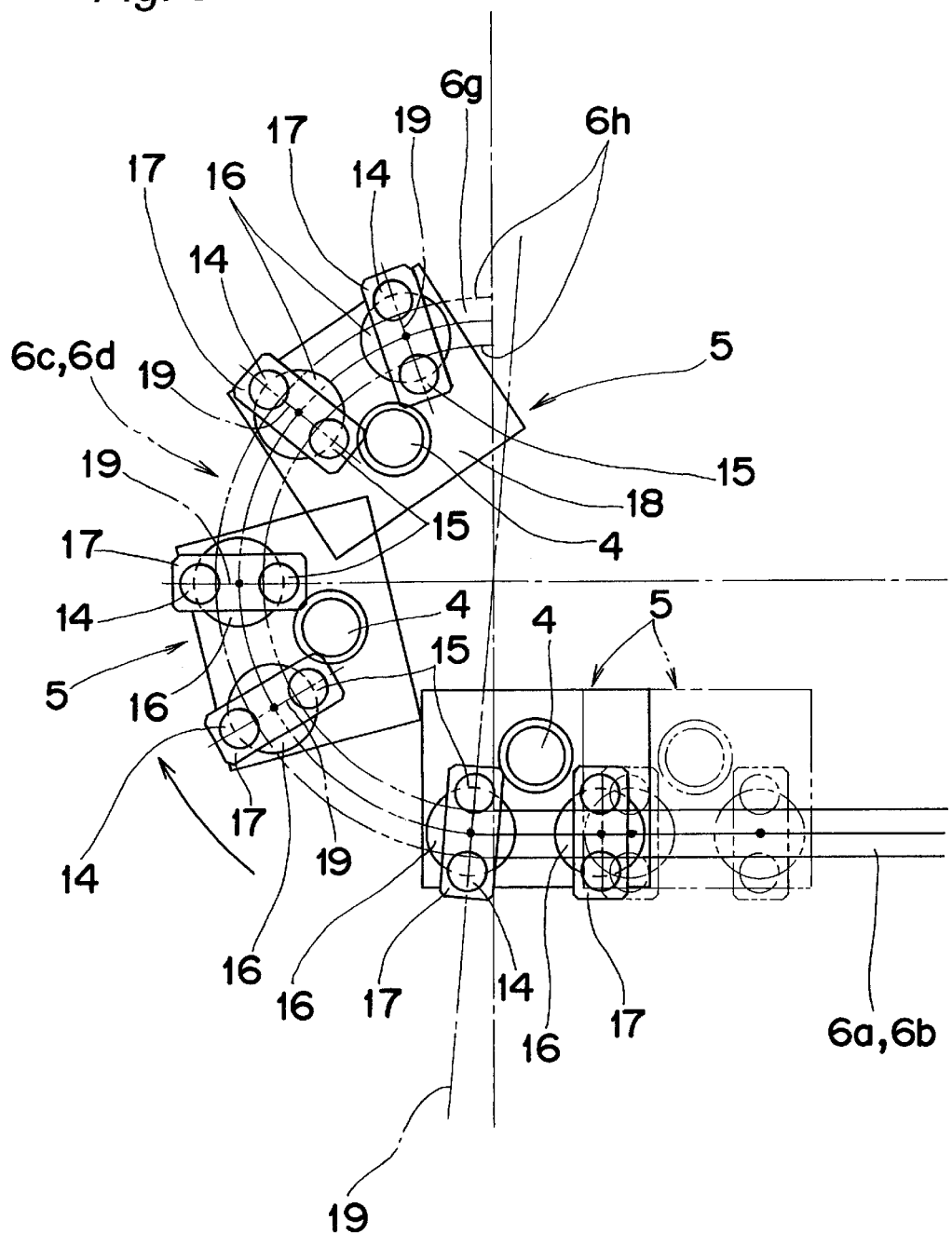
FIG. 9 is an explanatory view for explaining a traveling state in a curved portion of the travel track of the head of the component mounting apparatus of FIG. 1.

As shown in FIG. 5, FIG. 6, FIG. 7A, FIG. 7B, and FIG. 8, the pair of traveling wheels 14 and 15 and the pair of traveling wheels 14 and 15 that hold the rail body 6g between them on the leading side and the trailing side in the traveling direction are rotatably mounted on the respective rectangular swing plates 17 by way of fixed shafts 14h and 15h so that the wheels are located at an equal distance from the center axis of the rail body 6g. As shown in FIG. 7B, a rotary shaft 15g and the fixed shaft 15h of the wheel 15 have an identical axial center. However, a rotary shaft 14g of the wheel 14 is eccentric relative to the fixed shaft 14h, and by moving the rotary shaft 14g around the axial center of the fixed shaft 14h, the position of the wheel 14 can be adjusted in distance relative to the triangular cross-section portion 6h of the rail body 6g. Each swing plate 17 is fixed to a rotary disk 16, and the rotary disk 16 is rotatably supported by a support plate 18 around the center of the rotary disk 16 coinciding with the center of the swing plate 17. Therefore, as shown in FIG. 9, the heads 5 are traveling in a state in which the swing plate 17 that supports the pair of wheels 14 and 15 located on the leading side in the traveling direction and the swing plate 17 that supports the pair of wheels 14 and 15 located on the trailing side in the traveling direction are roughly parallel to each other in, for example, the straight portions 6a and 6b of the travel track 6. However, when moving from the straight portion to the curved portion, the swing plate 17 that supports the pair of wheels 14 and 15 located on the leading side in the traveling direction firstly slightly turns clockwise together with the rotary disk 16, by which the outer wheel 14 is located slightly ahead of the inner wheel 15 in the traveling direction. Subsequently, if the pair of wheels 14 and 15 located on the trailing side in the traveling direction move to the curved portion, then the swing plate 17 slightly rotates clockwise together with the rotary disk 16 in a similar manner, and the outer wheel 14 is located slightly ahead of the inner wheel 15 in the traveling direction. This arrangement is provided so as to allow the wheels smoothly travel in the curved portion by changing the wheel position in correspondence with the phenomenon that the travel distance on the outside becomes longer than the travel distance on the inside in the curved portions 6c and 6d. Eventually, the swing plates 17 supporting the pair of wheels 14 and 15 located on the leading and trailing sides in the traveling direction allow each head 5 to smoothly travel from the straight portion to the curved portion and from the curved portion to the straight portion by swinging clockwise or counterclockwise along the rail body 6g of the travel track 6 together with the rotary disks 16 so that a straight line 19 connecting the fixed shafts 14h and 15h for rotatably fixing the wheels 14 and 15 to each swing plate 17 is positioned in a direction roughly perpendicular to the tangential direction of the curved portion.

Figure 12:
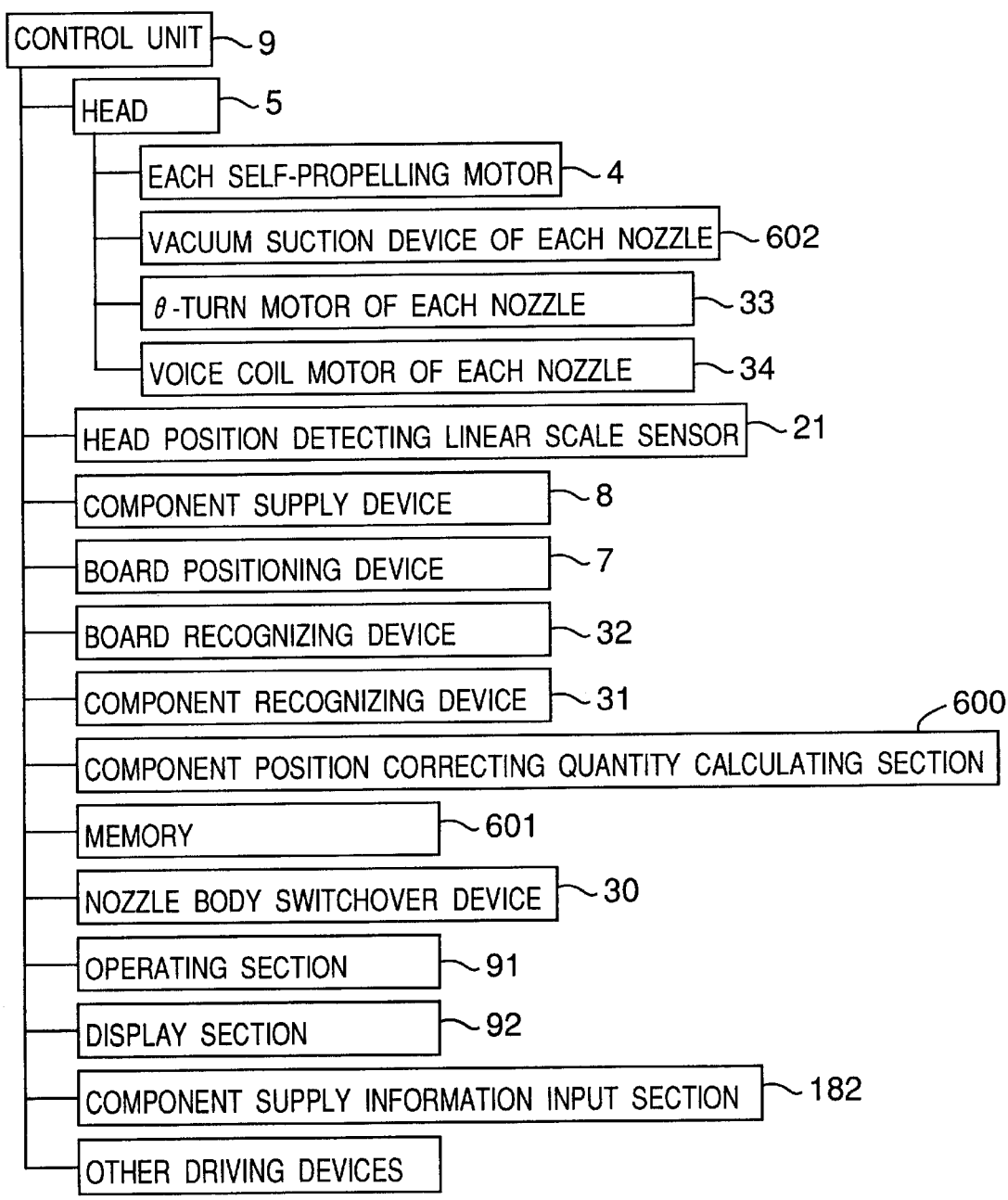
FIG. 12 is a detailed block diagram of the control section of the component mounting apparatus of FIG. 11.

As shown in FIG. 12, the control unit 9 is electrically connected to each head 5 (including each traveling motor 4, a vacuum suction device 602 for making the nozzle body 130 of the nozzle 3 execute suction operation of a component 2, each nozzle θ-turn motor 33, a voice coil motor 34 for the movement of each nozzle 3 in a Z-axis direction (for example, in the vertical direction perpendicular to the XY-directions)), a head position detecting linear scale sensor 21, a component supply device 8, a board positioning device 7, a board recognizing device 32, a component recognizing device 31, a component position correcting quantity calculating section 600 for executing calculation of a component position correcting quantity, a memory 601 for storing information necessary for component mounting such as component information of component type and so on, board information, and an NC program; the component position correcting quantity; and results of calculation, a nozzle body switchover device 30, an operating section 91 constructed of a keyboard or a mouse for inputting information or instructions to the control unit 9, a display section 92 such as a display screen for displaying the information inputted from the operating section 91 and displaying operation information of the component mounting apparatus 10, a component supply information input section 182 for inputting the component supply information such as the information of the components 2 contained in the component supply cassettes 80 by means of known information input means such as the keyboard, mouse, or a reading device for reading necessary information from a storage device, and other drive devices and controls the operation of the whole component mounting apparatus by allowing signals of operation control and operation status to be received.

FIG. 10 is a schematic plan view for explaining a state in which a number of heads 5 each being provided with two component suction nozzles 3 travel along the travel track 6 in the component mounting apparatus of FIG. 1. A component mounting method by means of the component mounting apparatus having the above construction will be described with reference to FIG. 10.

As shown in FIG. 10, a plurality of heads 5 each having two component suction nozzles 3 constantly circulate in one direction while repeating go and stop of traveling, and stop in front of two devices or one device of the plurality of component supply devices 8 in the first straight portion 6a of the travel track 6 to hold by suction the components 2 from the component supply device(s) by the two nozzles 3.

Subsequently, the heads travel along the travel track 6 and stop or pass in front of the two component recognizing devices 31 in the curved portion 6d for the recognition of the position of each component 2 by means of the component recognizing devices 31, the quantity of correction in the XY-directions and the θ-direction is calculated by means of the component position correcting quantity calculating section 600 of the control unit 9 before reaching the first board 1 or before mounting after reaching the first board 1 when mounting the components on specified one board 1 or two boards 2 located in the positional range from the curved portion 6d to the second straight portion 6b, and θ-correction turn around the nozzle axis on the basis of the calculated quantity of correction in the direction of θ is executed by means of the θ-turn motor 33. The heads stop when reaching the specified board 1 in the second straight portion 6b and mount the components 2 on the board 1 by two nozzles 3.

In this stage, it is acceptable to execute switchover of each head from a high-speed travel to a low-speed travel just before the position, which belongs to the travel track and in which the component recognizing device is arranged, and recognize the posture of the component that has been received from the component supply device and held by each component holding member of each head by means of the component recognizing device while making each head travel at low speed or preferably making each head travel at a low constant speed. It is also acceptable to recognize the posture of the component that has been received from the component supply device and held by the component holding member of each head by means of the component recognizing device without changing the speed from a point located just before the position, which belongs to the travel track and in which the component recognizing device is arranged to a point beyond the position, which belongs to the travel track and in which the component recognizing device is arranged. It is also acceptable to recognize the posture of the component that has been received from the component supply device and held by the component holding member of each head by means of the component recognizing device by making each head stop in the position, which belongs to the travel track and in which the component recognizing device is arranged.

After completing mounting, the nozzle body 130 of each nozzle 3 is stopped in front of the nozzle body switchover device 30 for the nozzle switchover by the nozzle body switchover device 30 as the occasion demands in the curved portion 6c directed from the second straight portion 6b toward the first straight portion 6a, and thereafter, component holding by each nozzle 3 of each head 5 is executed again by the component supply device 8 in the first straight portion 6a. Concurrently with the above-mentioned mounting operation, another head 5 executes the component suction operation for attracting by suction the components 2 to a plurality of nozzles 3 from a plurality of component supply devices 8. Meanwhile, another head 5 is permitted to recognize the position of the components 2 held by the nozzles 3, and yet another head 5 is permitted to execute the switchover operation of the nozzle 3.

By storing the positions where the component suction nozzles 3 of the plurality of heads 5 hold by suction the components, the control of movement of the heads 5, the board to be mounted with the components by the component suction nozzles 3, the component mounting positions of the board, and so on preparatorily in the memory 601 by an NC program or the like and executing the operation according to the NC program under the control of the control unit 9, the component suction or component mounting can be executed in arbitrary positions in accordance with arbitrary timing. Therefore, in the case of a plurality of boards 1, the components 2 can also be similarly mounted on a plurality of boards 1 by a plurality of heads 5.

When each head 5 travels, in order to prevent the heads 5 from colliding against one another or prevent the operation of the component suction nozzles 3 from being hindered, i.e., in order to prevent the interference, the operations of the heads 5 are controlled by the control unit 9.

The detail of the aforementioned embodiment and a modification example of the aforementioned embodiment will be described below with reference to the accompanying drawings.

Figure 11:
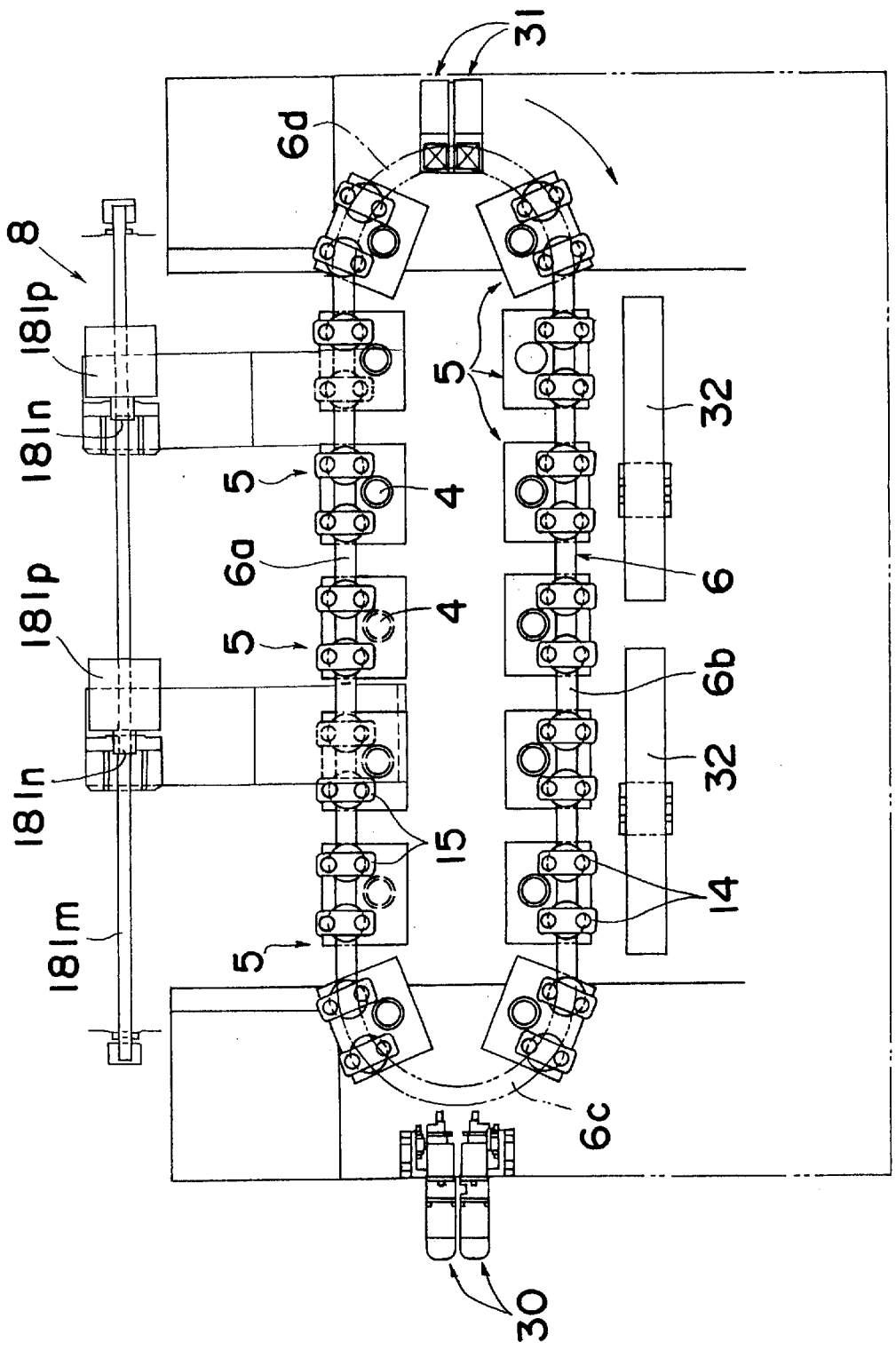
FIG. 11 is a schematic plan view for explaining a state in which a number of heads each being provided with two component suction nozzles travel along a travel track provided with two Y-direction board positioning devices and two component supply cassette containers in the component mounting apparatus of FIG. 1.

FIG. 11 is a schematic plan view for explaining a state in which a number of heads 5 each being provided with two component suction nozzles 3 travel along the travel track 6 provided with two Y-direction board positioning devices 70 and two component supply cassette containers 80a in the component mounting apparatus of FIG. 1. On the component supply cassette 80 side, one ball thread shaft 181m is fixed parallel to the straight portion 6a of the travel track 6, and two nuts 181n are meshed with this ball thread shaft 181m. Hollow motors 181p for rotating the nuts 181n are provided, and the hollow motors 181p are fixed to a placement table 181k on which the component supply cassette container 80a is placed. Therefore, by forwardly and reversely rotating the nuts 181n by the hollow motors 181p that are rotatively driven, the placement table 181k and accordingly the component supply cassette container 80a reciprocate integrally with the hollow motors 181p along the ball thread shaft 181m to position the desired component supply cassette 80 in the component supply position, allowing the components 2 to be picked out of the component outlet port of the component supply cassette 80 by means of the component suction nozzles 3 in a suction holding manner.

FIG. 12 is a detailed block diagram of the control section of the component mounting apparatus of FIG. 11.

Figure 13:
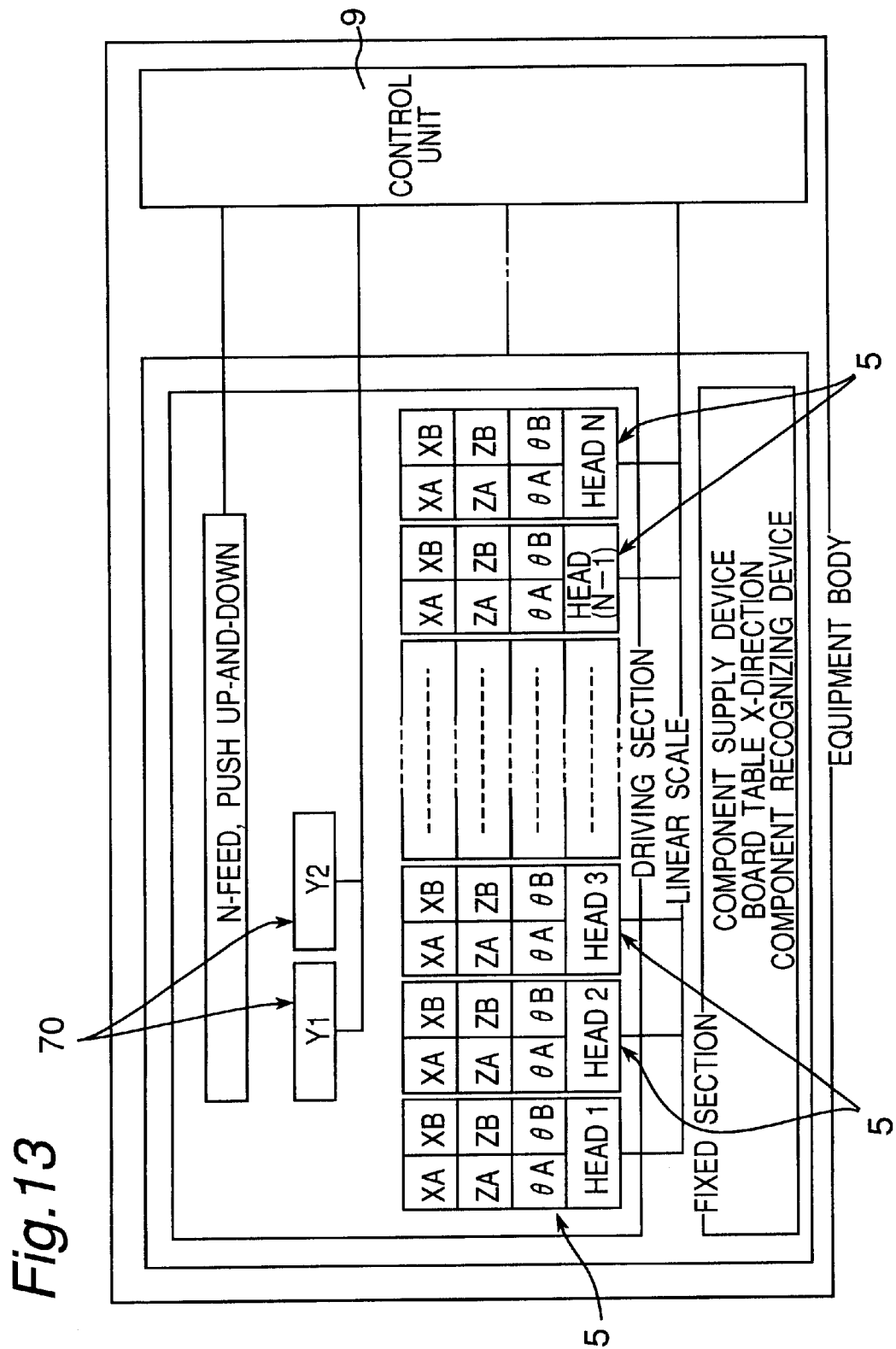
FIG. 13 is a schematic block diagram of the control section of the component mounting apparatus of FIG. 11.

FIG. 13 is a schematic block diagram of the control section of the component mounting apparatus of FIG. 11. In FIG. 13, "Y1" and "Y2" are the control parts of the two Y-direction board positioning devices 70. "N-FEED, PUSH UP-AND-DOWN" is the control part for controlling the pushing operation of the component supply lever 80h in the component supply cassette 80. "LINEAR SCALE" is the control part for detecting the position of each head 5 on the basis of information from the linear scale sensor 21 of the linear scale 20 provided for the straight portions 6a and 6b of the travel track 6. "FIXED SECTION" is the section where control parts of devices that do not move themselves are gathered, among which "COMPONENT SUPPLY DEVICE/BOARD TABLE X-DIRECTION/COMPONENT RECOGNIZING DEVICE" is the control part for controlling the operations of the component supply device 8, the board positioning device 7 and the component recognizing device 31. "DRIVING SECTION" is the section where control parts of the devices that move themselves are gathered. In each head 5 among them, "XA" is the control part for controlling the movement of one nozzle A out of two component suction nozzles in the X-direction, while "XB" is the control part for controlling the movement of the other nozzle B out of two component suction nozzles in the X-direction. "ZA" is the control part for controlling the movement of the one nozzle A in the Z-direction (for example, in the vertical direction) perpendicular to the X-direction and the Y-direction. "ZB" is the control part for controlling the movement of the other nozzle B in the Z-direction (for example, in the vertical direction) perpendicular to the X-direction and the Y-direction. "θA" is the control part for controlling the movement of the one nozzle A in the θ-direction around the nozzle axis. "θB" is the control part for controlling the movement of the other nozzle B in the θ-direction around the nozzle axis.

Figure 14:
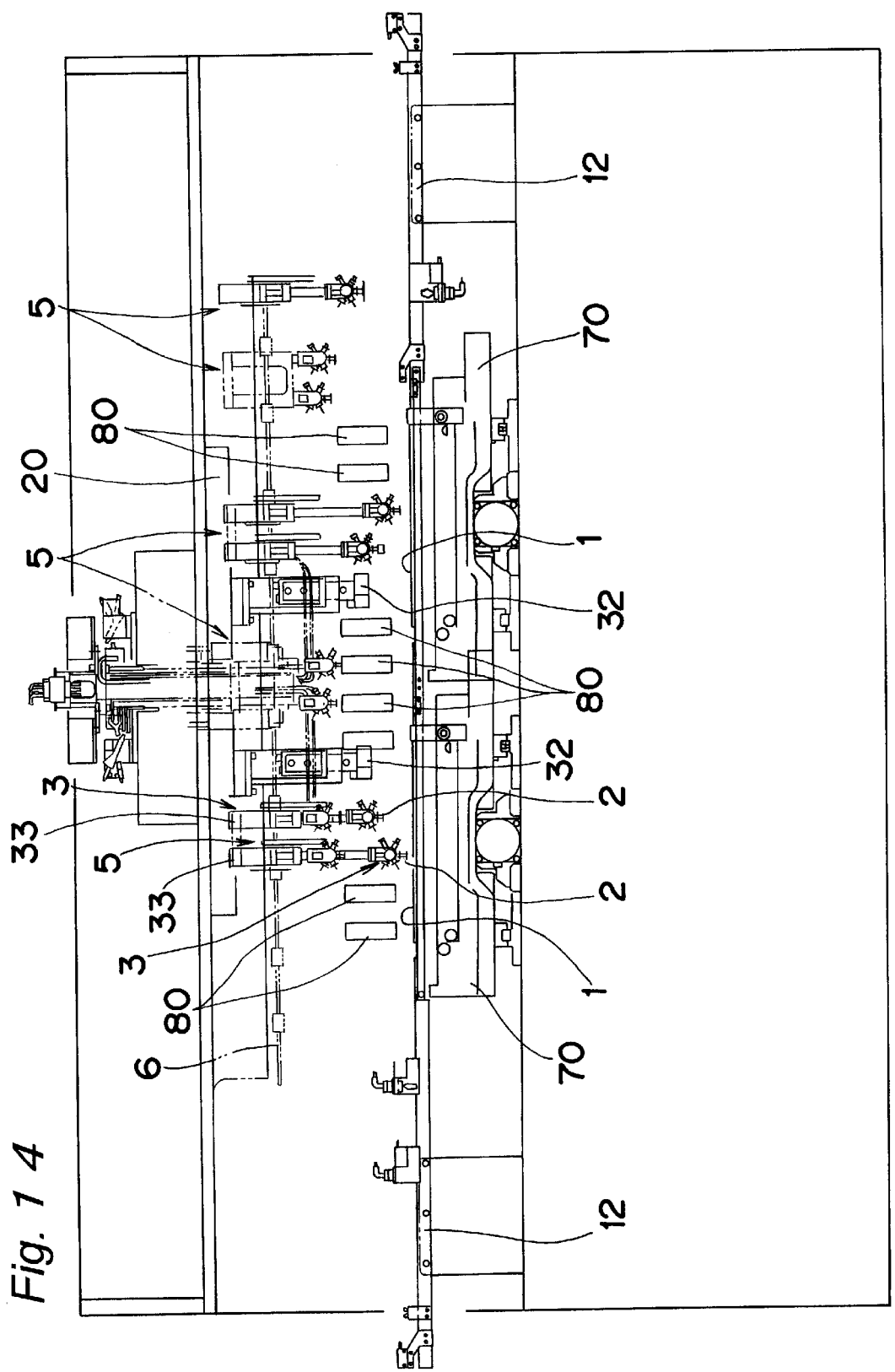
FIG. 14 is a front view showing the portions of two Y-direction board positioning devices of the component mounting apparatus of FIG. 3.

FIG. 14 is a front view showing the sections of two Y-direction board positioning devices 70 of the component mounting apparatus of FIG. 3.

Figure 15:
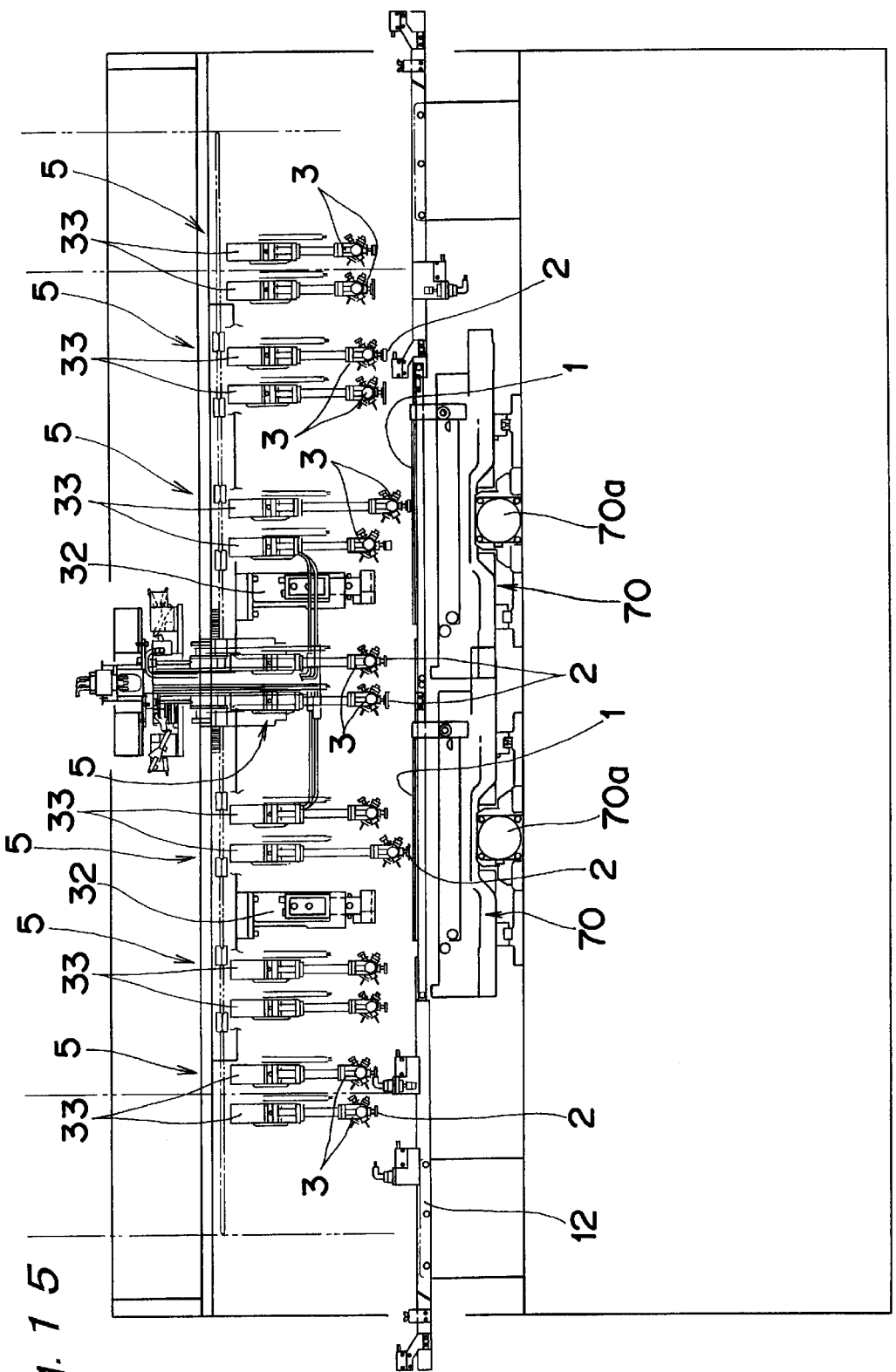
FIG. 15 is a front view showing the portions of two Y-direction board positioning devices of the component mounting apparatus of FIG. 11.

FIG. 15 is a front view showing the sections of two Y-direction board positioning devices 70 of the component mounting apparatus of FIG. 11.

Figure 16:
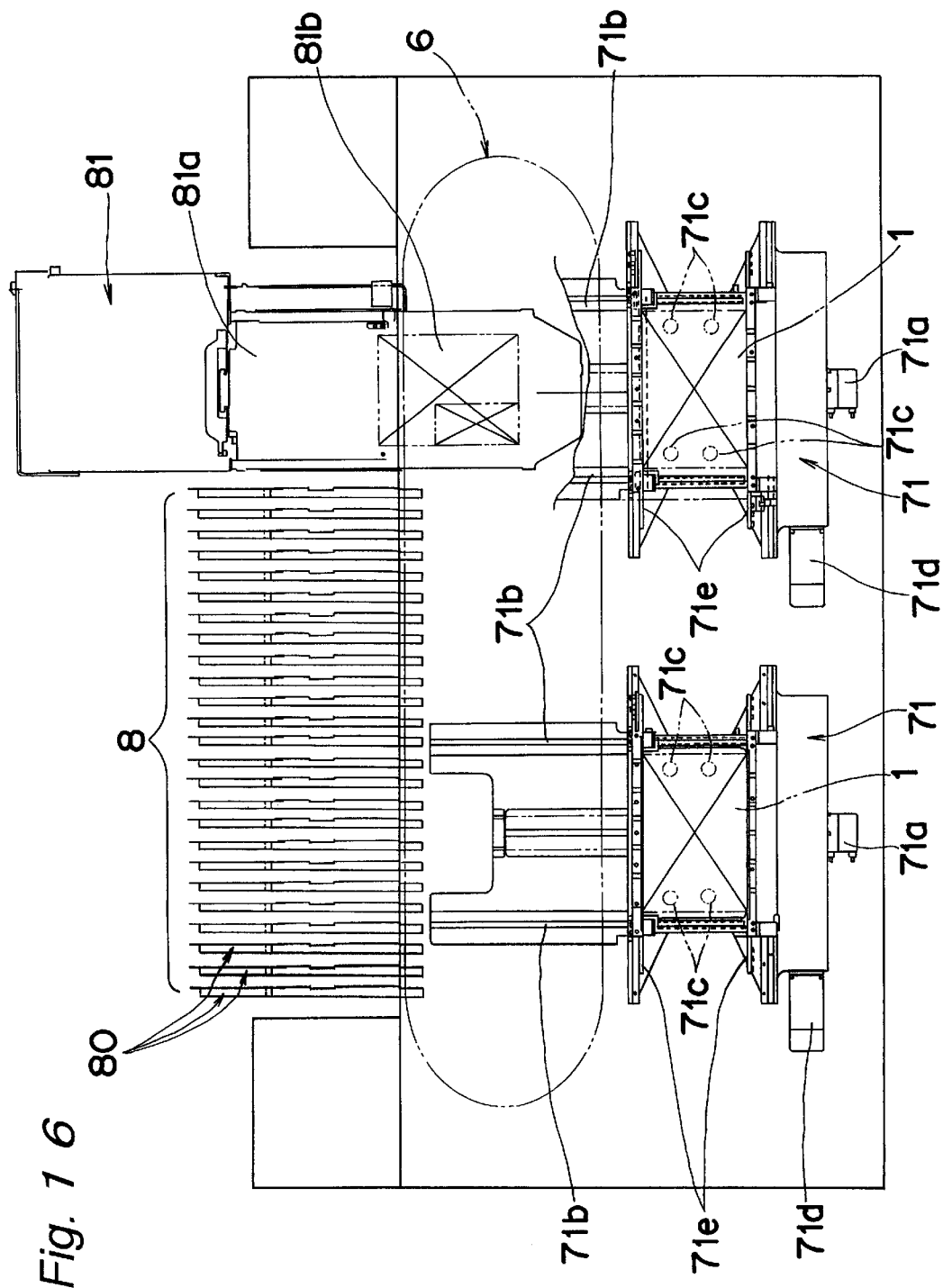
FIG. 16 is a schematic plan view of a component mounting apparatus according to another embodiment of the present invention in a state in which two Y-direction board positioning devices of the component mounting apparatus of FIG. 11 are replaced by two XY-direction board positioning devices and a number of fixed component supply cassettes and one fixed component supply tray device are arranged on the component supply side.

FIG. 16 is a schematic plan view of a component mounting apparatus according to another embodiment of the present invention in a state in which two Y-direction board positioning devices 70, serving as one example of the board positioning device, of the component mounting apparatus of FIG. 11 are replaced by two XY-direction board positioning devices 71 and a number of fixed component supply cassettes 80 and one fixed component supply tray device 81 are arranged on the component supply side. Each XY-direction board positioning device 71 can position the board 1 supported by four suction members 71c in a specified position in the XY-directions by moving the four board supporting table suction members 71c along a pair of guides 71b by a motor 71a in the Y-direction perpendicular to the board carrying conveyer 12 and moving the four suction members 71c along a pair of guides 71e by a motor 71d in the X-direction parallel to the board carrying conveyer 12.

Figure 17:
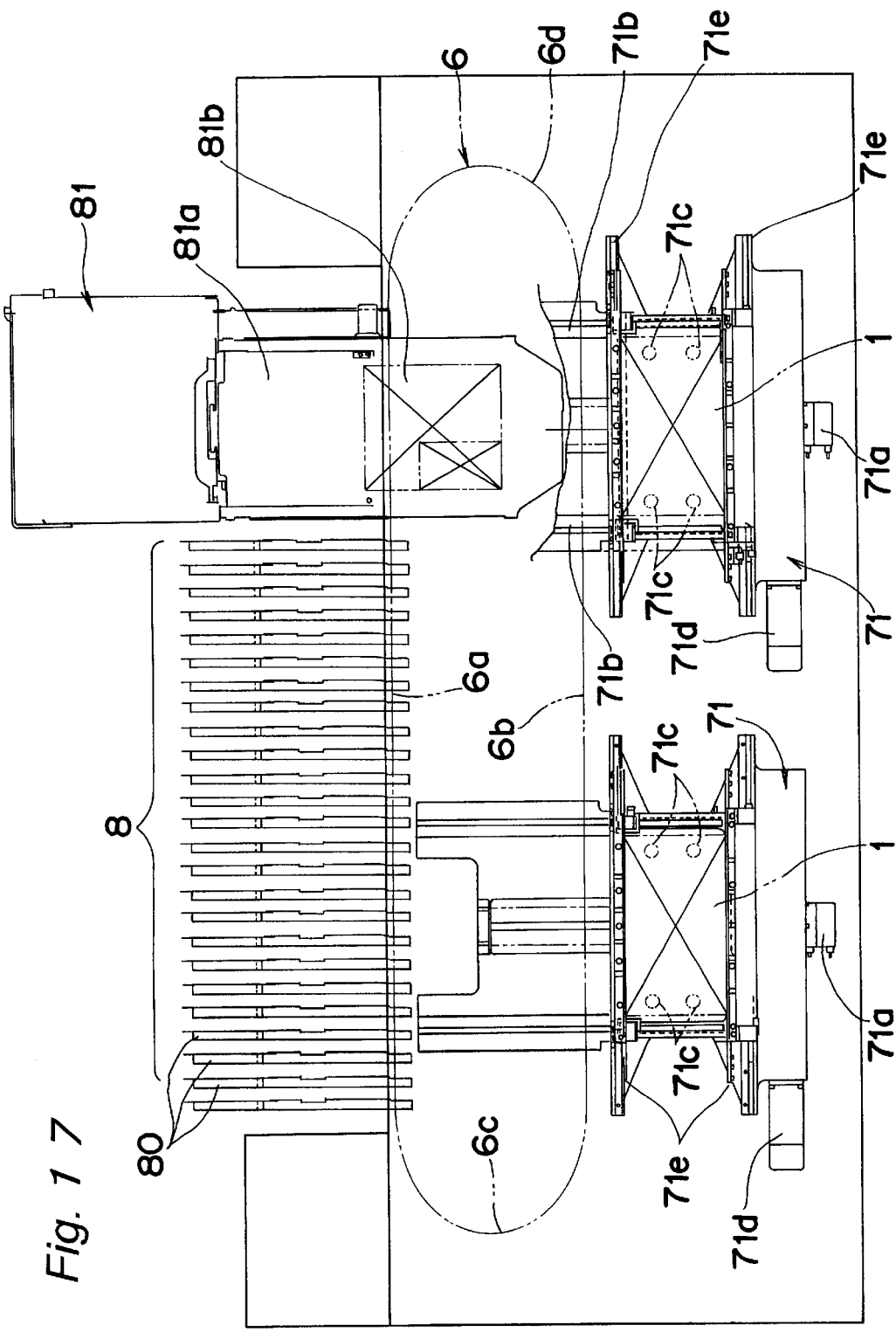
FIG. 17 is an enlarged plan view of a portion around the two XY-direction board positioning devices of FIG. 16.

FIG. 17 is an enlarged plan view of a portion around the two XY-direction board positioning devices 71 of FIG. 16.

Figure 18:
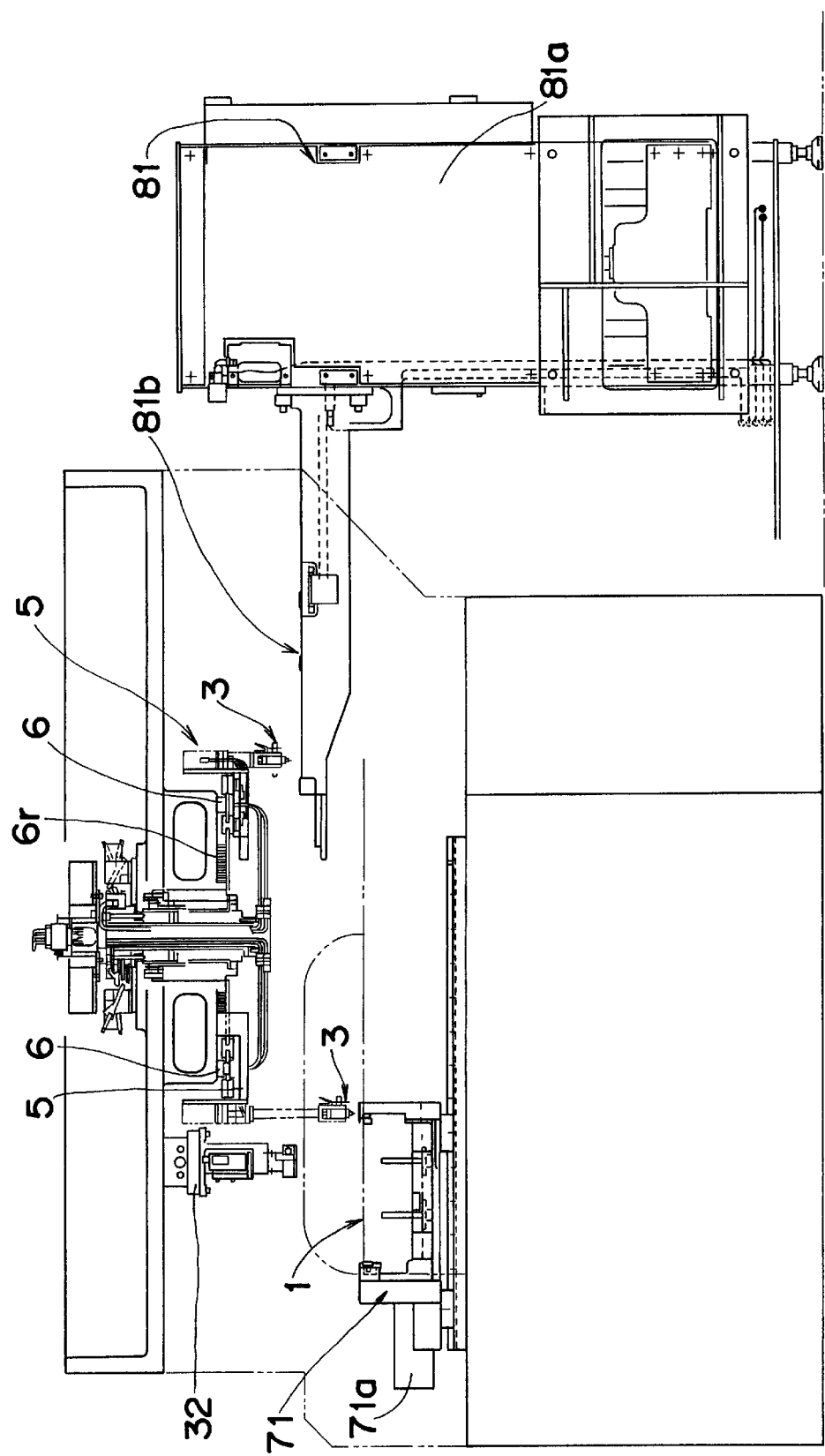
FIG. 18 is a schematic side view showing a relation between a head that travels along the travel track and has two component suction nozzles, two XY-direction board positioning devices and a component supply tray device in the component mounting apparatus of FIG. 16.

FIG. 18 is a schematic side view showing a relation between a head 5 that travels along the travel track 6 and has two component suction nozzles 3, two XY-direction board positioning devices 71, and a component supply tray device 81 in the component mounting apparatus of FIG. 16.

Figure 19:
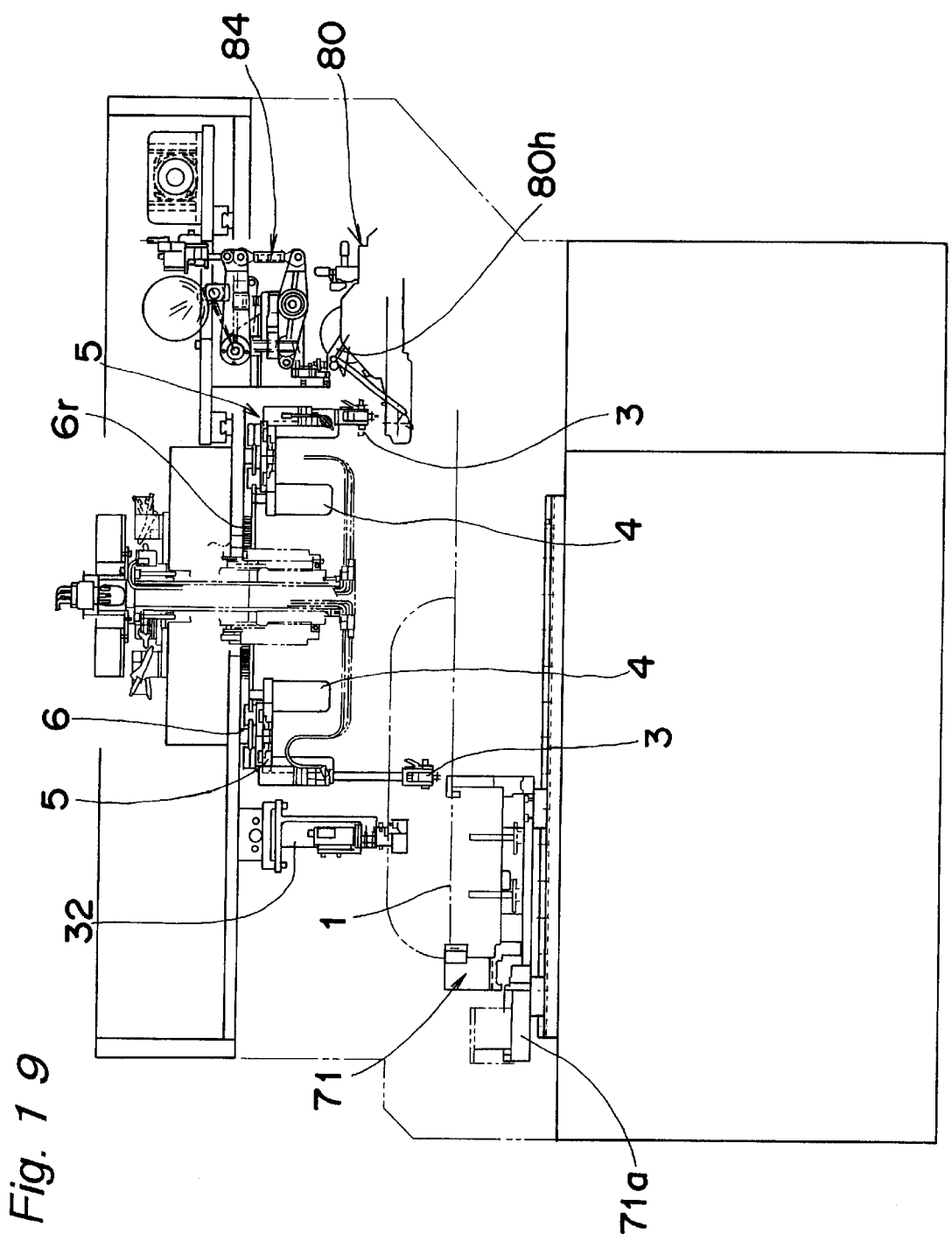
FIG. 19 is a schematic side view showing a relation between a head that travels along the travel track, the XY-direction board positioning device and the component supply cassette in the component mounting apparatus of FIG. 16.

FIG. 19 is a schematic side view showing a relation between the head 5 that travels along the travel track 6, the XY-direction board positioning device 71, and the component supply cassette 80 in the component mounting apparatus of FIG. 16. A component pushing-up mechanism 84 shown in FIG. 18 and FIG. 19 presses the component supply lever 80h of the component supply cassette 80 to move the component 2 to the component outlet port under the control of the control unit 9, facilitating the component suction by the nozzle 3. The component pushing-up mechanism 84 can move along the straight portion 6a of the travel track 6, and the component supply levers 80h of the required component supply cassettes 80 can be successively pushed by moving one component pushing-up mechanism 84.

Figure 20:
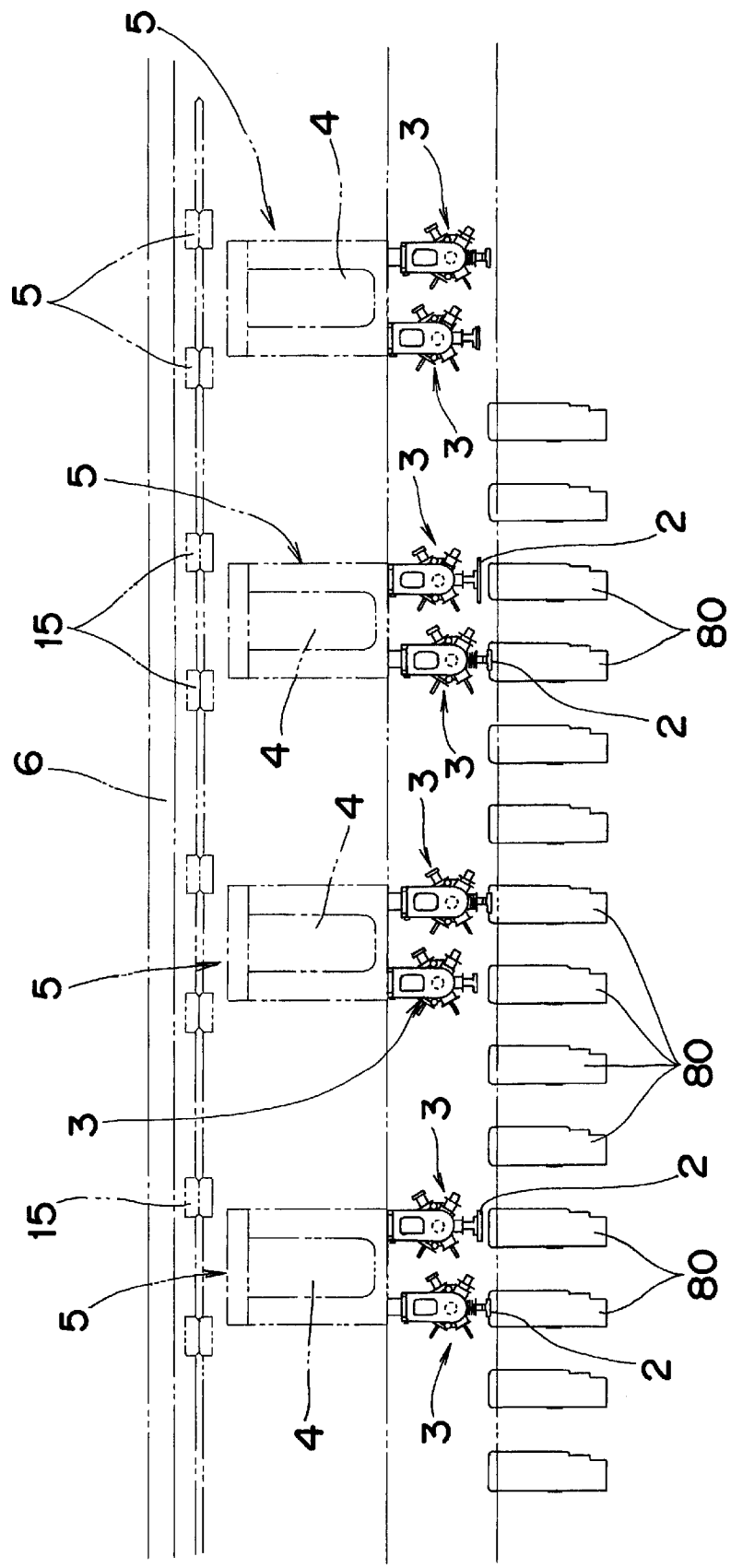
FIG. 20 is a schematic front view showing a relation between two component suction nozzles that perpendicularly extend downward from the head traveling along the travel track and the component supply cassette in the component mounting apparatus of FIG. 16.

FIG. 20 is a schematic front view showing a relation between two component suction nozzles 3 that perpendicularly extend downward from the head 5 traveling along the travel track 6 and the component supply cassette 80 in the component mounting apparatus of FIG. 16.

Figure 21:
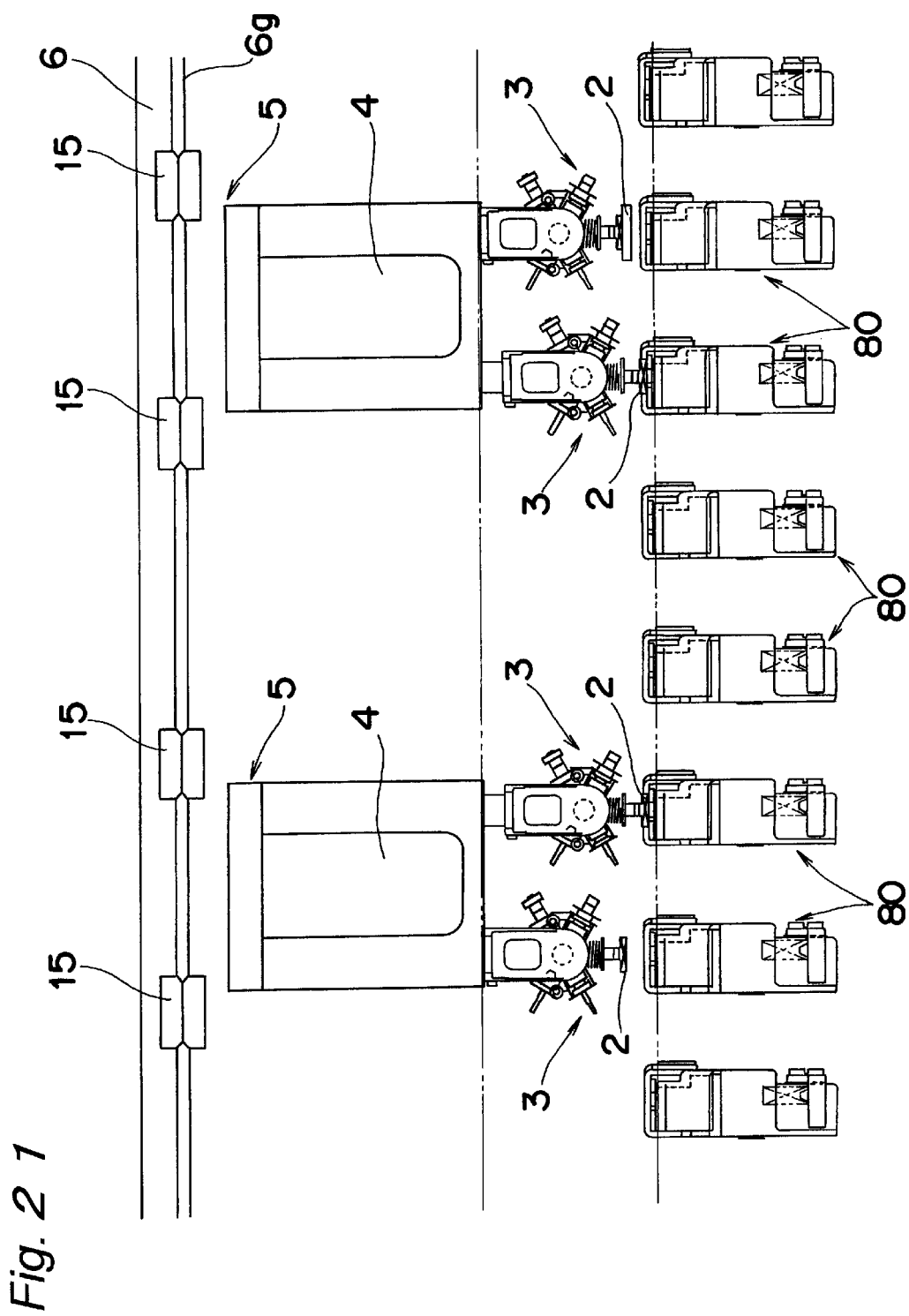
FIG. 21 is an enlarged view of FIG. 20.

FIG. 21 is an enlarged view of FIG. 20.

Figure 22:
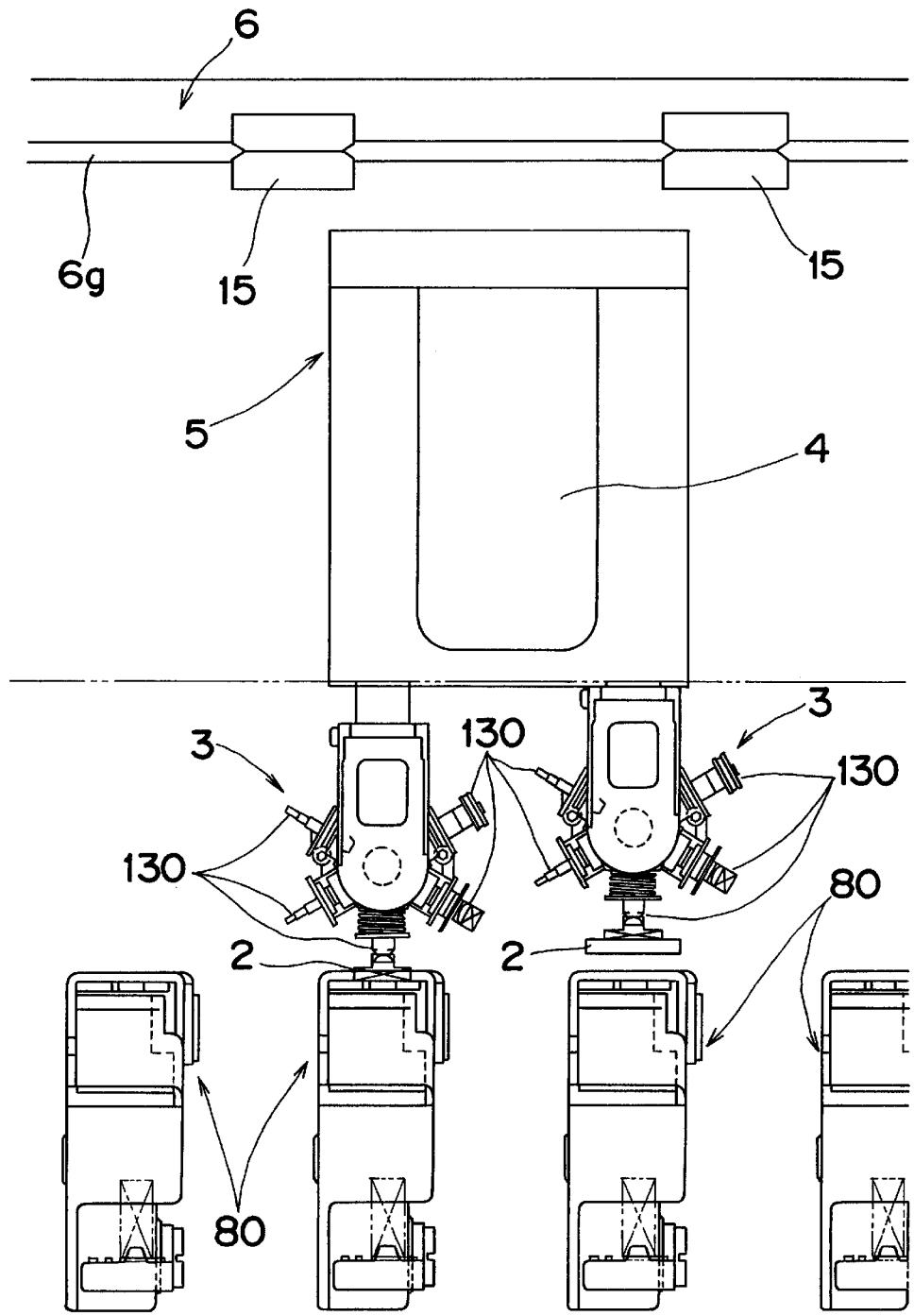
FIG. 22 is an enlarged view of a portion around the nozzle tip of FIG. 20.

FIG. 22 is an enlarged view of a portion around the nozzle tip of FIG. 20.

Figure 23:
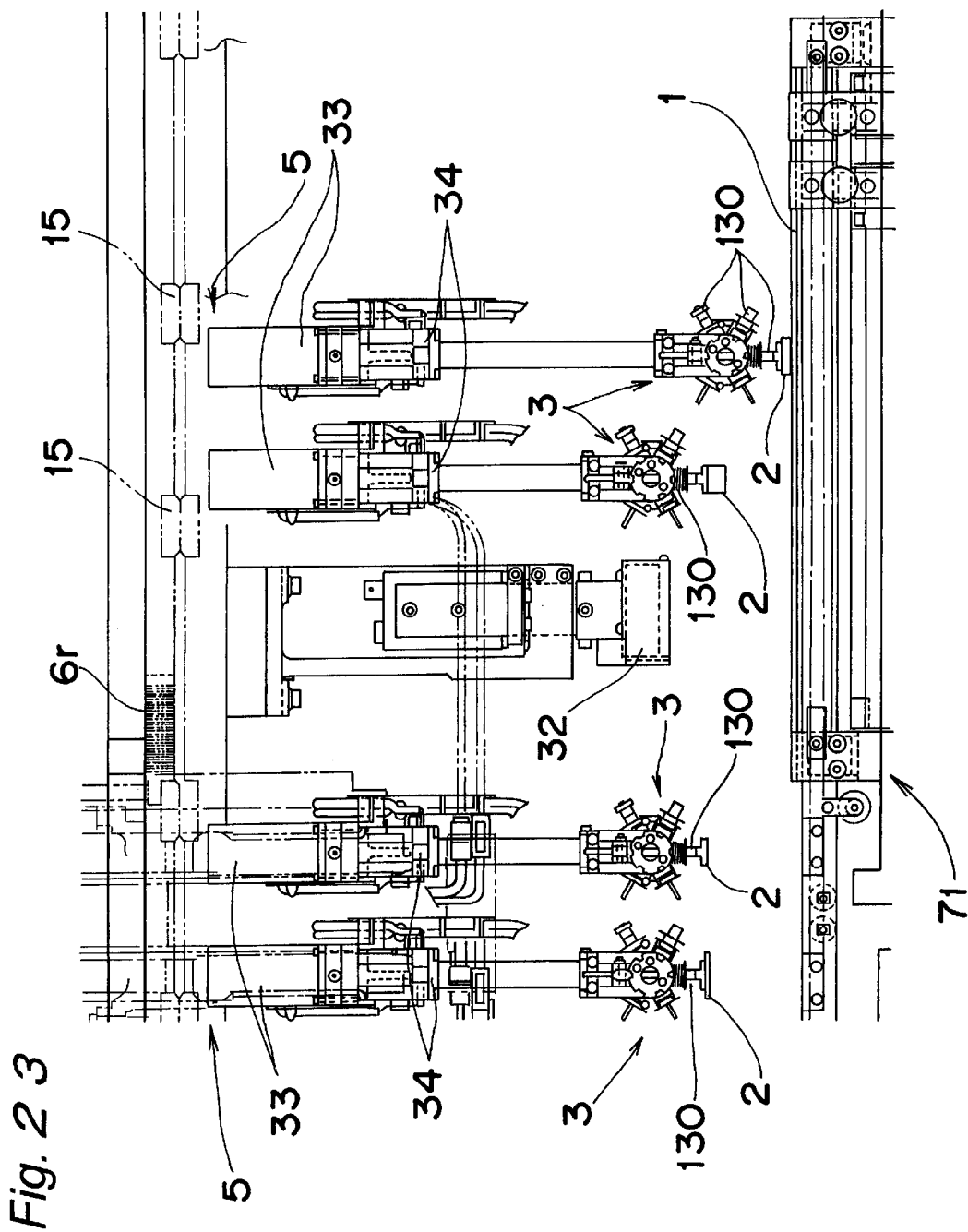
FIG. 23 is a schematic front view showing a relation between two component suction nozzles that perpendicularly extend downward from the head traveling along the travel track and the XY-direction board positioning device in the component mounting apparatus of FIG. 16.

FIG. 23 is a schematic front view showing a relation between two component suction nozzles 3 that perpendicularly extend downward from the head 5 traveling along the travel track 6 and the XY-direction board positioning device 71 in the component mounting apparatus of FIG. 16.

Figure 25:
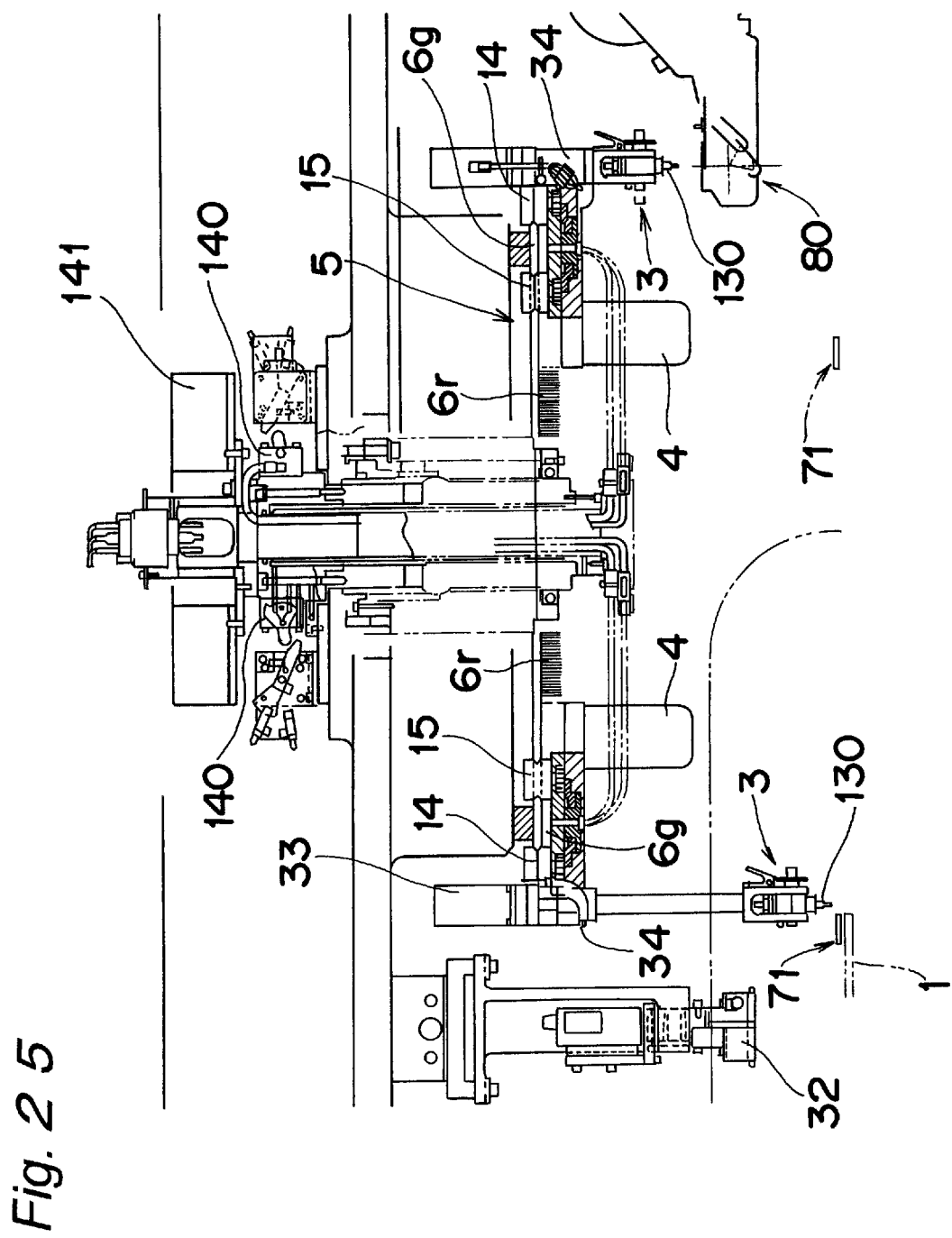
FIG. 25 is an enlarged view of part of FIG. 19.

FIG. 25 is an enlarged view of part of FIG. 19.

Figure 26:
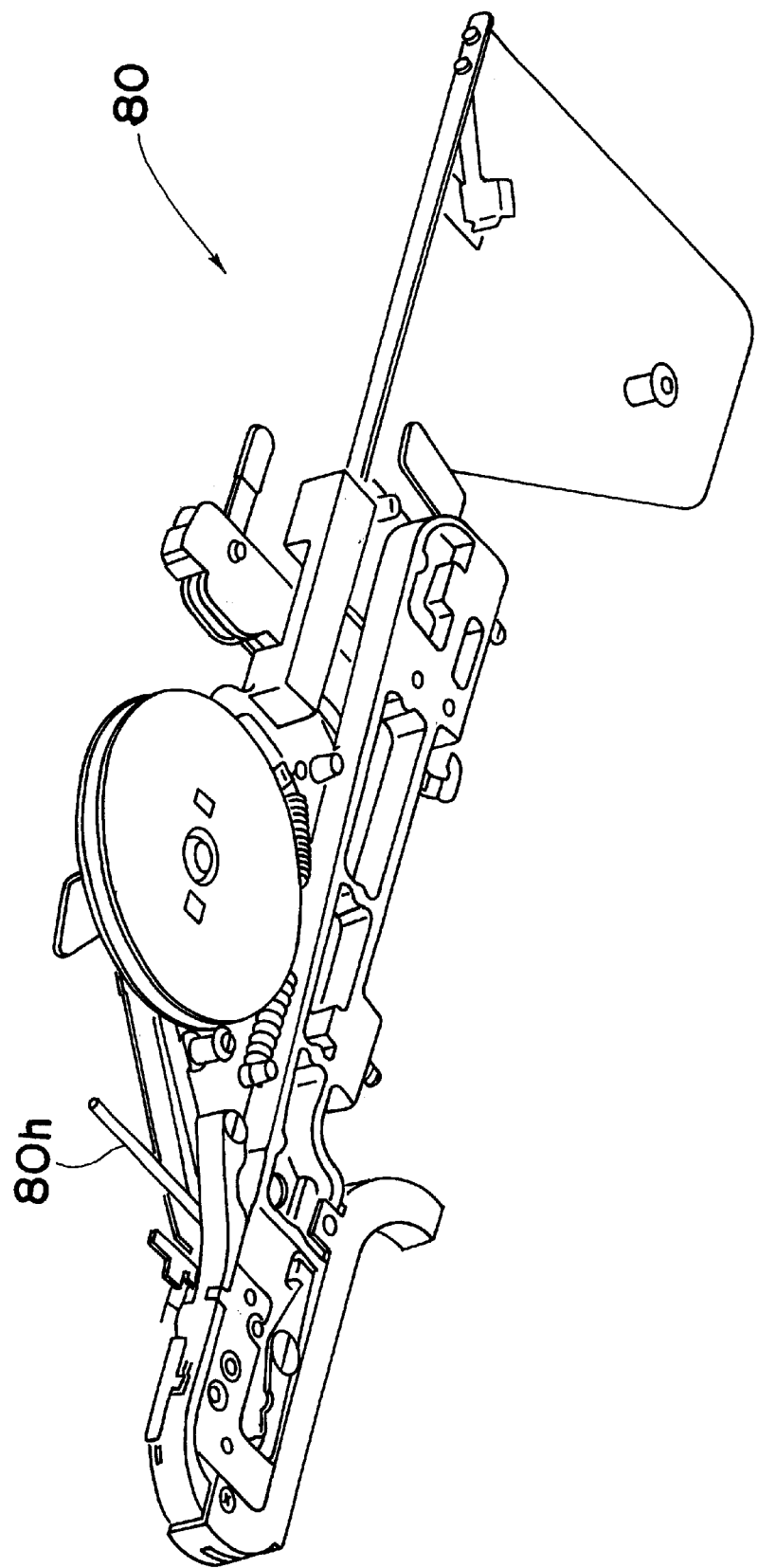
FIG. 26 is a perspective view of a tape component supply cassette that serves as an example of the component supply cassette.

FIG. 26 is a perspective view of a tape component supply cassette 80 that serves as an example of the component supply cassette 80.

Figure 27:
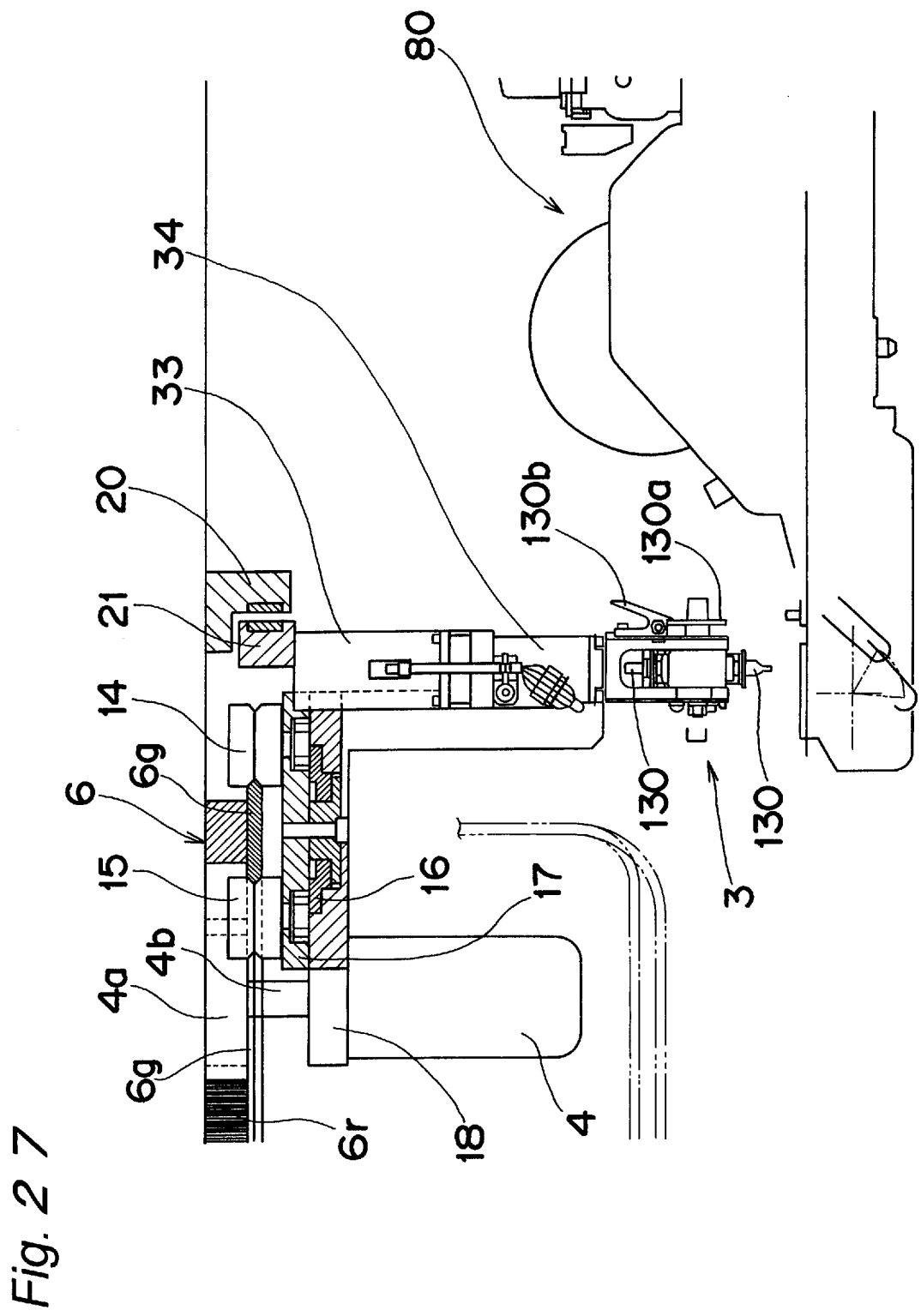
FIG. 27 is an enlarged view showing a relation between the component suction nozzle and the component supply cassette of FIG. 25.

FIG. 27 is an enlarged view showing a relation between the component suction nozzle 3 and the component supply cassette 80 of FIG. 25.

Figure 28:
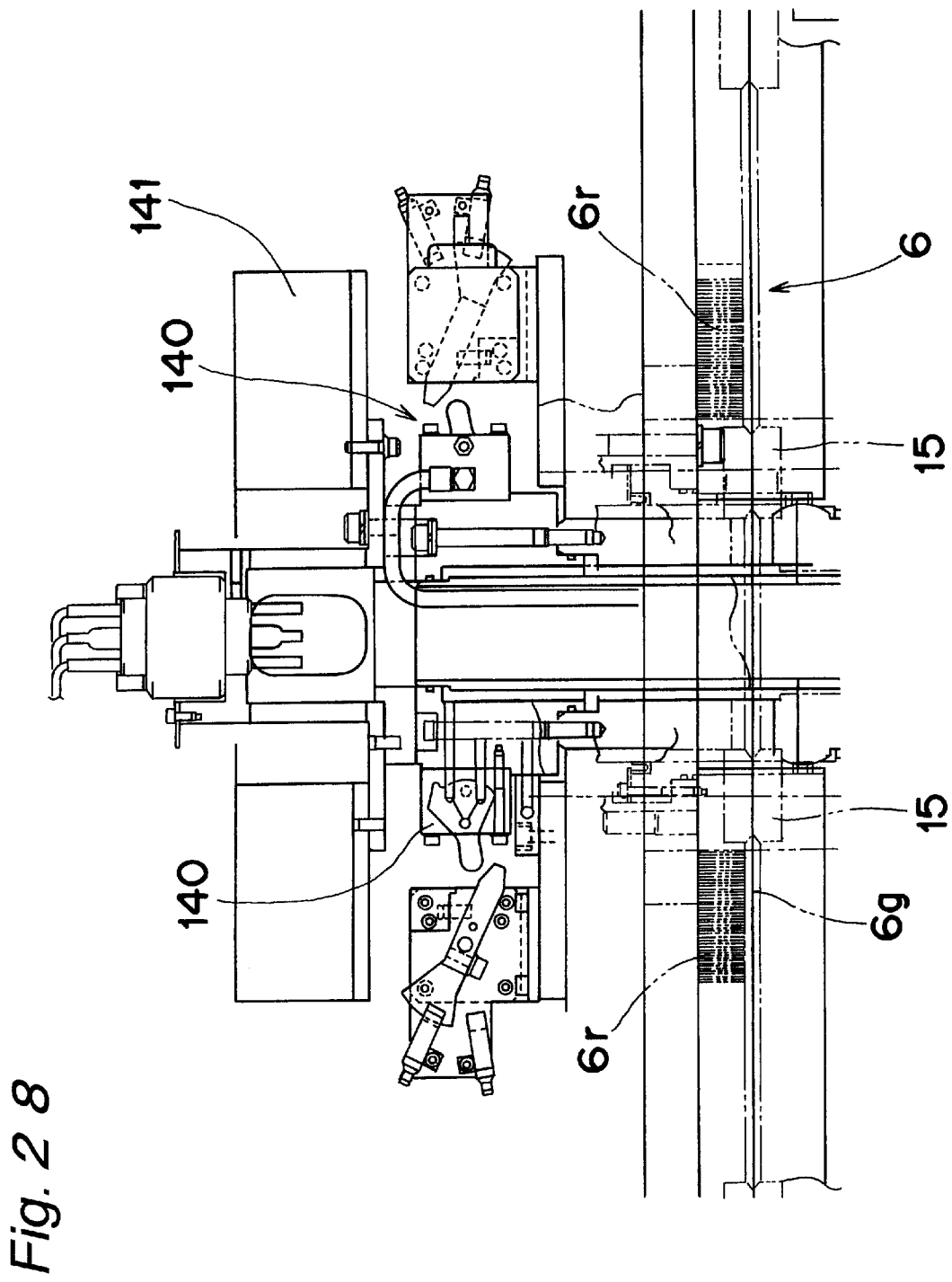
FIG. 28 is an enlarged side view showing an air switchover valve, a component suction nozzle θ-turn motor, and a doughnut-shaped drive circuit housing section that houses a Z-axis direction movement voice coil motor driving-use drive circuit in the component mounting apparatus of FIG. 19.

FIG. 28 is an enlarged side view showing an air switchover valve 140, a component suction nozzle θ-turn motor, and a doughnut-shaped drive circuit housing section 141 that houses a Z-axis direction movement voice coil motor driving use drive circuit in the component mounting apparatus of FIG. 19. The drive circuit housing section 141 rotatively moves together with the head 5 when traveling along the travel track 6.

Figure 29:
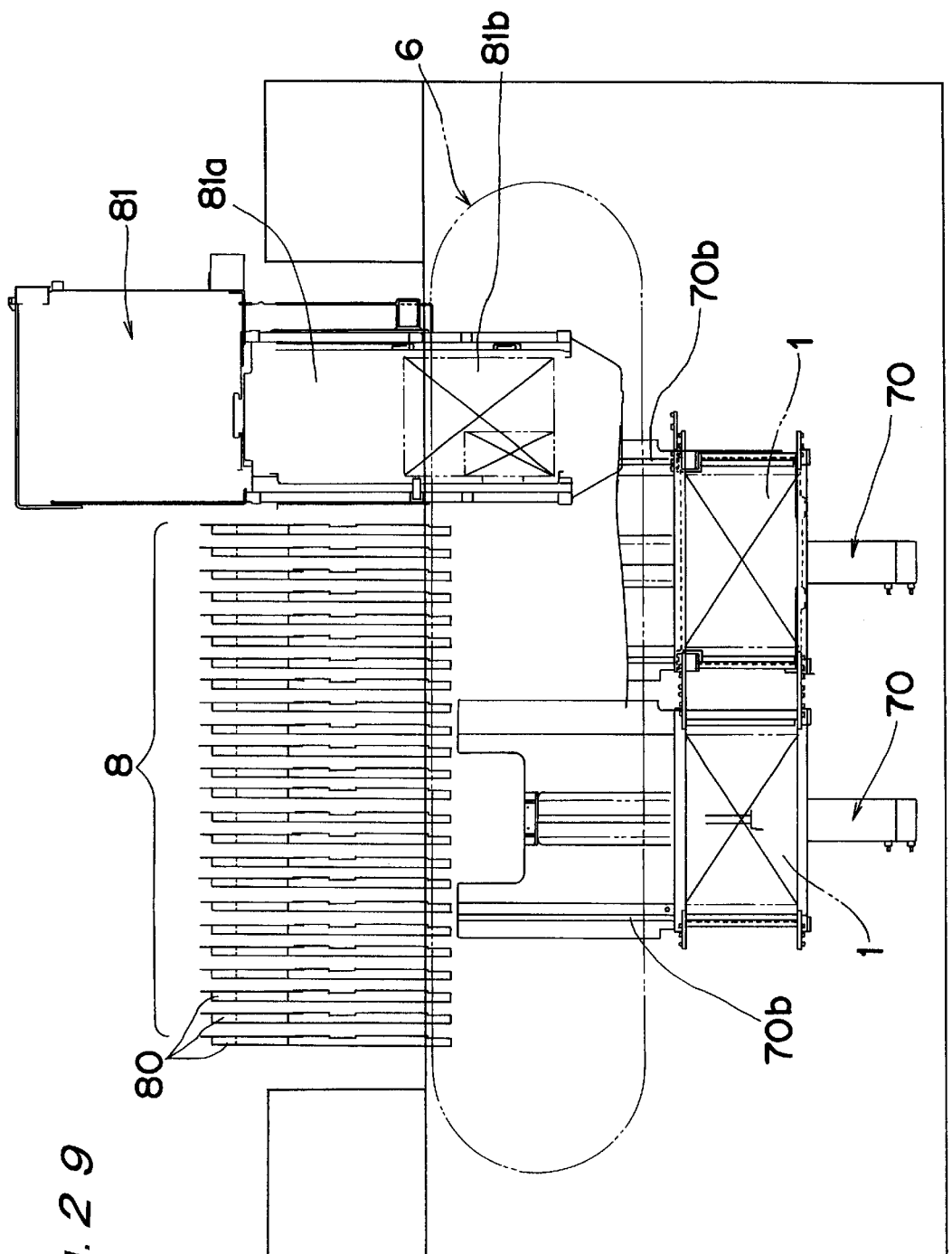
FIG. 29 is a schematic plan view of the component mounting apparatus of FIG. 1, explaining a state in which two Y-direction board positioning devices, a number of fixed component supply cassettes and one fixed component supply tray device are arranged along the travel track.

FIG. 29 is a plan view of the component mounting apparatus of FIG. 1, i.e., a schematic plan view explaining a state in which two Y-direction board positioning devices 70, a number of fixed component supply cassettes 80, and one fixed component supply tray device 81 are arranged along the travel track 6. Each Y-direction board positioning device 70 is immovably fixed in the X-direction perpendicular to the Y-direction.

Figure 30:
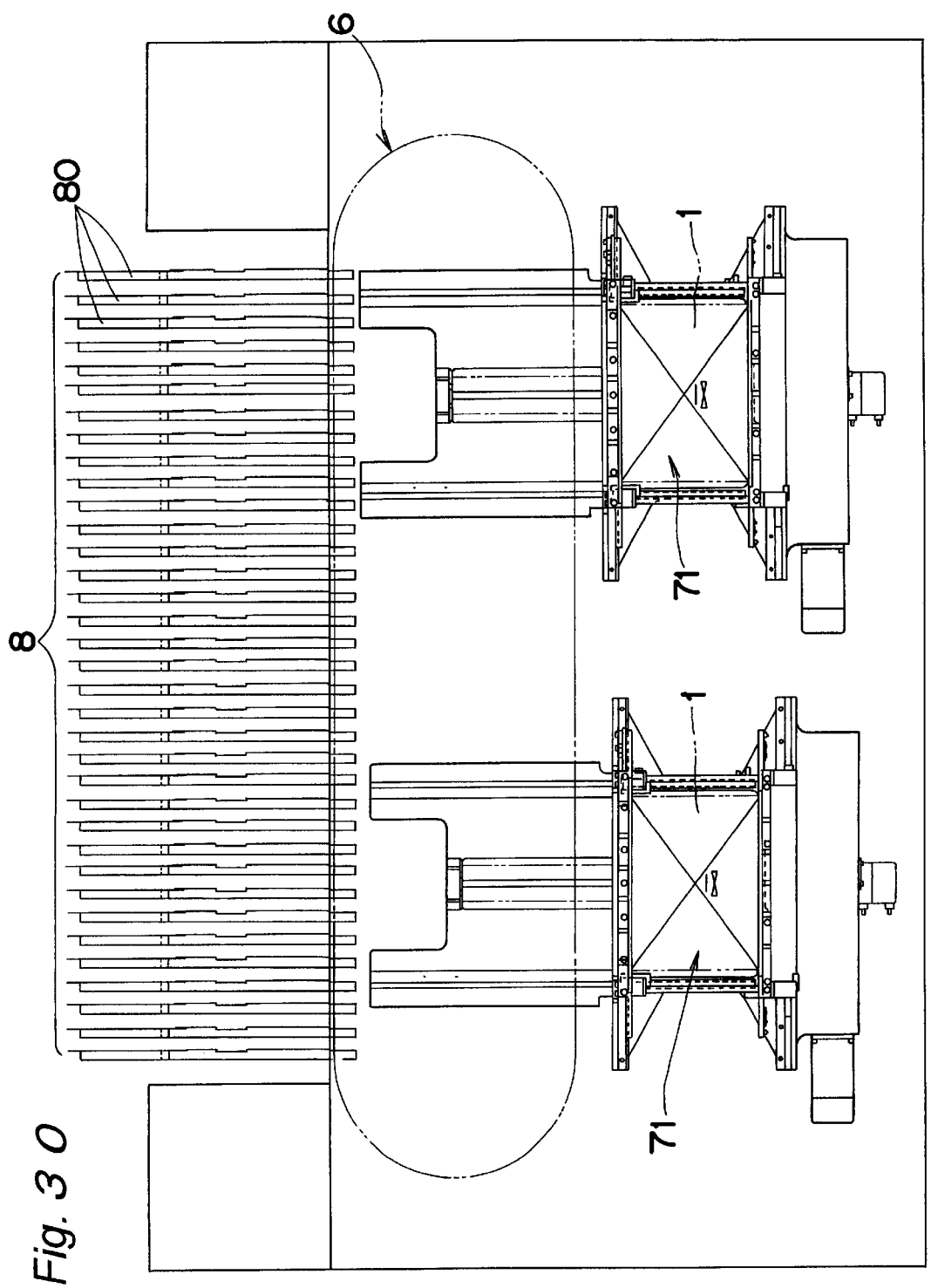
FIG. 30 is a schematic plan view of a component mounting apparatus according to yet another embodiment of the present invention, based on the component mounting apparatus of FIG. 1, explaining a state in which two XY-direction board positioning devices and a number of fixed component supply cassettes are arranged along the travel track.

FIG. 30 is a schematic plan view of a component mounting apparatus according to yet another embodiment of the present invention, based on the component mounting apparatus of FIG. 1, explaining a state in which two XY-direction board positioning devices 71 and a number of fixed component supply cassettes 80 are arranged along the travel track 6.

Figure 31:
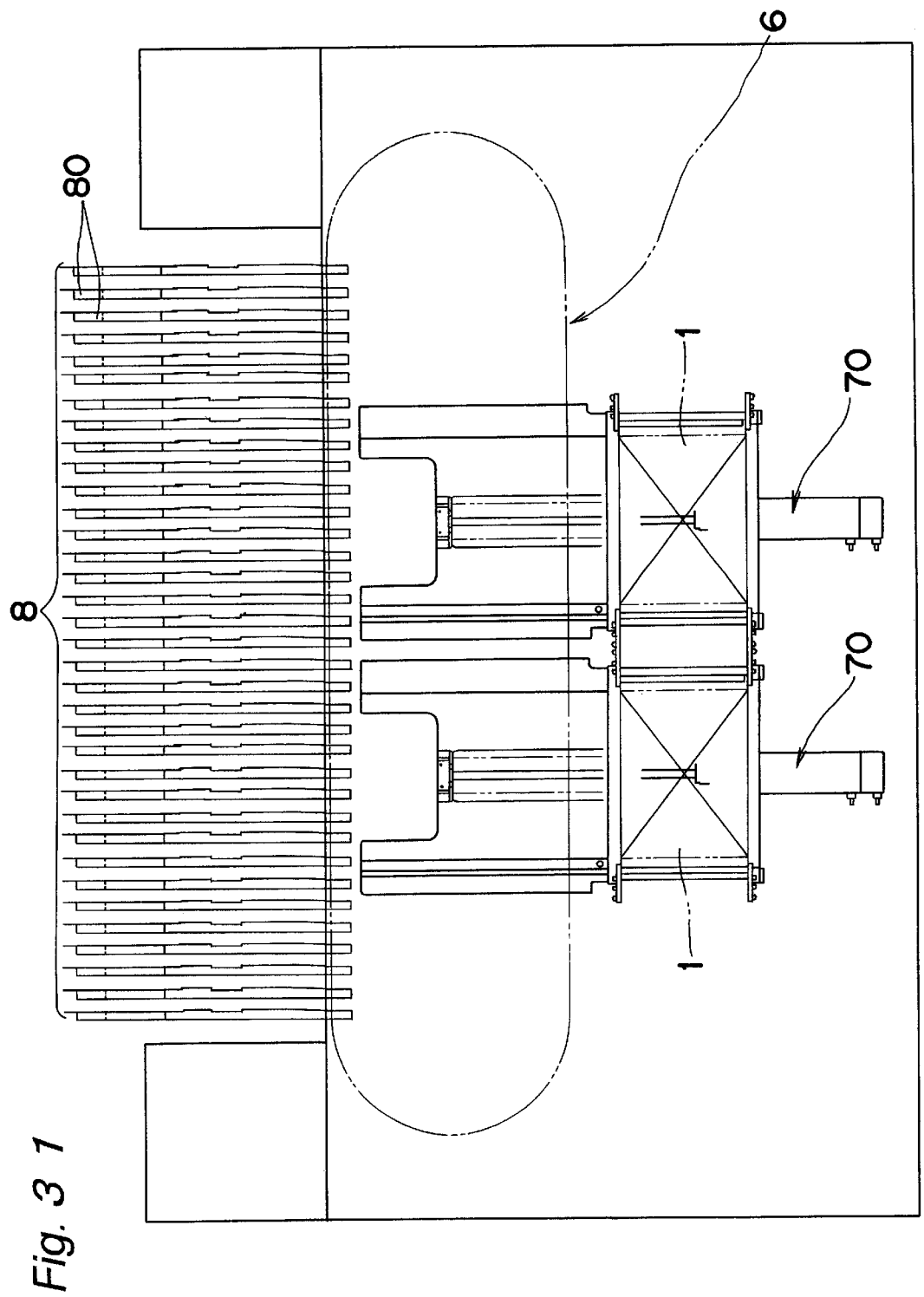
FIG. 31 is a schematic plan view of a component mounting apparatus according to still another embodiment of the present invention, based on the component mounting apparatus of FIG. 1, explaining a state in which two Y-direction board positioning devices and a number of fixed component supply cassettes are arranged along the travel track.

FIG. 31 is a schematic plan view of a component mounting apparatus according to still another embodiment of the present invention, based on the component mounting apparatus of FIG. 1, explaining a state in which two Y-direction board positioning devices 70 and a number of fixed component supply cassettes 80 are arranged along the travel track 6.

Figure 32:
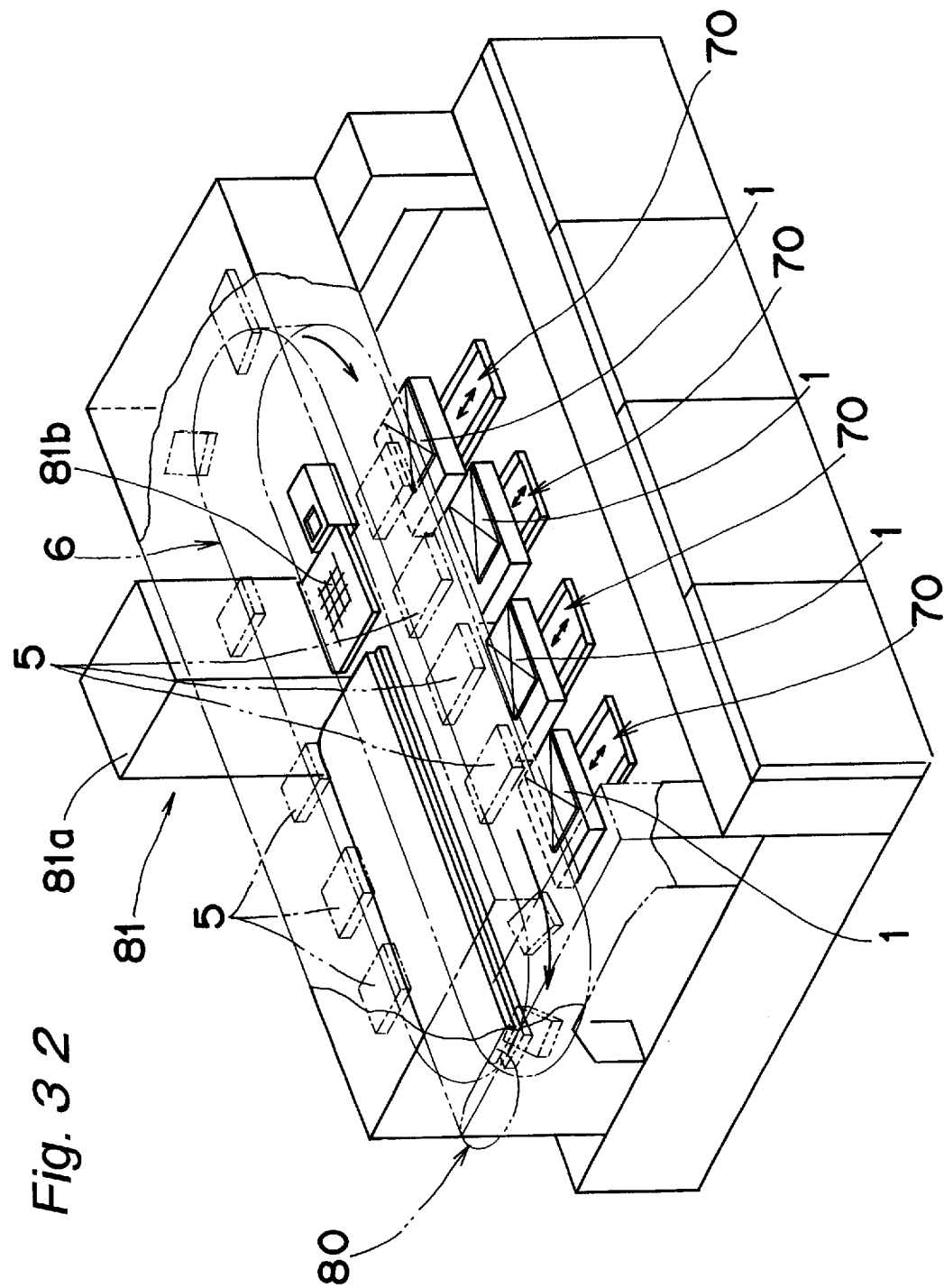
FIG. 32 is a schematic perspective view of a component mounting apparatus according to still another embodiment of the present invention, based on the component mounting apparatus of FIG. 1, explaining a state in which four Y-direction board positioning devices, a number of fixed component supply cassettes and one fixed component supply tray device are arranged along the travel track and a number of heads are traveling along the travel track.

FIG. 32 is a schematic perspective view of a component mounting apparatus according to still another embodiment of the present invention, based on the component mounting apparatus of FIG. 1, explaining a state in which four Y-direction board positioning devices 70, a number of fixed component supply cassettes 80, and one fixed component supply tray device 81 are arranged along the travel track 6 and a number of heads 5 are traveling along the travel track 6.

Figure 33:
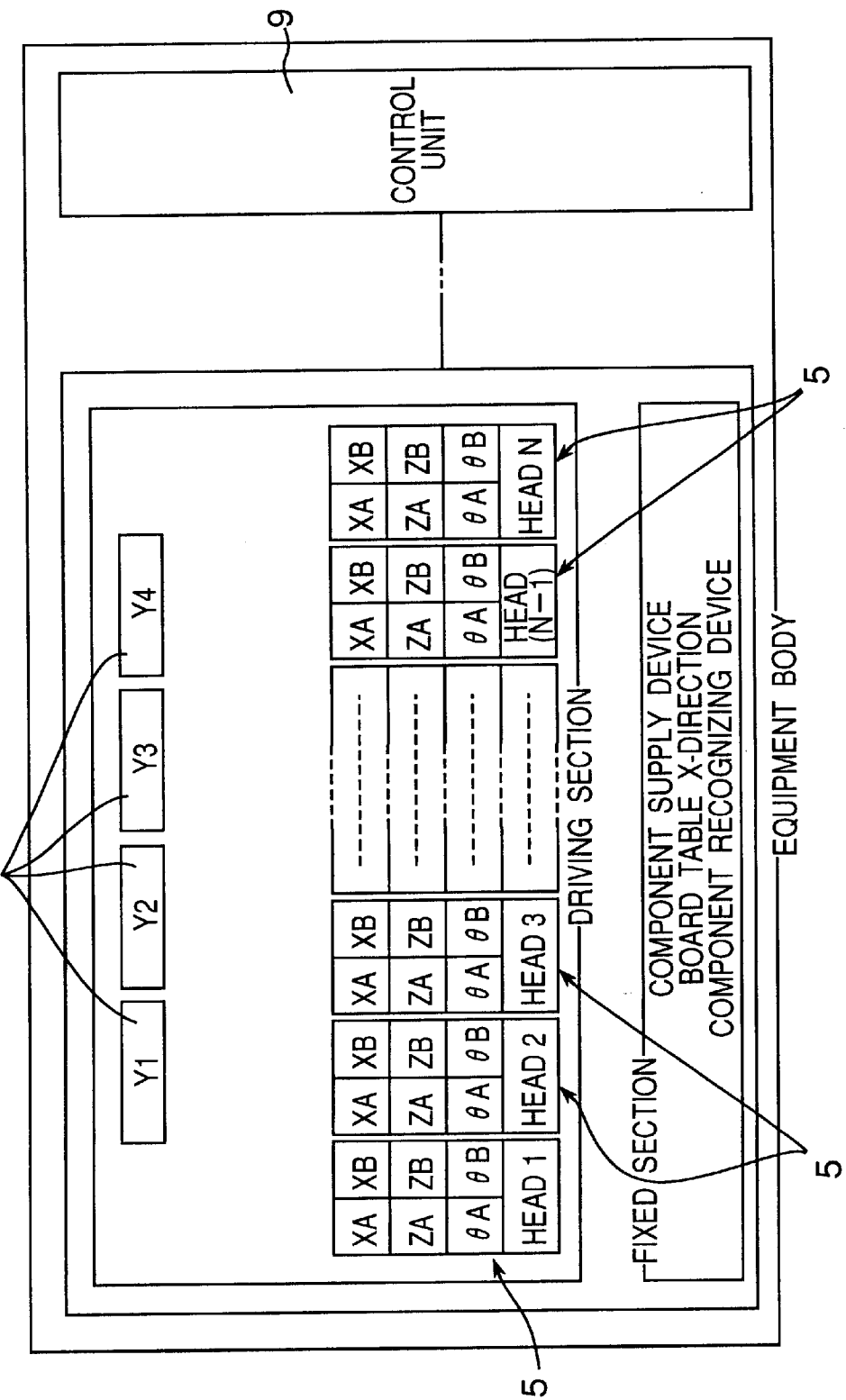
FIG. 33 is a block diagram of the control section of the component mounting apparatus of FIG. 32.

FIG. 33 is a block diagram of the control section of the component mounting apparatus of FIG. 32. The control section has a construction similar to that of FIG. 13, in which "Y1" through "Y4" are the control parts of four Y-direction board positioning devices 70 and the control part of "N-FEED, PUSH UP-AND-DOWN" is not provided.

Figure 34:
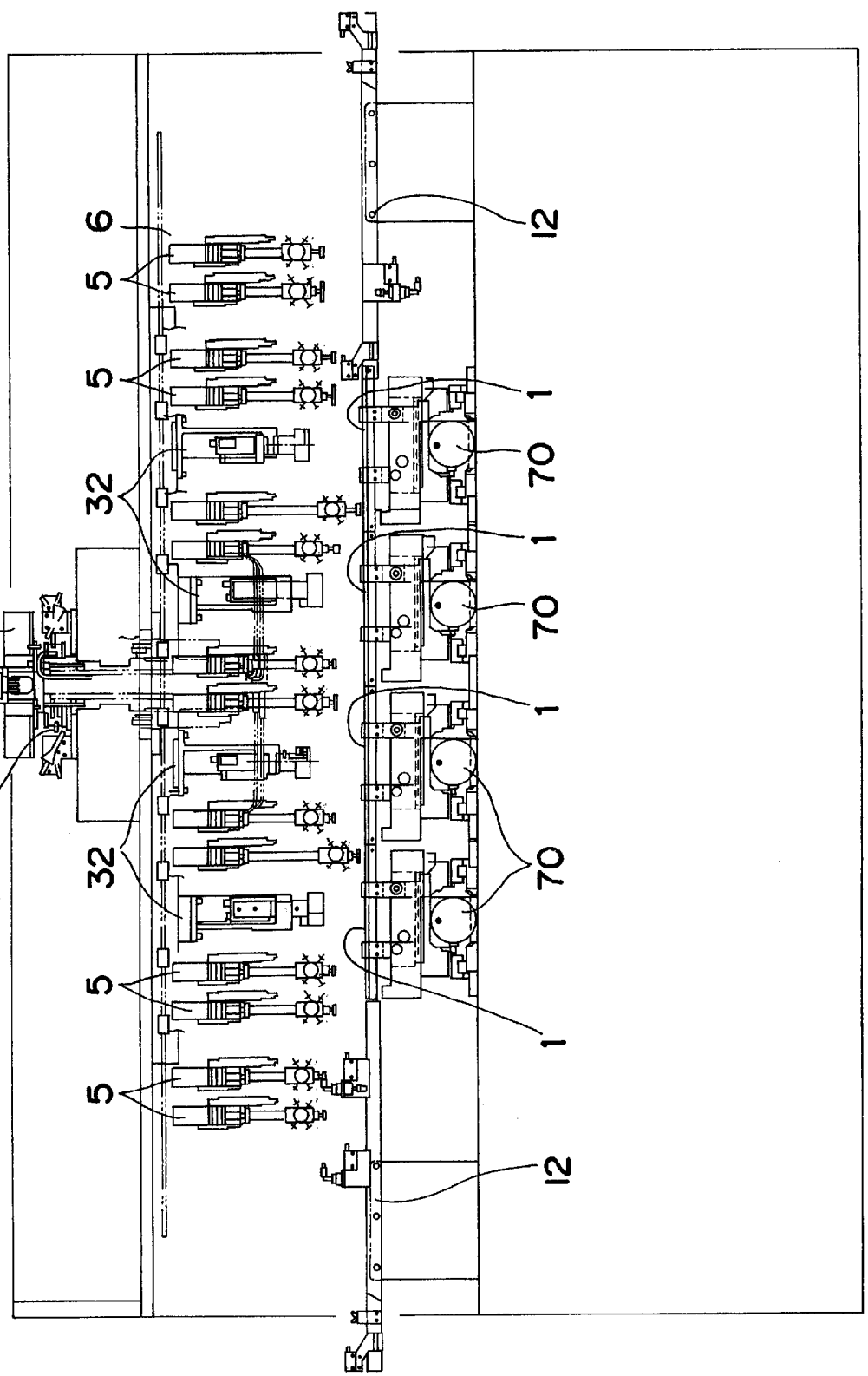
FIG. 34 is a front view showing the sections of four Y-direction board positioning devices in a state in which each head is provided with two component suction nozzles in the component mounting apparatus of FIG. 32.

FIG. 34 is a front view showing the sections of four Y-direction board positioning devices 70 in a state in which each head 5 is provided with two component suction nozzles 3 in the component mounting apparatus of FIG. 32.

Figure 35:
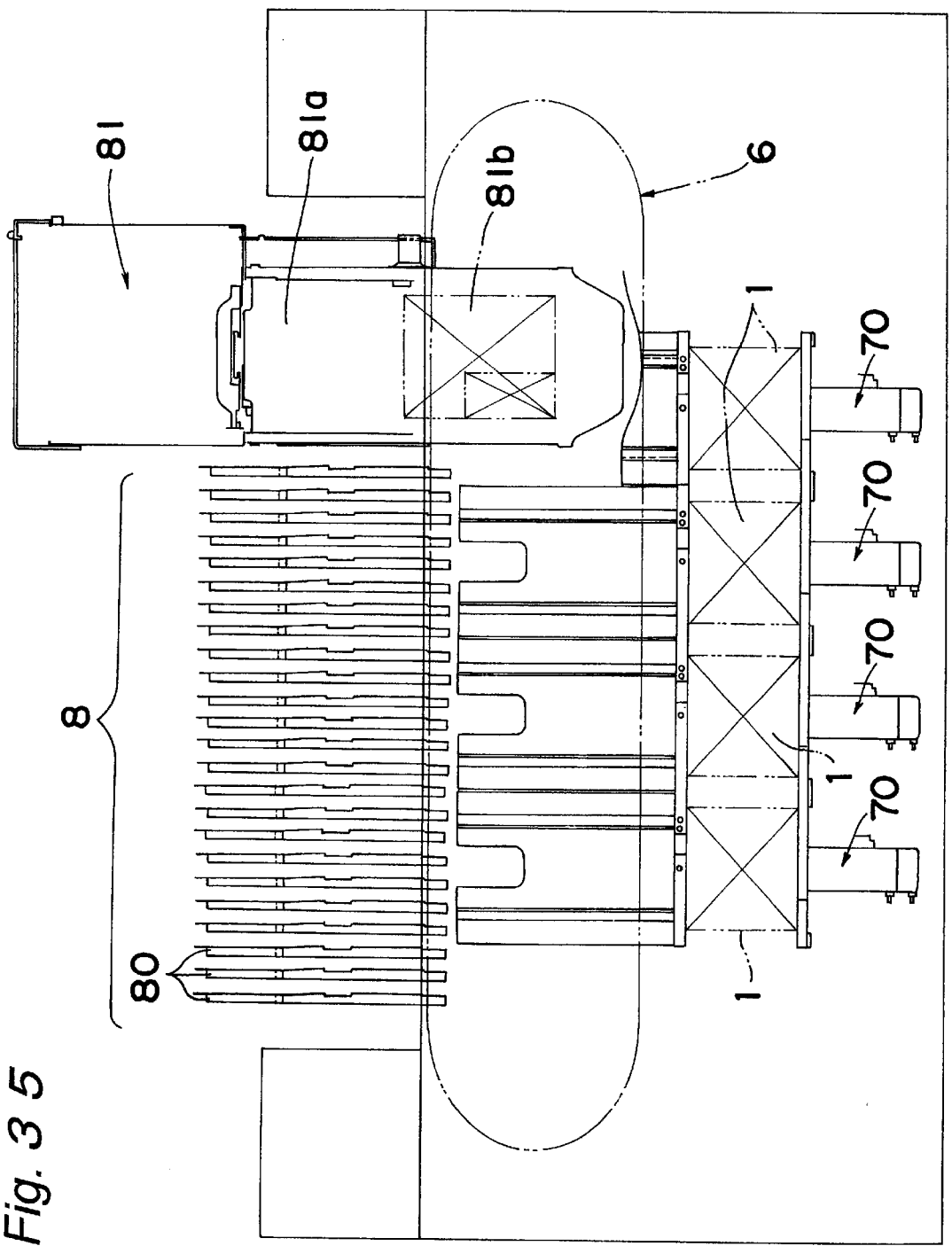
FIG. 35 is a schematic plan view of the component mounting apparatus of FIG. 32, explaining a state in which four Y-direction board positioning devices, a number of fixed component supply cassettes and one fixed component supply tray device are arranged along the travel track.

FIG. 35 is a schematic plan view of the component mounting apparatus of FIG. 32, explaining a state in which four Y-direction board positioning devices 70, a number of fixed component supply cassettes 80, and one fixed component supply tray device 81 are arranged along the travel track 6.

Figure 36:
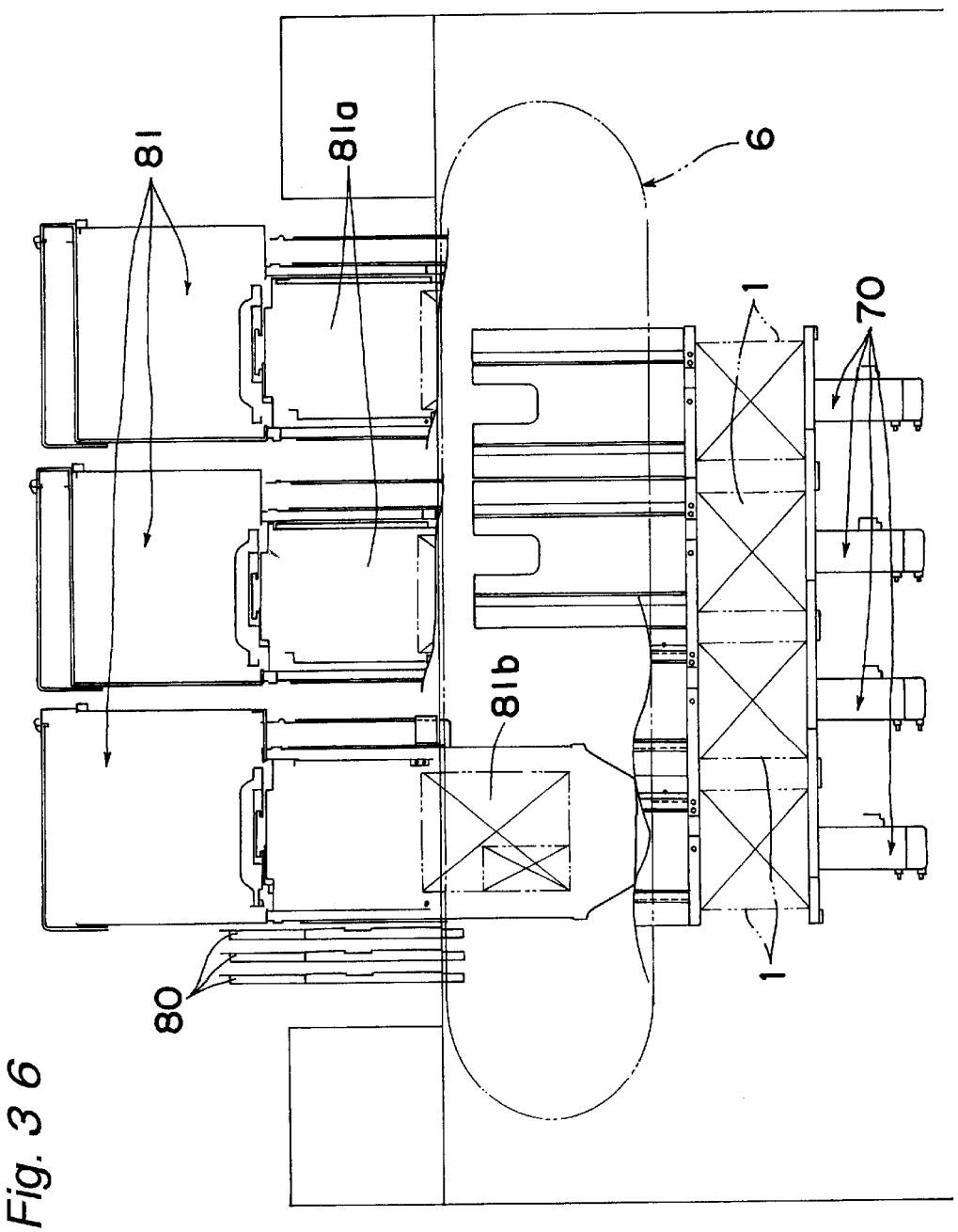
FIG. 36 is a schematic plan view of a component mounting apparatus according to yet another embodiment of the present invention, based on the component mounting apparatus of FIG. 32, explaining a state in which four Y-direction board positioning devices, three fixed component supply cassettes and three fixed component supply tray devices are arranged along the travel track.

FIG. 36 is a schematic plan view of a component mounting apparatus according to yet another embodiment of the present invention, based on the component mounting apparatus of FIG. 32, explaining a state in which four Y-direction board positioning devices 70, three fixed component supply cassettes 80, and three fixed component supply tray devices 81 are arranged along the travel track 6.

Figure 37:
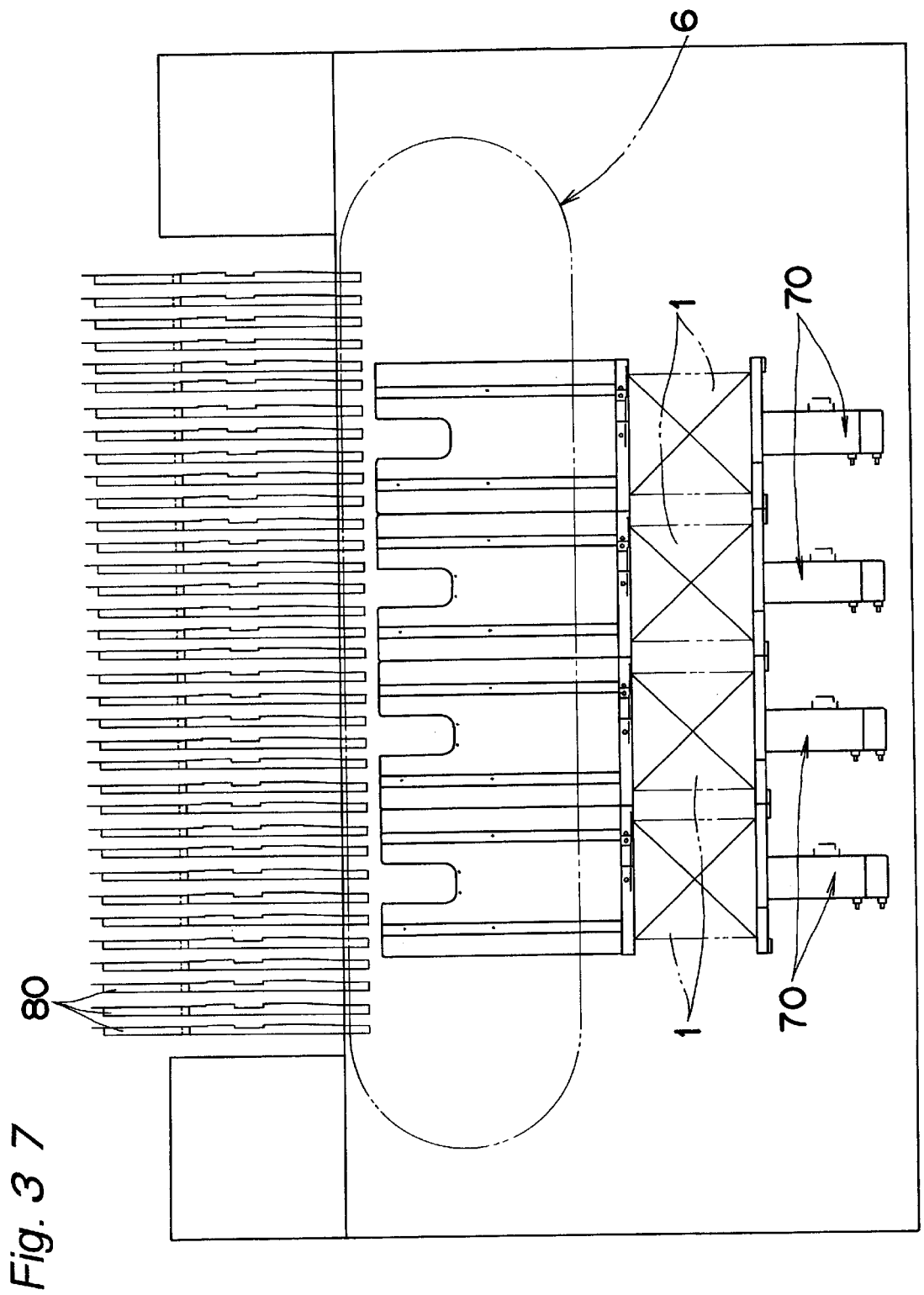
FIG. 37 is a schematic plan view of a component mounting apparatus according to still another embodiment of the present invention, based on the component mounting apparatus of FIG. 32, explaining a state in which four Y-direction board positioning devices and a number of fixed component supply cassettes are arranged along the travel track.

FIG. 37 is a schematic plan view of a component mounting apparatus according to still another embodiment of the present invention, based on the component mounting apparatus of FIG. 32, explaining a state in which four Y-direction board positioning devices 70 and a number of fixed component supply cassettes 80 are arranged along the travel track 6.

Figure 38:
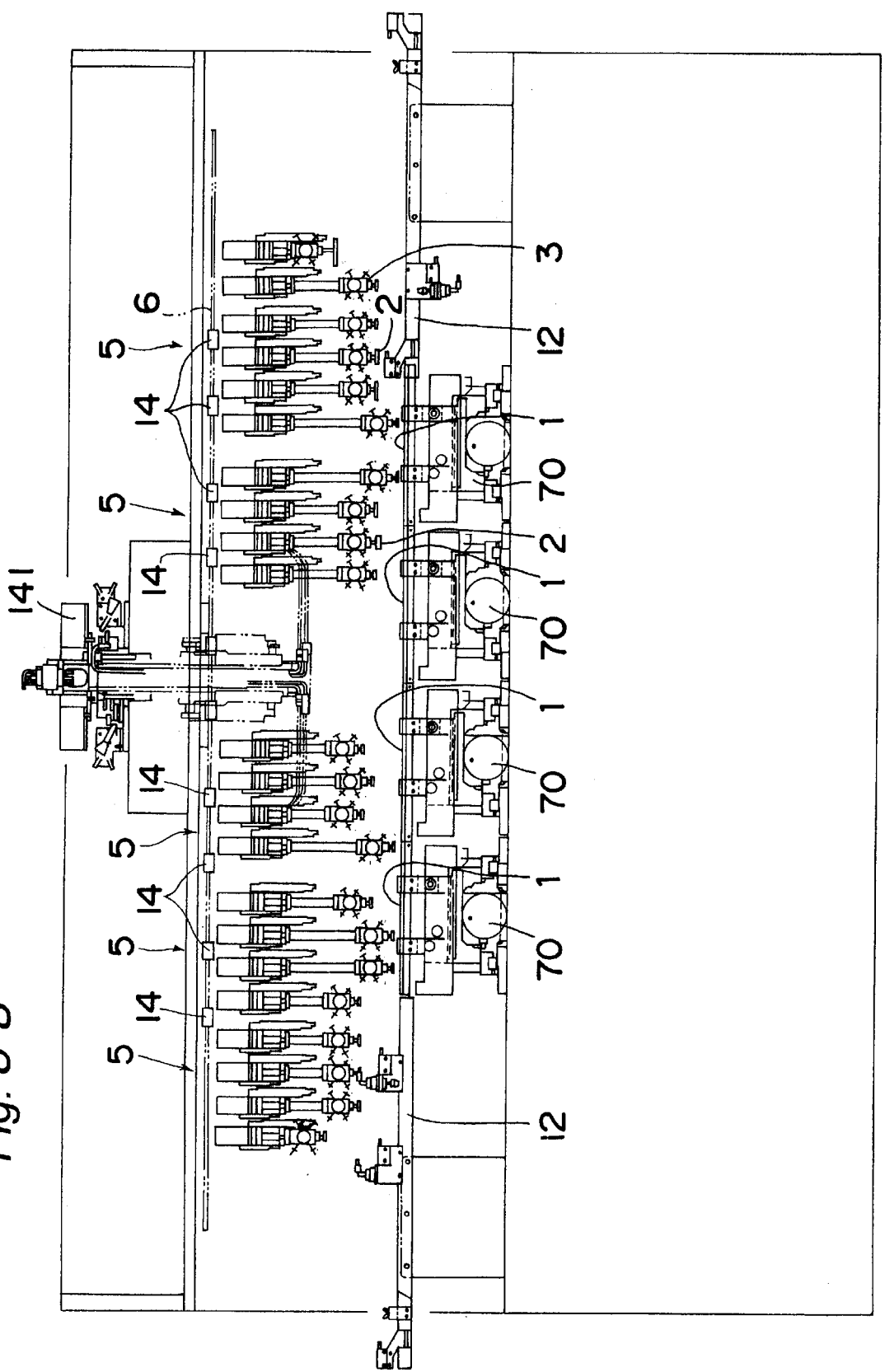
FIG. 38 is a schematic front view of a component mounting apparatus according to still another embodiment of the present invention, based on the component mounting apparatus of FIG. 32, showing the sections of four Y-direction board positioning devices in a state in which each head is provided with four component suction nozzles.

FIG. 38 is a schematic front view of a component mounting apparatus according to still another embodiment of the present invention, based on the component mounting apparatus of FIG. 32, showing the sections of four Y-direction board positioning devices 70 in a state in which each head 5 is provided with four component suction nozzles 3.

Figure 39:
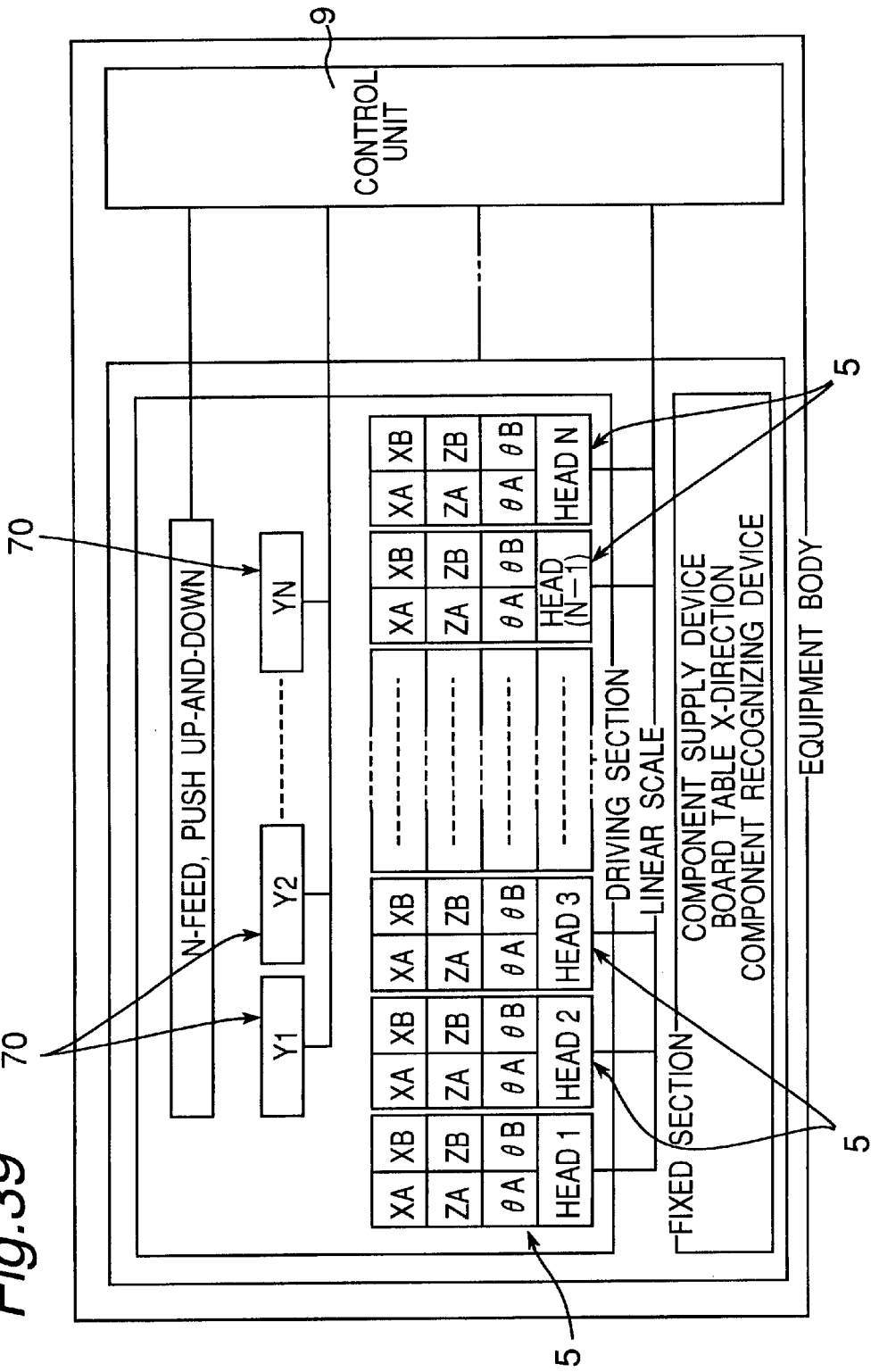
FIG. 39 is a block diagram of the control section of the component mounting apparatus of FIG. 38.

FIG. 39 is a block diagram of the control section of the component mounting apparatus of FIG. 38, in which "Y1" through "YN" are the control parts of N Y-direction board positioning devices 70.

Figure 40:
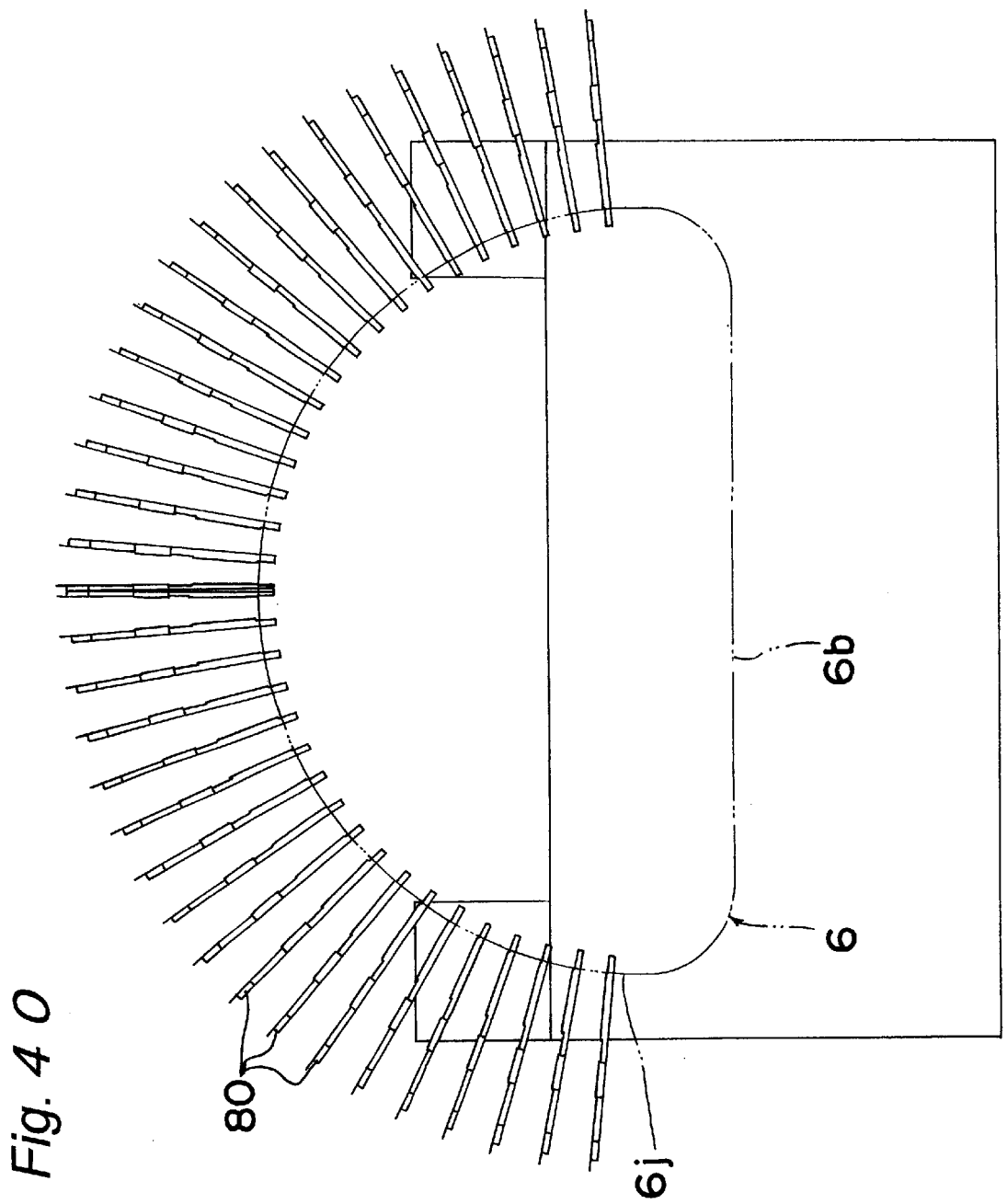
FIG. 40 is a schematic plan view of a component mounting apparatus according to still another embodiment of the present invention, wherein the travel track is constructed of one straight portion in which a board positioning device for positioning the board is arranged and a curved portion in which a number of fixed component supply cassettes are arranged.

FIG. 40 is a schematic plan view of a component mounting apparatus according to still another embodiment of the present invention, wherein the travel track 6 is constructed of one straight portion 6b in which a board positioning device 7 for positioning the board 1 is arranged and a curved portion 6j in which a number of fixed component supply cassettes 80 are arranged. The component supply cassette 80 is not always required to be arranged in the straight portion of the travel track 6 and may be arranged in the curved portion 6j as shown in FIG. 40.

Figure 41:
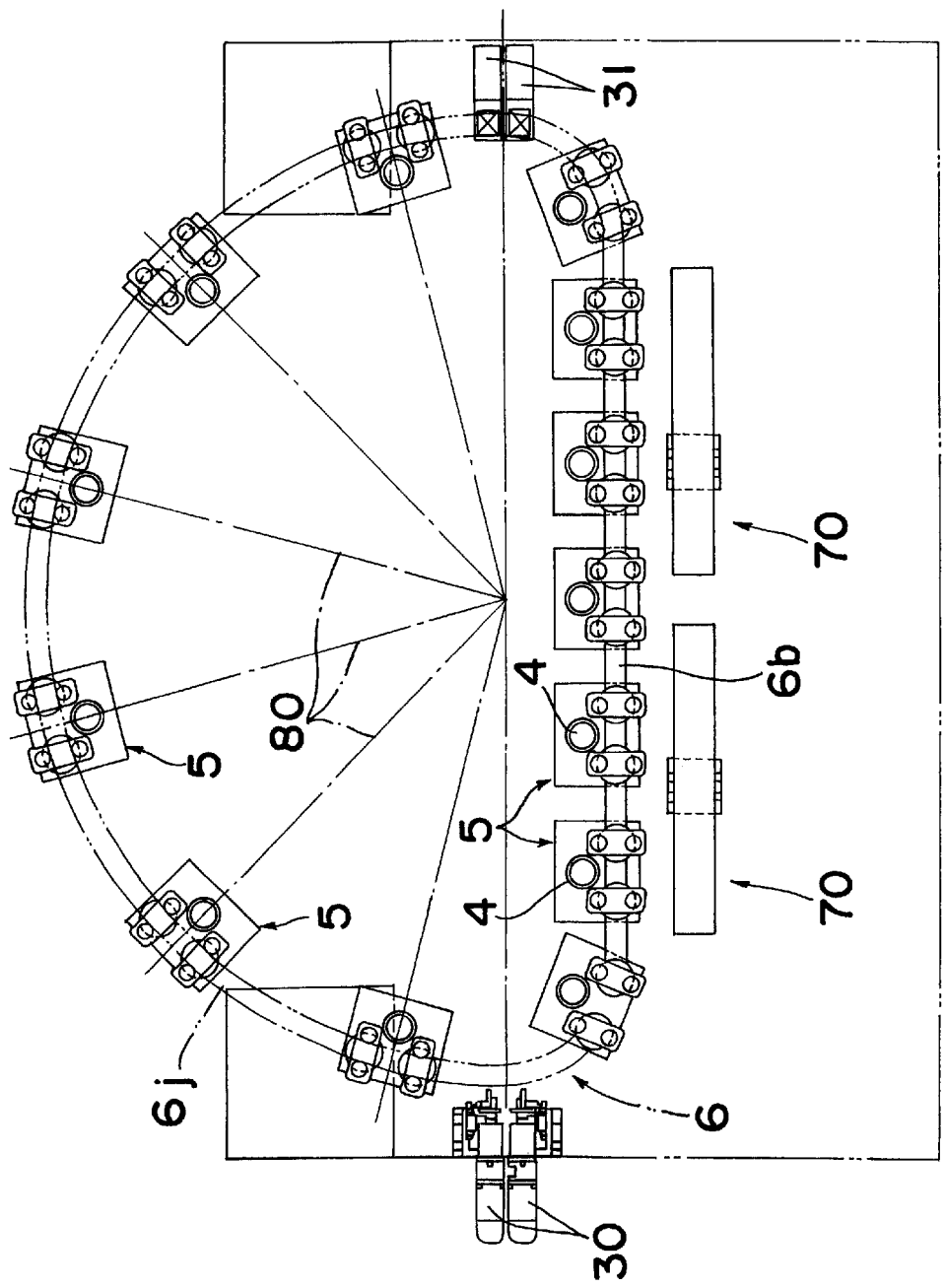
FIG. 41 is a schematic plan view of the component mounting apparatus of FIG. 40, in which each head is provided with two component suction nozzles.

FIG. 41 is a schematic plan view of the component mounting apparatus of FIG. 40, in which each head 5 is provided with two component suction nozzles 3.

Figure 42:
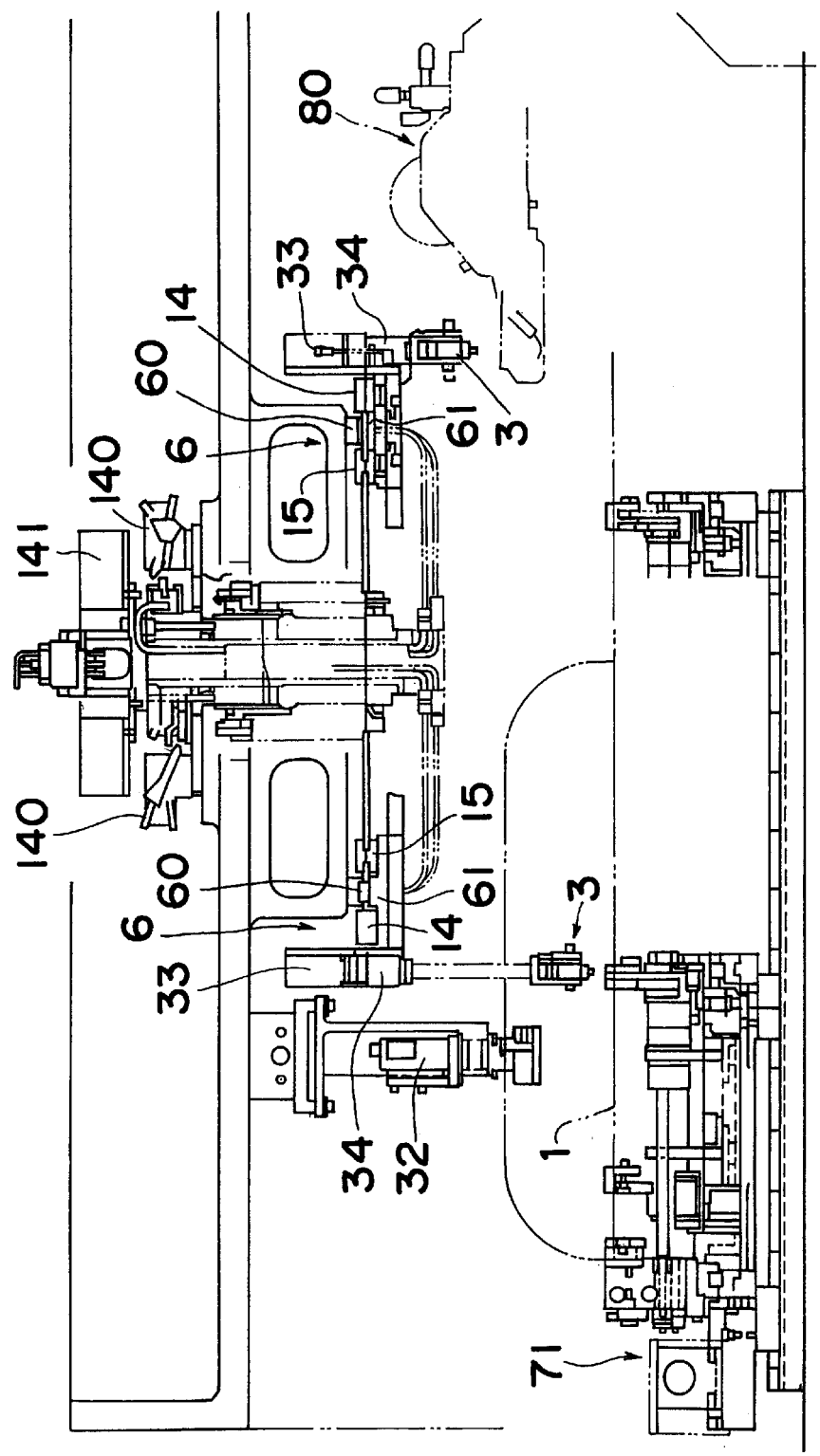
FIG. 42 is a schematic side view of a component mounting apparatus according to still another embodiment of the present invention, in which each head is made to travel by a direct drive linear motor instead of a self-propelling motor.

FIG. 42 is a schematic side view of a component mounting apparatus according to still another embodiment of the present invention, in which each head 5 is made to travel by a direct drive linear motor 61 instead of a self-propelling motor 4. That is, each head 5 is provided with the direct drive linear motor 61, and magnets 60 are provided inside the rail body 6g located on the component mounting apparatus fixing side, whereby each head 5 is made to be self-propelled by the linear motor 61.

Figure 43:
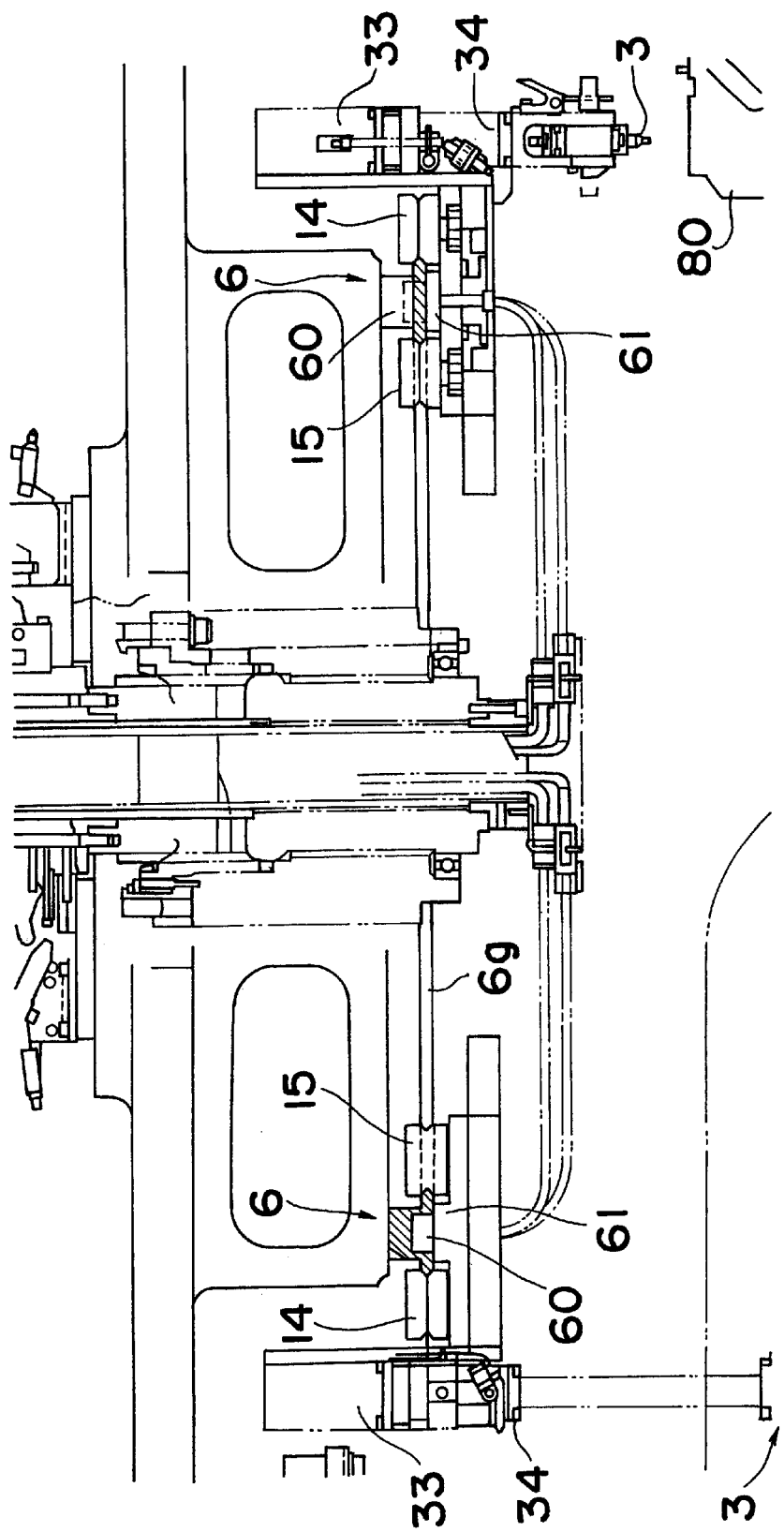
FIG. 43 is an enlarged view of part of FIG. 42.

FIG. 43 is an enlarged view of part of FIG. 42.

Figure 44:
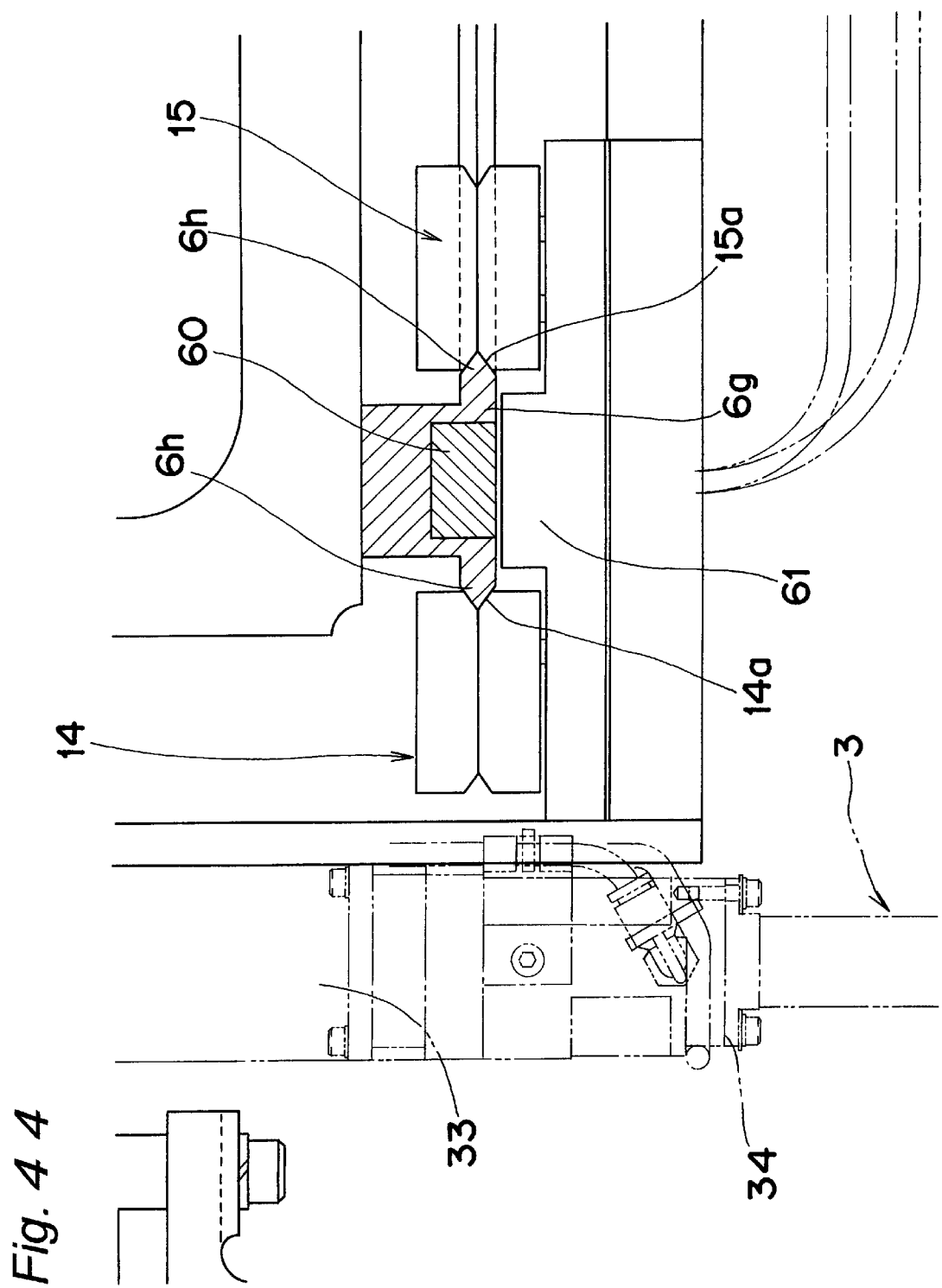
FIG. 44 is an enlarged view of a linear motor section of FIG. 42.
Figure 45:
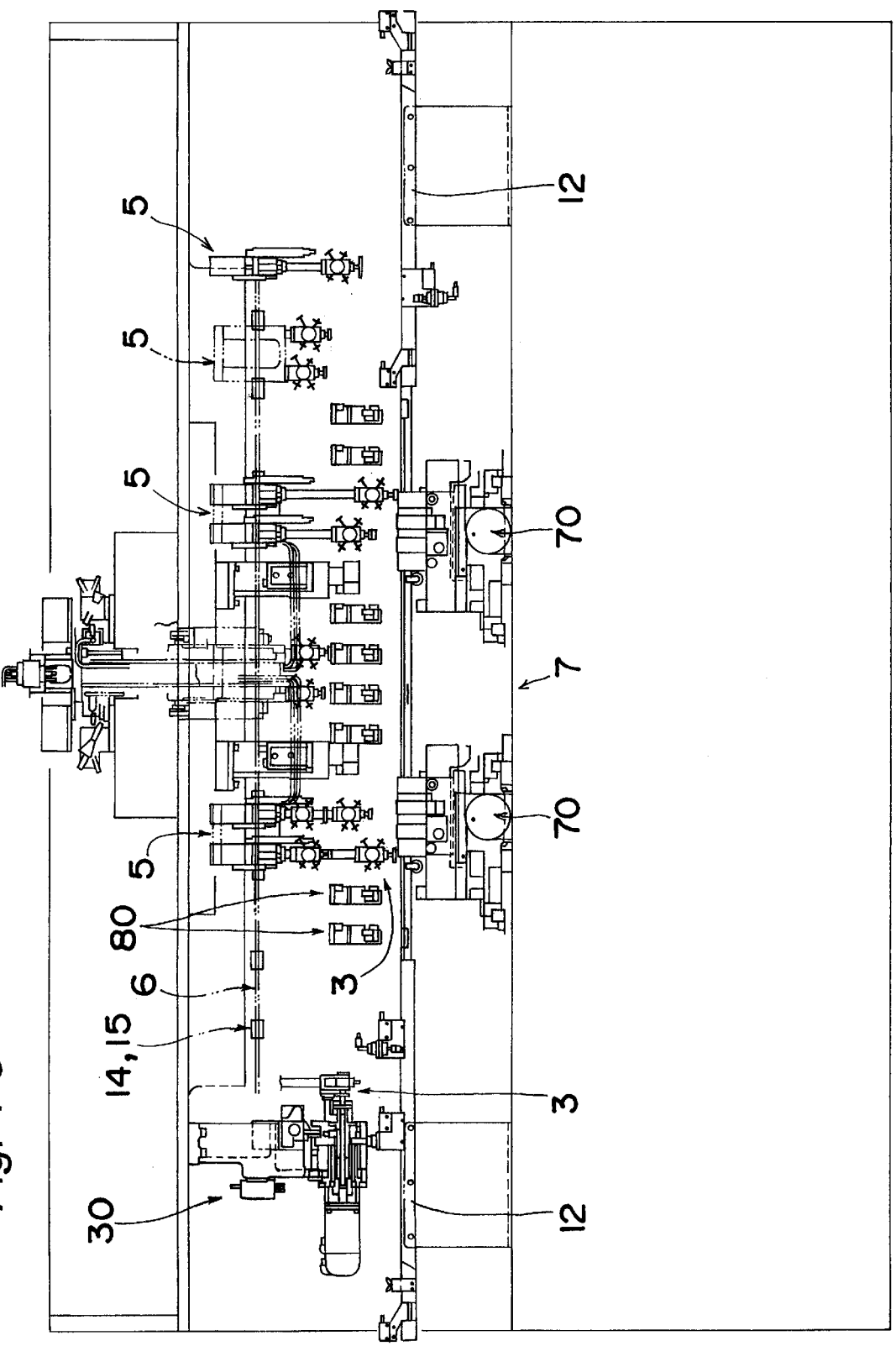
FIG. 45 is a front view showing the sections of two Y-direction board positioning devices of the component mounting apparatus of FIG. 3 including two nozzle body switchover devices.
Figure 46:
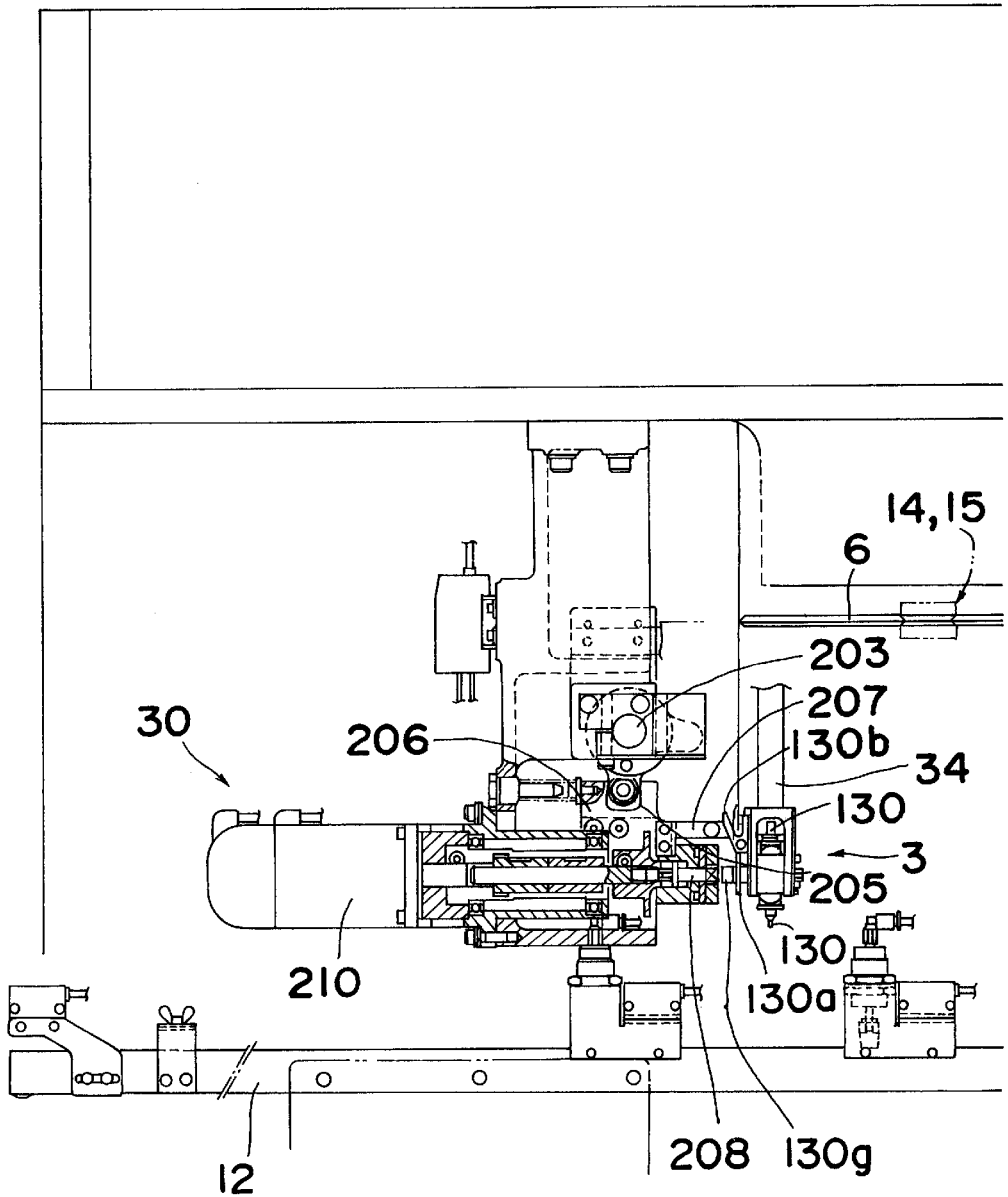
FIG. 46 is an enlarged view of part of FIG. 45.
Figure 47:
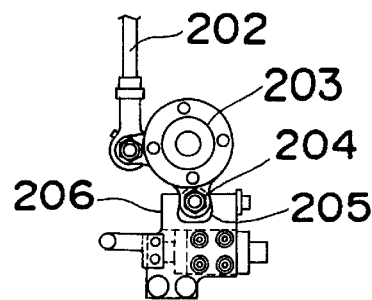
FIG. 47 is an enlarged view of part of FIG. 46.
Figure 48:
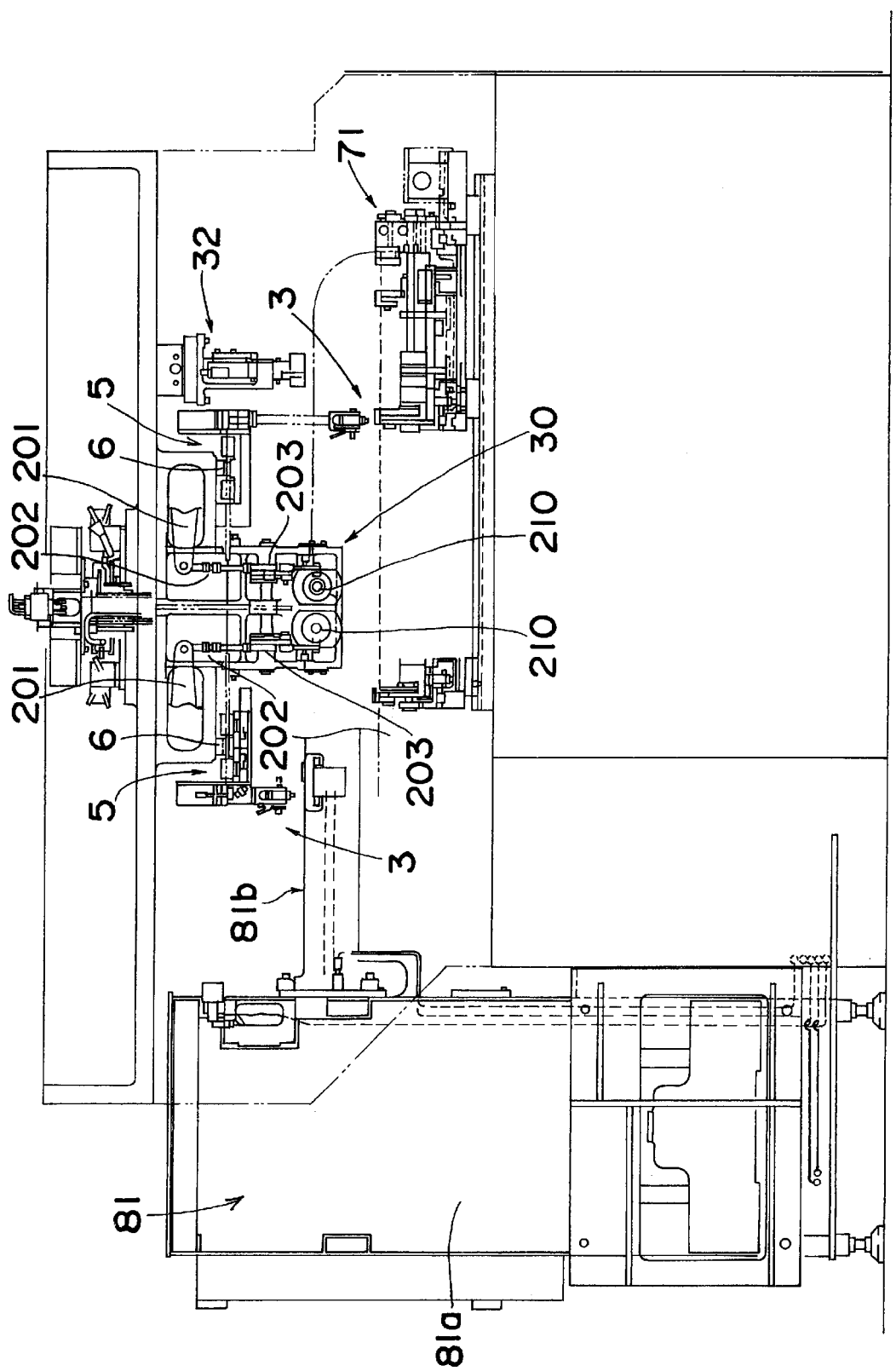
FIG. 48 is a left-hand side view of the component mounting apparatus of FIG. 45.
Figure 49:
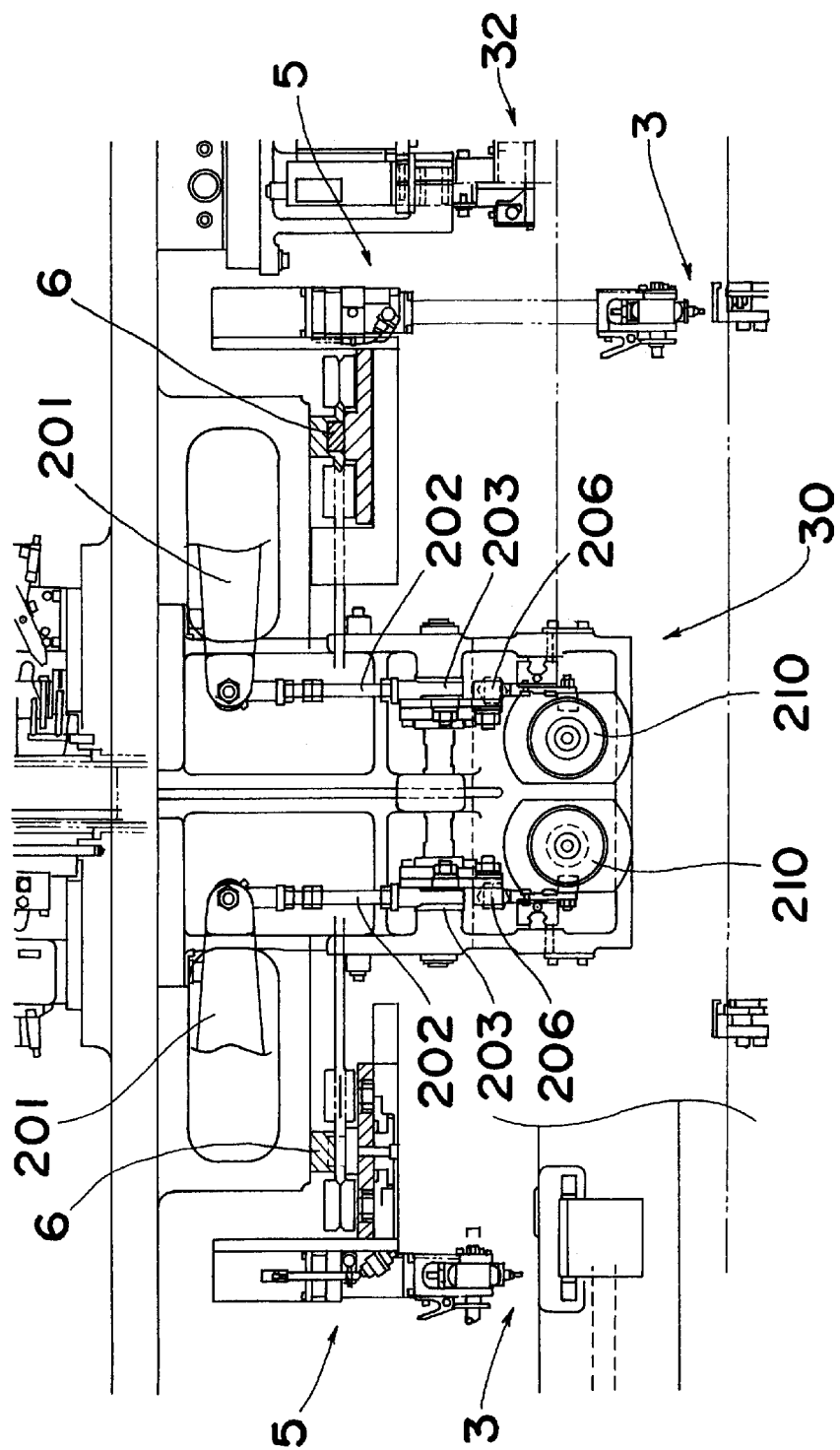
FIG. 49 is an enlarged view of part of FIG. 48.

FIG. 44 is an enlarged view of a linear motor section of FIG. 42.

Figure 51:
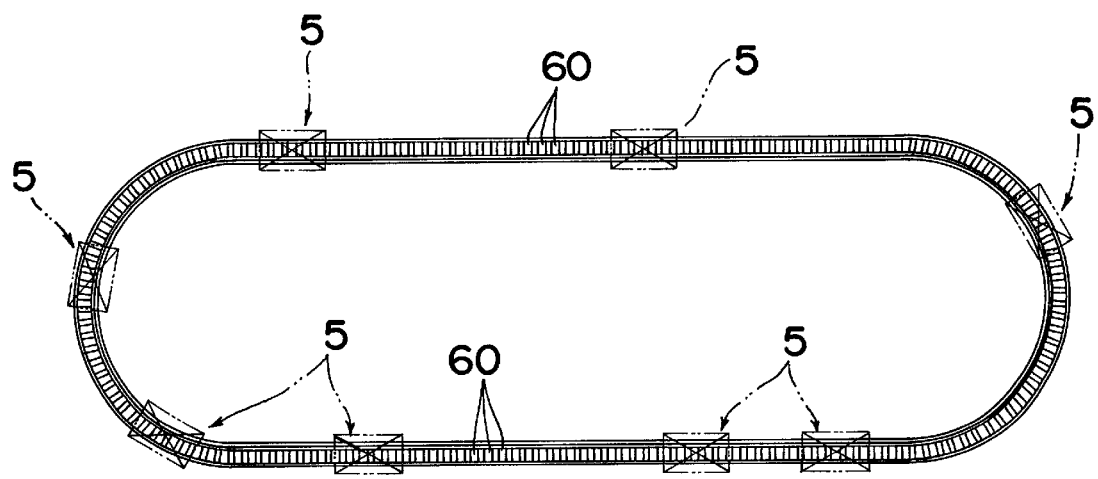
FIG. 51 is a view showing a travel track in a state in which magnets are arranged inside the rail body in the component mounting apparatus of FIG. 42.

FIG. 51 is a view showing a travel track in a state in which the magnets 60 are arranged inside the rail body 6g.

As described above, by making each head 5 self-propelled by the linear motor 61, noises are reduced further than the drive device of the aforementioned embodiments, and no lubricating oil is needed to allow the apparatus to be maintenance free. This can also increase the cleanness of the whole apparatus and increase the positioning accuracy to an error of, for example, about 1 μm.

According to the conventional rotary type high-speed mounting apparatus, the motor for rotating the rotary head is arranged in the upper portion of the mounting apparatus, and a component supply device having a weight of greater than, for example, 100 kg moves, and this has been the reasons for increasing noises and vibrations. In contrast to this, according to the aforementioned various embodiments, the motor serving as an example of the drive device for driving each head is not required to be arranged in the upper portion of the mounting apparatus, and the drive device for driving each head is only required to be provided for each head 5 for traveling along the track yard type travel track 6. The upper portion of the mounting apparatus is merely required to be provided with the doughnut-shaped drive circuit housing section 141 for driving the component suction nozzle θ-turn motors and the voice coil motors for movement in the Z-axis direction. Therefore, by comparison with the conventional case, the structure of the upper portion of the mounting apparatus can be much simplified, and the noises and vibrations of the whole apparatus can be remarkably reduced.

Furthermore, as shown in FIG. 16, FIG. 29 through FIG. 32, FIG. 35 through FIG. 37, and FIG. 40, the component supply device 8 can also be used in a fixed state without being moved each time to the component outlet position of the component suction nozzle. Therefore, the component suction work can be executed at a speed equivalent to that of the conventional high-speed mounting apparatus, allowing the productivity to be further improved. There is no need to move the component supply cassette and so on at high speed, and therefore, the vibrations and noises can be remarkably reduced and the reliability of the equipment can be improved. Furthermore, the component supply device does not move, and therefore, the operator has no chance to erroneously touch the component supply device in moving operation, by which the safety can be further improved. There is no need to consider the range of movement of the component supply device, and this can reduce the occupation area of the equipment and also improve the productivity per equipment area. For example, in contrast to the occupation area of 8.2 m² of the conventional rotary type high-speed mounting apparatus, the component mounting apparatus according to each of the aforementioned embodiments having similar specifications has an occupation area of 3.9 m², meaning that the occupation area can be made about one half or less. That is, the productivity per unit area of installation of the component mounting apparatus can be improved. For example, assuming that the component mounting apparatus has a size of about 1740 mm×2300 mm, if the traveling speed of each head 5 for traveling along the travel track 6 is 2000 to 2500 mm/sec and mounting is executed one point per block, then there can be mounted a maximum of 90000 components in excess of a maximum of 50000 components per hour in the conventional case.

If the Y-direction board positioning device 70 is used as the board positioning device 7, then the board positioning work only in the Y-direction perpendicular to the board conveyance direction is needed, and the adjustment in the mounting position in the X-direction of the board 1 can be executed by adjusting the position of each head 5 in the straight portion 6b of the travel track 6. Therefore, the board positioning work can be simplified and executed in a short time, and the structure of the board positioning device can be simplified. That is, the board 1 merely requires to be moved only in one axial direction intersecting the travel track 6 by the board positioning device, and there is no need to move the board 1 in two axial directions that are perpendicular to each other. Accordingly, the board positioning device can be reduced in cost and weight, and this allows the board 1 to be driven at high speed and allows the mounting tact to be further reduced.

As the component supply device 8, not only the component supply cassette 80 but also the component supply tray device 81 can be employed, and therefore, the degree of freedom of the component supply form can be increased regardless of the component suction and mounting work executed at high speed. In contrast to this, the conventional high-speed mounting apparatus has not been able to employ the component supply tray device.

Figure 58:
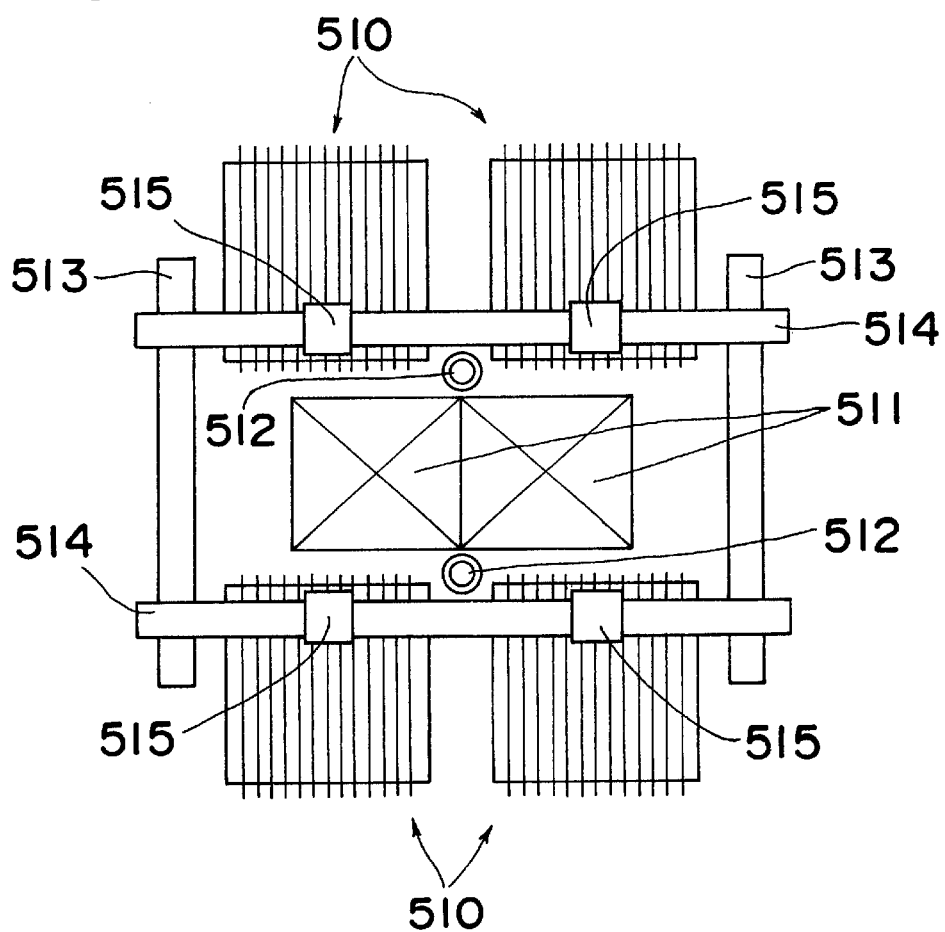
FIG. 58 is an explanatory view of a conventional orthogonal robot type mounting apparatus.
Figure 59:
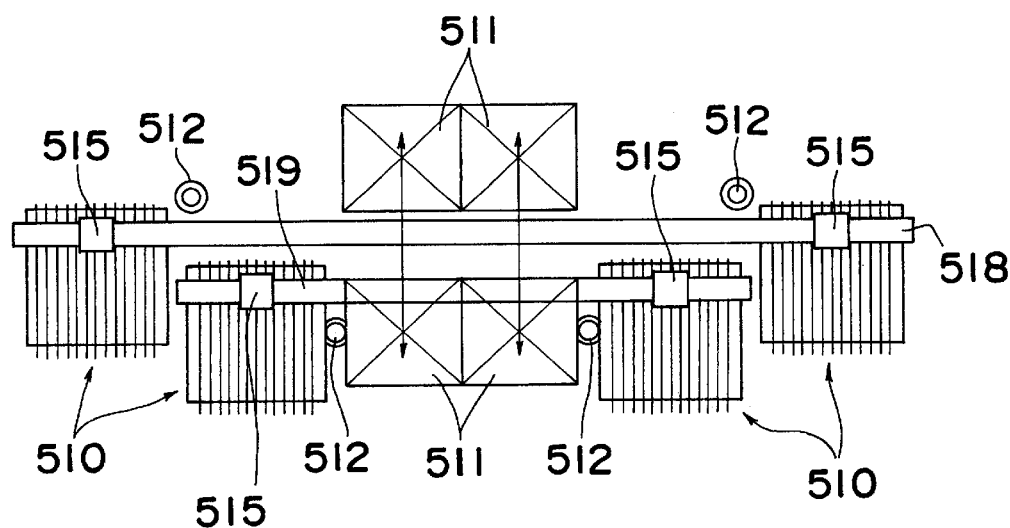
FIG. 59 is an explanatory view of another conventional orthogonal robot type mounting apparatus.
Figure 60:
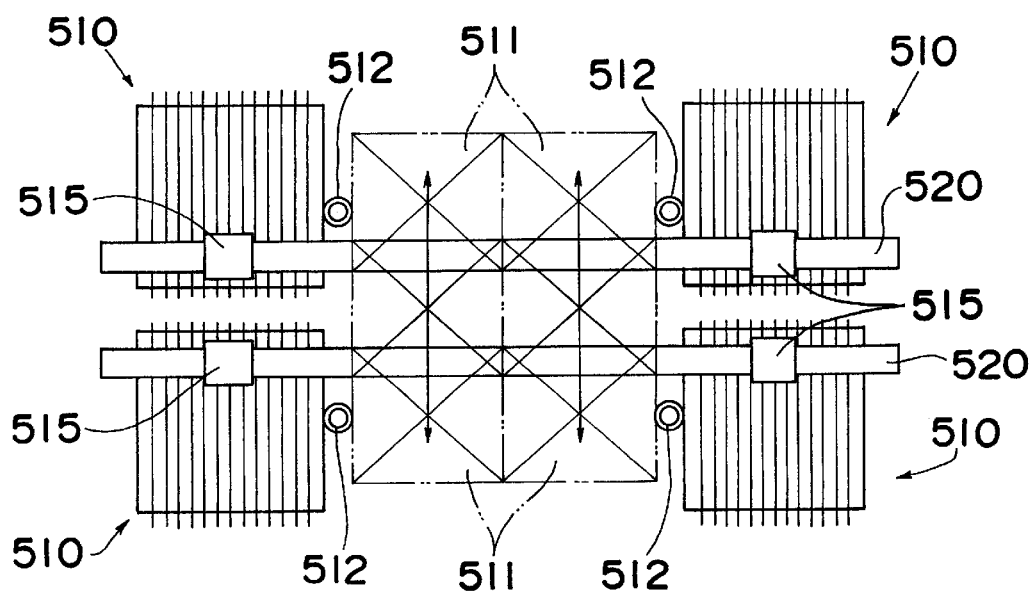
FIG. 60 is an explanatory view of yet another conventional orthogonal robot type mounting apparatus.
Figure 61:
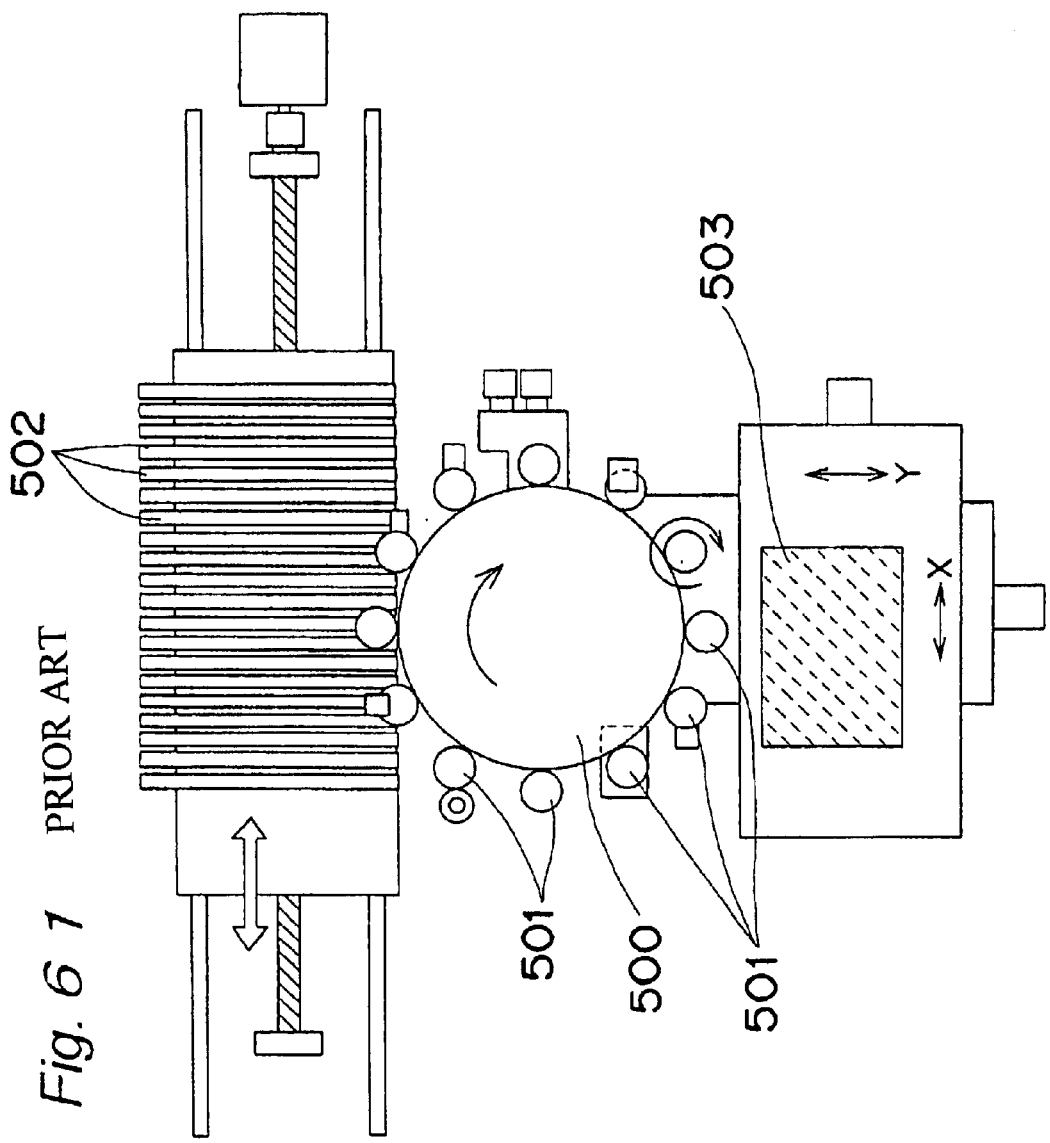
FIG. 61 is a schematic plan view of a prior art high-speed mounting apparatus.

The travel track 6 can be made to be a closed-loop of an arbitrary shape, and the component supply section CF and the board positioning section CP can be arranged in arbitrary positions of the travel track 6. That is, according to the conventional mounting apparatus, as shown in FIG. 58 through FIG. 60, the positions of the component supply section CF and the board positioning section CP have been limited as a matter of course due to the construction of the apparatus, and the sections have not been able to be arranged in positions other than the above-mentioned positions. However, according to the present embodiments, the component supply section CF and the board positioning section CP can be arranged in arbitrary positions of the travel track 6, e.g., in an arbitrary curved portion when no straight portion exists or in a straight portion or a curved portion other than the straight portion when the straight portion exists. Therefore, according to the mounting apparatus of the present embodiments, the shape of the travel track 6 can be arbitrarily designed according to the installation space of the mounting apparatus. In addition, the component supply section CF and the board positioning section CP can be arranged in arbitrary positions of the travel track 6, and this allows the degree of freedom of design to be remarkably improved and also allows the productivity per unit area to be increased.

Figure 56:
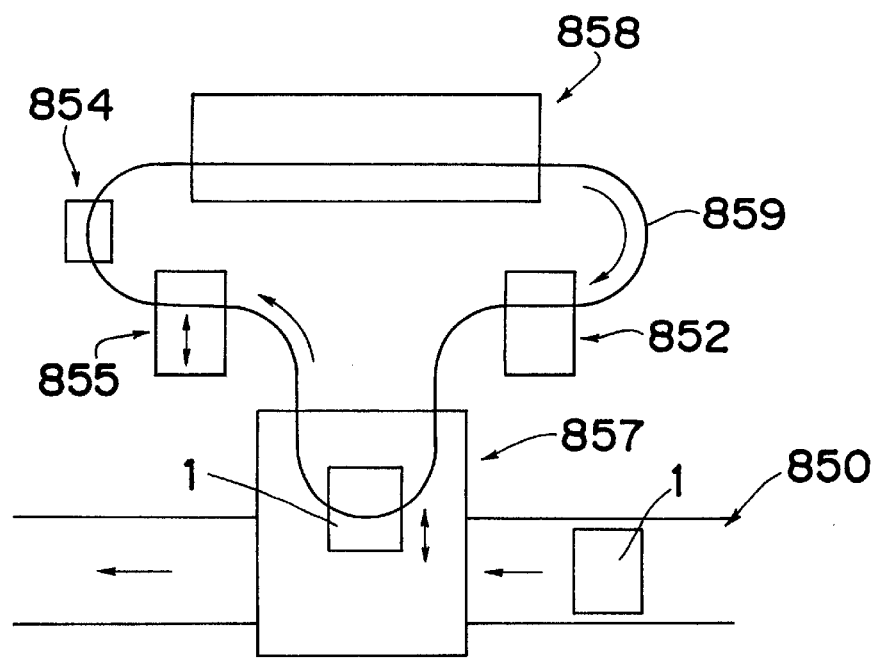
FIG. 56 is an explanatory view of a component mounting apparatus according to still another embodiment of the present invention, showing a layout of a component supply device, a board positioning device, and the like on a roughly T-figured travel track.

For example, if a roughly T-figured travel track 859 is provided according to the installation space of the mounting apparatus, as shown in FIG. 56, then a component supply device 858, a component recognizing device 852, a board positioning device 857, a nozzle switchover device 855, and a nozzle tip inspecting device 854 may be arranged in the illustrated positions. It is to be noted that the reference numeral 850 denotes a board conveyance route of the board conveyance device of the board positioning device 857.

The travel track 6 has a closed-loop shape and the component supply device 8, the component recognizing device 31, and the board positioning device 7 are arranged along the travel track 6, and the plurality of self-propelled system heads 5 are independently driven. Therefore, the processes of a component suction process, a posture and position distance-measuring process that is the component recognizing process (by means of a recognition camera or the like), a component suction posture correcting process, a component mounting process, and so on can be concurrently processed by the plurality of self-propelled system heads 5, by which the productivity can be improved. In contrast to this, the orthogonal robot type mounting equipment shown in FIG. 58 through FIG. 60, which can execute concurrent processing by alternately operating a plurality of heads 515, presumably has the cost increasing factors and the issues of an increase in floor occupation area and the like as exemplified by the drawback that there is needed a plurality of recognition devices 512 indicated by the double circle, i.e., portions for executing the recognition operation for distance-measuring the component posture. This leads to the existence of a limitless number of movement routes of the heads 515 connecting a plurality of component supply devices 510 to a plurality of board positioning devices 511. In order to efficiently execute the component suction, recognition, and mounting operations, it is required to arrange the recognition devices 512 in or in the vicinity of the movement routes extending at least from the component supply devices 510 to the board positioning devices 511, and this means that recognition devices 512 cannot help being arranged in a plurality of places as a matter of course. It is to be noted that the reference numerals 513 and 514 denote a Y-axis robot and an X-axis robot, respectively, constituting an orthogonal robot for moving the heads 515 in the XY-directions in FIG. 58. In FIG. 58, the component recognition devices 512 are each required to be arranged between adjacent two component supply devices 510, and a total of two devices 512 are needed. In FIG. 59, the reference numerals 518 and 519 are X-axis robots for independently moving the heads 515 in the X-direction. In this example, the board positioning devices 511 are independently moved in the Y-axis direction. In FIG. 59, the component recognition devices 512 are required to be arranged between the component supply devices 510 and the board positioning devices 511, and a total of four devices 512 are needed. In FIG. 60, the reference numeral 520 denotes an X-axis robot for independently moving the heads 515 in the X-direction. In this example, the board positioning devices 511 are independently moved in the Y-axis direction. In FIG. 60, the component recognition devices 512 are required to be arranged between the component supply devices 510 and the board positioning devices 511, and a total of four devices 512 are needed.

In contrast to this, the present embodiments, each of which has only one movement route of each head 5 extending from the component supply device 8 to the board positioning device 7, can execute component recognition by means of the component suction nozzles 3 of all the heads 5 even if only one component recognizing device 31 is provided. Therefore, the concurrent processing of the aforementioned component suction, component recognition, component mounting, and the like can be executed, and this allows the devices to be reduced in number and also allows the installation space to be reduced.

It is to be noted that the present invention is not limited to the aforementioned embodiments and is able to be implemented in a variety of forms.

For example, the travel track 6 is permitted to be a closed-loop of an arbitrary shape. Although a straight portion should preferably be provided taking easiness in arranging the component supply device or easiness in arranging the board positioning device into consideration, no straight portion may exist. That is, if the component supply device or the board positioning device is arranged in the straight portion of the travel track 6, then the positioning and the control operation of the device are easy to execute. However, taking the compacting of the whole apparatus and the like into consideration, the straight portion may be eliminated.

Figure 52:
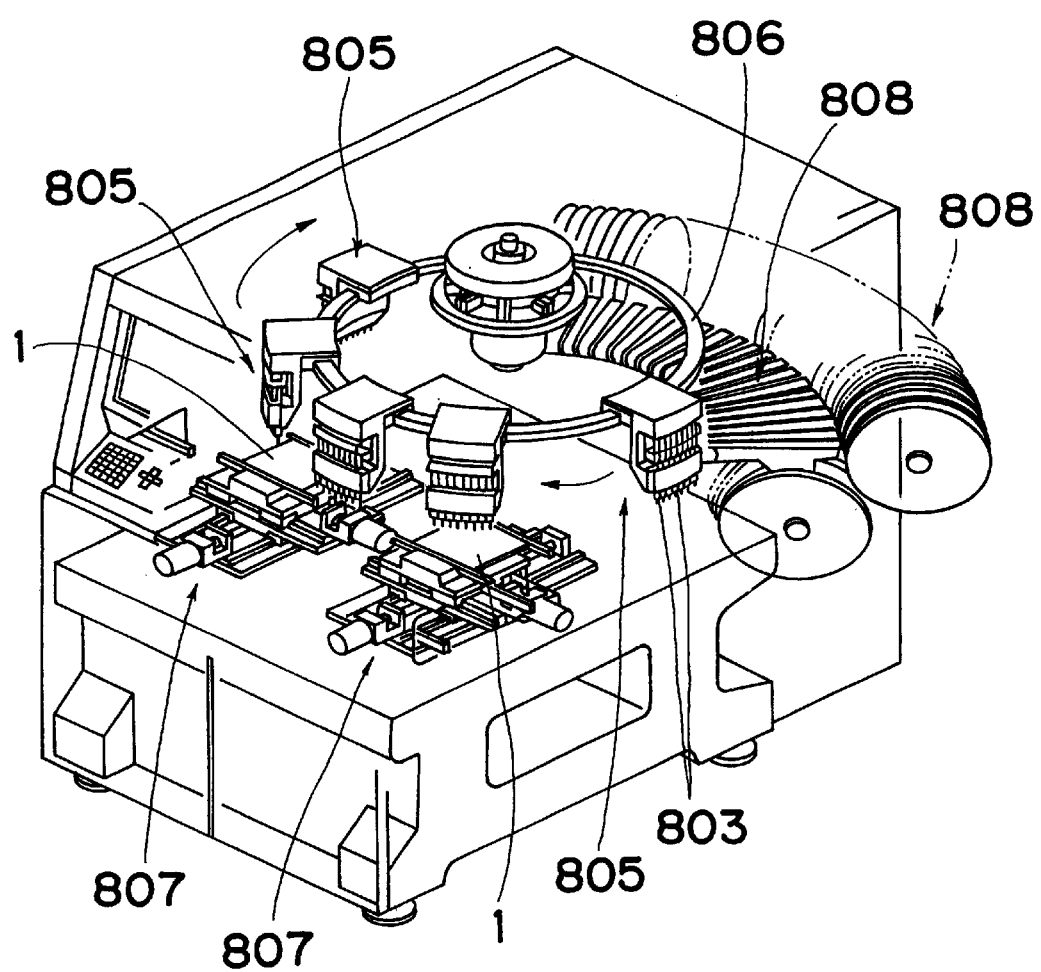
FIG. 52 is a see-through perspective view of a component mounting apparatus according to still another embodiment of the present invention, wherein the component mounting apparatus has a circular travel track having no straight portion.
Figure 53:
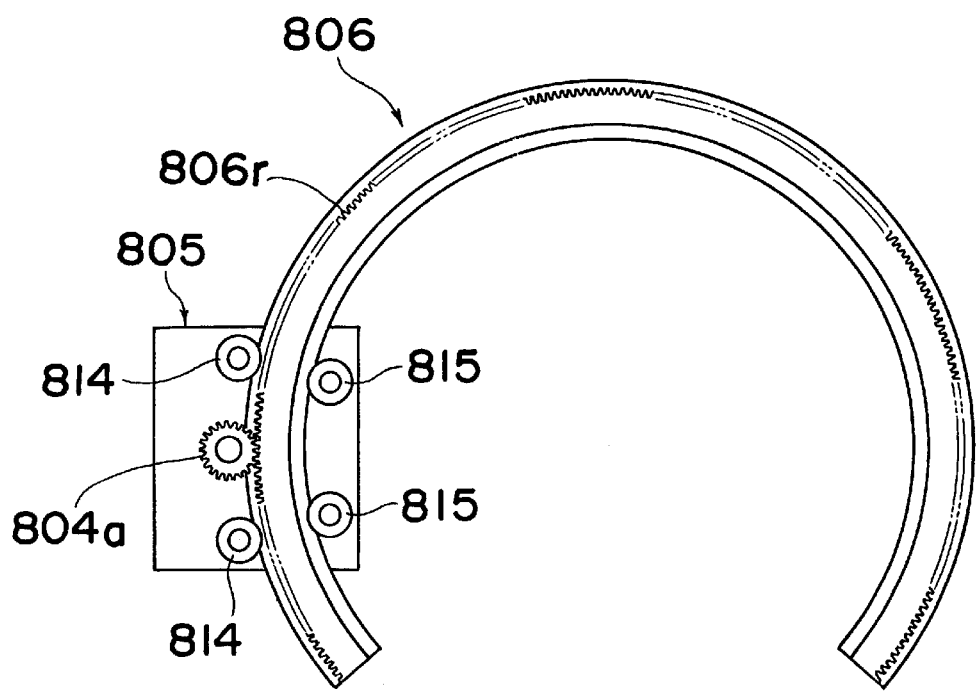
FIG. 53 is an explanatory view showing a relation between the circular travel track and the drive section of each head of FIG. 52.

Specifically, as shown in FIG. 52, the closed-loop of the travel track 6 may be a circle having no straight portion. FIG. 52 shows component suction nozzles 803, self-propelled system heads 805, a travel track 806, board positioning devices 807, and component supply devices 808, and these devices correspond to the component suction nozzles 3, self-propelled system heads 5, travel track 6, board positioning devices 7, and component supply devices 8, respectively, of FIG. 1. FIG. 52 shows a pinion gear 804a that is a drive part provided in the lower portion of the self-propelled system head 805 and is meshed with a rack 806r in the outer peripheral portion of the travel track 806 and inner and outer traveling wheels 815 and 814 that travel on the travel track 806, and these devices correspond to the rack 6r, pinion gear 4a, and traveling wheels 15 and 14, respectively, of FIG. 1.

According to this embodiment, the apparatus can be wholly compacted by virtue of the provision of no straight portion, and the component supply devices 808 and the board positioning devices 807 can be arranged as the component supply section CF and the board positioning section CP, respectively, in arbitrary positions of the circular travel track 806.

Figure 54:
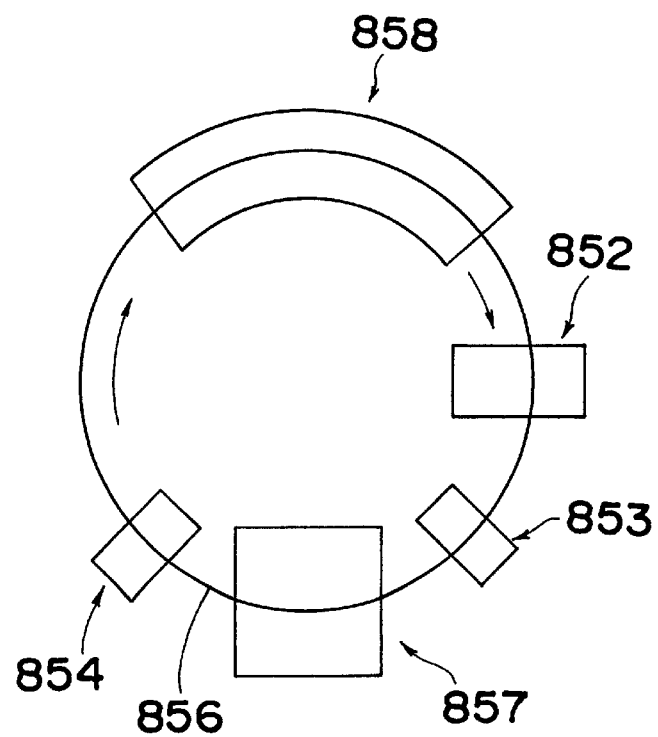
FIG. 54 is an explanatory view showing another layout of the component supply device, the board positioning device, and the like in the component mounting apparatus of the FIG. 52.

For example, as shown in FIG. 54, dissimilar to the layout of FIG. 52, it is acceptable to arrange the component supply device 858 and the board positioning device 857 as the component supply section CF and the board positioning section CP, respectively, in positions 180 degrees opposite to each other on a circular travel track 856 and arrange a component recognizing device 852 (corresponding to the component recognizing device 31) and a coating device 853 for coating a component with an adhesive or flux along the travel track 856 within a range from the component supply device 858 to the board positioning device 857. It is also acceptable to arrange a nozzle tip inspecting device 854 for checking whether or not a component or the like is left at the nozzle tip along the travel track 856 within a range from the board positioning device 857 to the component supply device 858. This nozzle tip inspecting device 854 detects that a component, which has been left on the nozzle tip instead of being mounted on the board, for example, for the reason that the suction posture is defective or the like, is surely discarded into the defective component discarding section.

Figure 55:
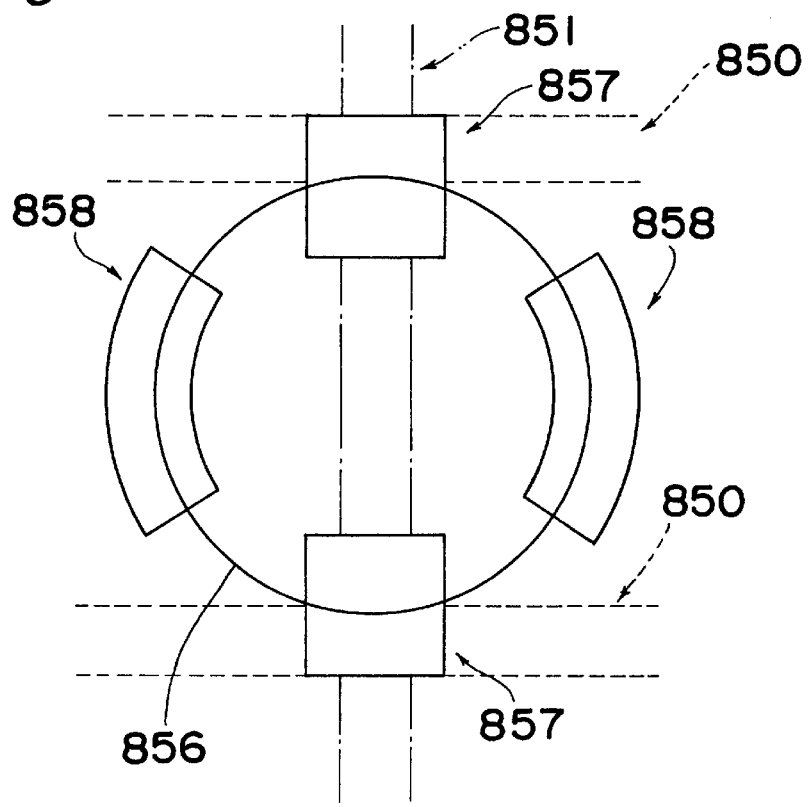
FIG. 55 is an explanatory view showing yet another layout of the component supply device, the board positioning device, and the like in the component mounting apparatus of the FIG. 52.

As shown in FIG. 55, dissimilar to the layout of FIG. 52, it is acceptable to arrange component supply devices 858 that serve as the component supply section CF in two positions 180 degrees opposite to each other on the circular travel track 856 and arrange board positioning devices 857 that serves as the board positioning section CP in two positions that are 90 degrees turned from the positions of the component supply devices 858 and are 180 degrees opposite to each other on the circular travel track 856. According to this example, the component suction, mounting, component suction, and mounting are executed while one traveling head makes a round on the travel track 856, enabling mounting operation on two boards for the further improvement of productivity. In FIG. 55, the reference numeral 850 indicates the board conveyance route of the board conveyance device when two board positioning devices 857 and 857 are provided with individual board conveyance devices, while the reference numeral 851 indicates the board conveyance route of the board conveyance device when two board positioning devices 857 and 857 are provided with one common board conveyance device.

Figure 57:
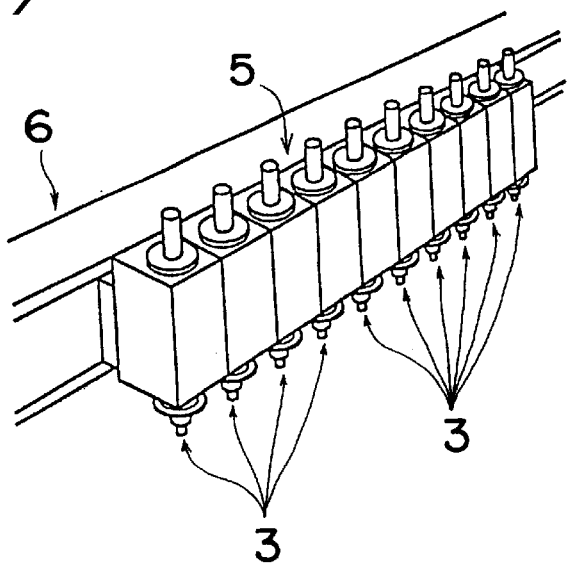
FIG. 57 is a perspective view showing the case where ten suction nozzles are arranged in a straight line on the self-propelled head of FIG. 1.

Each head 5 may be provided with one component suction nozzle 3. However, from the point of view of executing efficient component suction and mounting, two or more nozzles should preferably be provided. There may be provided one head 5. However, from the point of view of executing efficient component suction and mounting, two or more heads should more preferably be provided for the reason that, while one head 5 receives the component 2 from the component supply device 8 and holds by suction the component 2 by the component suction nozzle 3, another head 5 can mount the component 2 held by suction by the component suction nozzle 3 on the board 1 positioned by the board positioning device 7. For example, as shown in FIG. 57, if a plurality of (ten, for example, in FIG. 57) component suction nozzles 3 are arranged in a straight line on each head 5, then a plurality of components (ten components, for example, in FIG. 57) can be collectively held by suction (by one operation), allowing the productivity to be further improved.

For example, if each head 5 is provided with a plurality of, for example, four component suction nozzles 3, then the head 5 travels on the travel track 6 to the board 1 in a state in which components 2 are held by suction from the specified component supply cassettes 80 sequentially from the component suction nozzles 3 arranged forward in the traveling direction and the components 2 are held by suction by all the four component suction nozzles 3, and then the components 2 are mounted on one board 1 sequentially from the component suction nozzles 3 arranged forward in the traveling direction. However, the present invention is not limited to the above component suction and mounting method, and it is acceptable to mount the components 2 on a plurality of boards instead of one board by, for example, firstly mounting the components 2 of the component suction nozzles 3 arranged in the first and second places in the traveling direction on the board 1 above which the head 5 is positioned and then mounting the components 2 of the component suction nozzles 3 arranged in the third and fourth places in the traveling direction on the board 1 positioned adjacent to the foregoing board 1. It is also acceptable to mount the component 2 of the component suction nozzle 3 arranged in the first place in the traveling direction on a first board 1 above which the head 5 is positioned, mount the component 2 of the component suction nozzle 3 arranged in the second place in the traveling direction on a second board 1 positioned adjacent to the first board 1 by the head 5, mount the component 2 of the component suction nozzle 3 arranged in the third place in the traveling direction on a third board 1 positioned adjacent to the second board 1 by the head 5, and mount the component 2 of the component suction nozzle 3 arranged in the fourth place in the traveling direction on a fourth board 1 positioned adjacent to the third board 1 by the head 5.

It is to be noted that the component suction operation and the component mounting operation of the plurality of component suction nozzles 3 are not specially required to be concurrently executed or synchronized with one another.

The traveling direction of each head 5 is normally one direction with respect to the travel track 6. However, from the point of view of optimization, each head 5 may be partially moved in the reverse direction within a range in which no interference with the other heads 5 occurs.

When arranging a plurality of board positioning devices 7, it is acceptable to execute the mounting operation by means of one board positioning device 7 and concurrently execute the board loading and unloading work by means of another board positioning device 7.

The component supply device 8 is not limited to the component supply cassette 80 and is permitted to be arbitrarily constructed of a combination of the component supply cassette 80 and the component supply tray device 81 or of only the component supply tray device 81. It is to be noted that the number of component supply cassettes 80 and the number of component supply tray devices 81 are arbitrary.

The board positioning device 7 is not limited to the Y-direction board positioning device 70 and is permitted to be constructed of the XY-direction board positioning device 71. The number of the Y-direction board positioning devices 70 and the number of XY-direction board positioning devices 71 are arbitrary.

In a plurality of board positioning devices, it is also acceptable to mount half the components to be mounted on one board 1 by means of, for example, one board positioning device and thereafter mount the remaining components by moving the board to the other board positioning device.

According to the conventional rotary type high-speed mounting apparatus, the motor for rotating the rotary head is arranged in the upper portion of the mounting apparatus, and a component supply device having a weight of, for example, greater than 100 kg moves, causing increased noises and vibrations. In contrast to this, according to the present invention, the motor serving as an example of the drive device for driving each head is not required to be arranged in the upper portion of the mounting apparatus, and the drive device for driving each head is only required to be provided for each self-propelled system head that travels along the travel track. Accordingly, it is merely required to provide the doughnut-shaped drive circuit housing section for driving the θ-turn motor for the component suction nozzle and the voice coil motor for movement in the Z-axis direction, as an example of, for example, the component holding member. Therefore, by comparison with the conventional case, the structure of the upper portion of the mounting apparatus can be much simplified to allow the whole equipment to be compacted, and this also allows the noises and vibrations of the whole apparatus to be remarkably reduced and allows the reliability of the equipment to be improved.

The component supply device can also be used in a fixed state without being moved each time to the component outlet position of the component holding member of, for example, the component suction nozzle. Therefore, the component suction work can be executed at a speed equivalent to that of the conventional high-speed mounting apparatus, allowing the productivity to be further improved. There is no need to move the component supply device of, for example, the component supply cassette and so on at high speed. Therefore, the vibrations and noises can be remarkably reduced, and the reliability of the equipment can be improved. Furthermore, the component supply device does not move, and therefore, the operator has no chance to erroneously touch the component supply device in moving operation, allowing the safety to be still further improved. There is no need to consider the range of movement of the component supply device, and this can reduce the occupation area of the equipment and improve the productivity per equipment area If the Y-direction to-be-mounted object positioning device is used as the to-be-mounted object positioning device, then the object positioning work only in the Y-direction perpendicular to the object conveyance direction is needed, and the mounting position adjustment in the X-direction of the object can be executed by adjusting the position of each head in the straight portion of the travel track. Therefore, the object positioning work can be simplified and executed in a short time, and the structure of the object positioning device can be simplified.

As the component supply device, not only the component supply cassette but also the component supply tray device can be employed, and therefore, the degree of freedom of the component supply form can be increased regardless of the component suction and mounting work executed at high speed. In contrast to this, the conventional high-speed mounting apparatus has not been able to employ the component supply tray device.

The travel track can be made to be a closed-loop of an arbitrary shape, and the component supply section and the object positioning section can be arranged in the arbitrary positions of the travel track. That is, according to the conventional mounting apparatus, the positions of the component supply section, the board positioning section and so on have been limited as a matter of course due to the construction of the apparatus, and the sections have not been able to be arranged in positions other than the corresponding positions. However, according to the present invention, the component supply section, the board positioning section, and so on can be arranged in arbitrary positions of the travel track. Therefore, according to the mounting apparatus of the present invention, the shape of the travel track can be arbitrarily designed according to the installation space of the mounting apparatus. In addition, the component supply section, the board positioning section, and so on can be arranged in arbitrary positions of the travel track, and this allows the degree of freedom of design to be remarkably improved and also allows the productivity per unit area to be increased.

Since the travel track has a closed-loop shape, the component supply device, the component recognizing device, the board positioning device, and so on can be arranged along the travel track, and the plurality of self-propelled system heads are independently driven. Therefore, the processes of the component suction process, the component recognizing process, the component suction posture correcting process, the component mounting process, and so on can be concurrently processed by the plurality of self-propelled system heads, allowing the productivity to be improved.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus comprising:
   a plurality of self-propelled system heads each of which has a component holding member capable of holding a component to be mounted on an object to be mounted and has a self-propelling drive device;
   a closed-loop travel track along which the self-propelled heads circulate independently of one another by driving the drive devices of the plurality of self-propelled system heads;
   an object positioning device that is arranged in an object positioning section of the travel track and positions the object; and
   a component supply device that is arranged in a component supply section of the travel track and contains therein the components, whereby
   the plurality of self-propelled system heads are made to independently travel by controlling each of the drive devices in a manner that the self-propelled system heads do not interfere with one another on the travel track, the component holding members of the self-propelled system heads independently hold the components from the component supply device, the self-propelled system heads having the component holding members holding the components subsequently independently travel along the travel track, and the components held by the component holding members of the self-propelled system heads are independently mounted on the object positioned by the object positioning device of the object positioning section on the travel track.

2. A component mounting apparatus as claimed in claim 1, wherein
   the travel track has at least one straight portion in the closed-loop along which the plurality of self-propelled system heads travel,
   the object positioning device is arranged in the straight portion of the travel track, the object is positioned by the object positioning device of the object positioning section, and the components are independently mounted on the positioned object by the component holding members of each of the self-propelled system heads.

3. A component mounting apparatus as claimed in claim 2, wherein
   the travel track has another second straight portion, the component supply section is arranged in the second straight portion, and the components supplied from the component supply device of the component supply section are independently held by the component holding members of each of the self-propelled system heads.

4. A component mounting apparatus as claimed in claim 1, wherein
   the travel track has at least one straight portion in the closed-loop along which the plurality of self-propelled system heads travel,
   the component supply section is arranged in the straight portion of the travel track, and the components supplied from the component supply device of the component supply section are independently held by the component holding members of each of the self-propelled system heads.

5. A component mounting apparatus as claimed in claim 1, wherein
   the travel track has another second straight portion, the component supply section is arranged in the second straight portion, and the components supplied from the component supply device of the component supply section are independently held by the component holding members of each of the self-propelled system heads.

6. A component mounting apparatus as claimed in claim 1, wherein
   a first head of the plurality of self-propelled system heads is positioned in the component supply section of the travel track, and a second head of the plurality of self-propelled system heads is positioned in the object positioning section of the travel track concurrently with the holding of the component to be mounted on the object from the component supply device by the component holding member of the first head and mounts a component that has been received from the component supply device and held by the component holding member of the second head on the object positioned by the object positioning device.

7. A component mounting apparatus as claimed in claim 1, further comprising:
   a component recognizing device that is arranged between the component supply section and the object positioning section of the travel track and recognizes a posture of the component that has been received from the component supply device and held by the component holding member of each head, whereby
   each head holds the component that is received from the component supply device and is to be mounted on the object by the component holding member of the head and subsequently travels along the travel track toward the object positioning device, the component recognizing device recognizes the posture of the component that has been received from the component supply device and held by the component holding member of each head in a position in which the component recognizing device is arranged along the travel track during the travel, the component that has been received from the component supply device and held by the component holding member of each head is mounted on the object positioned by the object positioning device after completing recognition, and the posture of the component is controlled on the basis of a component recognition result obtained by the component recognizing device while the head is traveling toward the object positioning device after completing recognition or immediately before the mounting on the object.

8. A component mounting apparatus as claimed in claim 7, wherein
   each of the heads is switched over from high-speed travel to low-speed travel before a position in which the component recognizing device of the travel track is arranged, and the component recognizing device recognizes the posture of the component that has been received from the component supply device and held by the component holding member of each head while each head is traveling at low speed.

9. A component mounting apparatus as claimed in claim 7, wherein the component recognizing device recognizes the posture of the component that has been received from the component supply device and held by the component holding member of each head without speed change within an interval between a point located before a position in which the component recognizing device of the travel track is arranged and a point beyond the position in which the component recognizing device is arranged.

10. A component mounting apparatus as claimed in claim 7, wherein each of the heads temporarily stops in a position in which the component recognizing device of the travel track is arranged, and the component recognizing device recognizes the posture of the component that has been received from the component supply device and held by the component holding member of each head.

11. A component mounting apparatus as claimed in claim 7, wherein a plurality of object positioning devices are arranged along the travel track, the plurality of heads are provided with a plurality of component holding members, components received from the component supply device are held by a first component holding member and a second component holding member out of the plurality of component holding members, the component held by the first component holding member is mounted on a board positioned by a first object positioning device out of the plurality of object positioning devices, and the component held by the second component holding member is mounted on a board positioned by a second object positioning device out of the plurality of object positioning devices.

12. A component mounting apparatus as claimed in claim 1, wherein the travel track is constructed of a rail that has both side surfaces protruding roughly in a triangular shape, and each head traveling along the travel track has wheels having curved convex surfaces capable of sliding in point contact with approximately triangular protrusions located on both sides of the rail.

13. A component mounting apparatus as claimed in claim 1, wherein the travel track has an arbitrary closed-loop shape, and the component supply section and the object positioning section are arranged in arbitrary positions of the travel track.

14. A component mounting apparatus as claimed in claim 1, wherein a plurality of object positioning devices are arranged along the travel track, the plurality of heads are provided with a plurality of component holding members, components received from the component supply device are held by a first component holding member and a second component holding member out of the plurality of component holding members, the component held by the first component holding member is mounted on a board positioned by a first object positioning device out of the plurality of object positioning devices, and the component held by the second component holding member is mounted on a board positioned by a second object positioning device out of the plurality of object positioning devices.

15. A component mounting method comprising: independently circulating a plurality of self-propelled system heads each of which has a component holding member capable of holding a component to be mounted on an object to be mounted and has a self-propelling drive device on a closed-loop travel track by controlling each of the drive devices so that the self-propelled system heads do not interfere with one another; independently receiving the components from a component supply device arranged in a component supply section of the travel track and holding the components by the component holding members of the self-propelled system heads; subsequently making the self-propelled system heads that have the component holding members holding the components independently travel along the travel track; and independently mounting the components held by the component holding members of the self-propelled system heads on the object positioned by an object positioning device arranged in an object positioning section of the travel track.

16. A component mounting method as claimed in claim 15, wherein the object is positioned by the object positioning device of the object positioning section arranged in at least one straight portion provided for the closed-loop of the travel track, and the components are independently mounted on the positioned object by the component holding members of the self-propelled system heads.

17. A component mounting method as claimed in claim 3, wherein the component holding members of the self-propelled system heads independently hold the components supplied from the component supply device of the component supply section arranged in another second straight portion provided for the closed-loop of the travel track.

18. A component mounting method as claimed in claim 16, wherein the component holding members of the self-propelled system heads independently hold the components supplied from the component supply device of the component supply section arranged in another second straight portion provided for the closed-loop of the travel track.

19. A component mounting method as claimed in claim 15, wherein the component holding members of the self-propelled system heads independently hold the components supplied from the component supply device of the component supply section arranged in at least one straight portion provided for the closed-loop of the travel track.

20. A component mounting method as claimed in claim 15, wherein a first head of the plurality of self-propelled system heads is positioned in the component supply section of the travel track, and a second head of the plurality of self-propelled system heads is positioned in the object positioning section of the travel track concurrently with the holding of the component to be mounted on the object from the component supply device by the component holding member of the first head and mounts a component that has been received from the component supply device and held by the component holding member of the second head on the object positioned by the object positioning device.

21. A component mounting method as claimed in claim 15, wherein each head holds the component that is received from the component supply device and is to be mounted on the object by the component holding member of the head and subsequently travels along the travel track toward the object positioning device, the component recognizing device recognizes the posture of the component that has been received from the component supply device and held by the component holding member of each head in a position in which a component recognizing device is arranged between the component supply section and the object positioning section of the travel track during the travel, the head travels along the travel track toward the object positioning device after completing recognition to mount the component that has been received from the component supply device and held by the component holding member of each head on the object positioned by the object positioning device, and the posture of the component is controlled on the basis of a component recognition result obtained by the component recognizing device while the head is traveling toward the object positioning device after completing recognition or immediately before the mounting on the object.

22. A component mounting method as claimed in claim 21, wherein each of the heads is switched over from high-speed travel to low-speed travel before a position in which the component recognizing device of the travel track is arranged, and the component recognizing device recognizes the posture of the component that has been received from the component supply device and held by each component holding member of each head while each head is traveling at low speed.

23. A component mounting method as claimed in claim 22, wherein the components received from the component supply device are held by a first component holding member and a second component holding member out of the plurality of component holding members provided for the plurality of heads, the component held by the first component holding member is mounted on a board positioned by a first object positioning device out of the plurality of object positioning devices provided along the travel track, and the component held by the second component holding member is mounted on a board positioned by a second object positioning device out of the plurality of object positioning devices.

24. A component mounting method as claimed in claim 21, wherein the component recognizing device recognizes the posture of the component that has been received from the component supply device and held by the component holding member of each head without speed change within an interval between a point located before a position in which the component recognizing device of the travel track is arranged and a point beyond the position in which the component recognizing device is arranged.

25. A component mounting method as claimed in claim 24, wherein the components received from the component supply device are held by a first component holding member and a second component holding member out of the plurality of component holding members provided for the plurality of heads, the component held by the first component holding member is mounted on a board positioned by a first object positioning device out of the plurality of object positioning devices provided along the travel track, and the component held by the second component holding member is mounted on a board positioned by a second object positioning device out of the plurality of object positioning devices.

26. A component mounting method as claimed in claim 21, wherein each of the heads temporarily stops in a position in which the component recognizing device of the travel track is arranged, and the component recognizing device recognizes the posture of the component that has been received from the component supply device and held by each component holding member of each head.

27. A component mounting method as claimed in claim 15, wherein the components received from the component supply device are held by a first component holding member and a second component holding member out of the plurality of component holding members provided for the plurality of heads, the component held by the first component holding member is mounted on a board positioned by a first object positioning device out of the plurality of object positioning devices provided along the travel track, and the component held by the second component holding member is mounted on a board positioned by a second object positioning device out of the plurality of object positioning devices.

* * * * *